(12) United States Patent
Lue et al.

(10) Patent No.: US 8,264,028 B2
(45) Date of Patent: *Sep. 11, 2012

(54) NON-VOLATILE MEMORY CELLS, MEMORY ARRAYS INCLUDING THE SAME AND METHODS OF OPERATING CELLS AND ARRAYS

(75) Inventors: Hang-Ting Lue, Hsinchu (TW); Szu Yu Wang, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 70 days.

This patent is subject to a terminal disclaimer.

(21) Appl. No.: 11/324,540

(22) Filed: Jan. 3, 2006

(65) Prior Publication Data

US 2006/0202261 A1   Sep. 14, 2006

Related U.S. Application Data

(60) Provisional application No. 60/640,229, filed on Jan. 3, 2005, provisional application No. 60/647,012, filed on Jan. 27, 2005, provisional application No. 60/689,231, filed on Jun. 10, 2005, provisional application No. 60/689,314, filed on Jun. 10, 2005.

(51) Int. Cl.
*H01L 29/792* (2006.01)

(52) U.S. Cl. ............... 257/324; 257/411; 257/E29.165; 257/E29.309

(58) Field of Classification Search .................. 257/324, 257/411, E29.165, E29.309, E21.423; 438/216, 438/287

See application file for complete search history.

(56) References Cited

U.S. PATENT DOCUMENTS

| 4,630,086 A | 12/1986 | Sato et al. |
| 5,286,994 A | 2/1994 | Ozawa et al. |
| 5,319,229 A | 6/1994 | Shimoji et al. |
| 5,952,692 A | 9/1999 | Nakazato et al. |
| 6,011,725 A | 1/2000 | Eitan |
| 6,026,026 A | 2/2000 | Chan et al. |
| 6,074,917 A | 6/2000 | Chang et al. |

(Continued)

FOREIGN PATENT DOCUMENTS

CN   1534768 A   10/2004

(Continued)

OTHER PUBLICATIONS

Cho et al., "Simultaneous Hot-Hole Injection at Drain and Source for Efficient Erase and Excellent Endurance in SONOS Flash EEPROM Cells," IEEE Electron Device Letters, vol. 24 No. 4, Apr. 2003, pp. 260-262.

(Continued)

*Primary Examiner* — David Vu
*Assistant Examiner* — Earl Taylor
(74) *Attorney, Agent, or Firm* — Haynes Beffel & Wolfeld LLP

(57) ABSTRACT

Memory cells comprising: a semiconductor substrate having a source region and a drain region disposed below a surface of the substrate and separated by a channel region; a tunnel dielectric structure disposed above the channel region, the tunnel dielectric structure comprising at least one layer having a hole-tunneling barrier height; a charge storage layer disposed above the tunnel dielectric structure; an insulating layer disposed above the charge storage layer; and a gate electrode disposed above the insulating layer are described along with arrays and methods of operation.

8 Claims, 52 Drawing Sheets

U.S. PATENT DOCUMENTS

| | | | |
|---|---|---|---|
| 6,169,693 | B1 | 1/2001 | Chan et al. |
| 6,172,907 | B1* | 1/2001 | Jenne ................ 365/185.18 |
| 6,218,700 | B1 | 4/2001 | Papadas |
| 6,469,343 | B1* | 10/2002 | Miura et al. ................ 257/324 |
| 6,512,696 | B1 | 1/2003 | Fan et al. |
| 6,617,639 | B1 | 9/2003 | Wang et al. |
| 6,680,505 | B2 | 1/2004 | Ohba et al. |
| 6,709,928 | B1 | 3/2004 | Jenne et al. |
| 6,720,630 | B2 | 4/2004 | Mandelman et al. |
| 6,740,928 | B2* | 5/2004 | Yoshii et al. ................ 257/315 |
| 6,784,480 | B2 | 8/2004 | Bhattacharyya |
| 6,818,558 | B1 | 11/2004 | Rathor et al. |
| 6,897,533 | B1 | 5/2005 | Yang et al. |
| 6,912,163 | B2 | 6/2005 | Zheng et al. |
| 6,977,201 | B2 | 12/2005 | Jung et al. |
| 7,075,828 | B2 | 7/2006 | Lue et al. |
| 7,087,955 | B2 | 8/2006 | Kawashima et al. |
| 7,115,469 | B1 | 10/2006 | Halliyal et al. |
| 7,115,942 | B2 | 10/2006 | Wang |
| 7,133,313 | B2 | 11/2006 | Shih |
| 7,151,692 | B2 | 12/2006 | Wu |
| 7,164,603 | B2 | 1/2007 | Shih et al. |
| 7,187,590 | B2 | 3/2007 | Zous et al. |
| 7,190,614 | B2 | 3/2007 | Wu |
| 7,209,390 | B2 | 4/2007 | Lue et al. |
| 7,529,137 | B2* | 5/2009 | Lue et al. ................ 365/185.28 |
| 7,642,585 | B2* | 1/2010 | Wang et al. ................ 257/296 |
| 7,688,626 | B2* | 3/2010 | Lue et al. ................ 365/185.05 |
| 2002/0140023 | A1 | 10/2002 | Ohba et al. |
| 2002/0190311 | A1 | 12/2002 | Blomme et al. |
| 2003/0030100 | A1 | 2/2003 | Lee et al. |
| 2003/0032242 | A1 | 2/2003 | Lee et al. |
| 2003/0042534 | A1 | 3/2003 | Bhattacharyya |
| 2003/0047755 | A1 | 3/2003 | Lee et al. |
| 2003/0146465 | A1 | 8/2003 | Wu |
| 2003/0224564 | A1 | 12/2003 | Kang et al. |
| 2004/0079983 | A1 | 4/2004 | Chae et al. |
| 2004/0183126 | A1 | 9/2004 | Bae et al. |
| 2004/0251489 | A1 | 12/2004 | Jeon et al. |
| 2004/0256679 | A1* | 12/2004 | Hu ................ 257/371 |
| 2005/0006696 | A1* | 1/2005 | Noguchi et al. ................ 257/316 |
| 2005/0023603 | A1 | 2/2005 | Eldridge et al. |
| 2005/0062098 | A1* | 3/2005 | Mahajani et al. ................ 257/324 |
| 2005/0074937 | A1 | 4/2005 | Jung |
| 2005/0093054 | A1 | 5/2005 | Jung |
| 2005/0219906 | A1 | 10/2005 | Wu |
| 2005/0237801 | A1* | 10/2005 | Shih ................ 365/185.11 |
| 2005/0237809 | A1* | 10/2005 | Shih et al. ................ 365/185.18 |
| 2005/0237813 | A1 | 10/2005 | Zous et al. |
| 2005/0237815 | A1* | 10/2005 | Lue et al. ................ 365/185.28 |
| 2005/0237816 | A1* | 10/2005 | Lue et al. ................ 365/185.28 |
| 2005/0270849 | A1 | 12/2005 | Lue |
| 2005/0281085 | A1 | 12/2005 | Wu |
| 2006/0067125 | A1* | 3/2006 | Lue ................ 365/185.18 |
| 2006/0118858 | A1 | 6/2006 | Jeon et al. |
| 2006/0198189 | A1 | 9/2006 | Lue et al. |
| 2006/0198190 | A1 | 9/2006 | Lue |
| 2006/0202252 | A1 | 9/2006 | Wang et al. |
| 2006/0202261 | A1 | 9/2006 | Lue et al. |
| 2006/0258090 | A1 | 11/2006 | Bhattacharyya |
| 2006/0261401 | A1 | 11/2006 | Bhattacharyya |
| 2006/0281260 | A1 | 12/2006 | Lue |
| 2007/0012988 | A1 | 1/2007 | Bhattacharyya |
| 2007/0029625 | A1 | 2/2007 | Lue et al. |
| 2007/0031999 | A1 | 2/2007 | Ho et al. |
| 2007/0045718 | A1 | 3/2007 | Bhattacharyya |
| 2007/0069283 | A1 | 3/2007 | Shih et al. |
| 2007/0120179 | A1 | 5/2007 | Park et al. |
| 2009/0039417 | A1 | 2/2009 | Chen et al. |

FOREIGN PATENT DOCUMENTS

| | | |
|---|---|---|
| EP | 0 016 246 | 10/1980 |
| EP | 0016246 | 10/1980 |
| EP | 01677311 | 7/2006 |
| EP | 01677312 | 7/2006 |
| EP | 1411555 | 11/2006 |
| JP | 05036991 | 2/1993 |
| JP | 09092738 | 4/1997 |
| JP | 10-247692 A | 9/1998 |
| JP | 11040682 | 2/1999 |
| JP | 2002-289709 A | 10/2002 |
| JP | 2004 363329 | 12/2004 |
| JP | 2004363329 | 12/2004 |

OTHER PUBLICATIONS

Shih et al., "A Novel 2-bit/cell Nitride Storage Flash memory with Greater than 1M P/E-cycle Endurance," IEEE 2004, pp. 36.3.1-36.3.4, IEDM 04-881 to 884.

Blomme et al., "Multilayer tunneling barriers for nonvolatile memory applications," Device Research Conference, 2002. 60th DRC. Conference Digest, 2002, 153-4.

Blomme et al., Write/Erase Cycling Endurance of Memory Cells With SiO2/HfO2 Tunnel Dielectric, IEEE Transactions on Device and Materials Reliability, vol. 4, No. 3, Sep. 2004, pp. 345-351.

Govoreanu, et al., "VARIOT: A Novel Multilayer Tunnel Barrier Concept for Low-Voltage Nonvolatile Memory Devices," IEEE Electron Device Letters, vol. 24, No. 2, Feb. 2003, pp. 99-101.

Govoreanu et al., "Simulation of Nanofloating Gate Memory with High-k Stacked Dielectrics," IEEE 2003, pp. 299-302, SISPAD Intl. Conf. Sep. 3-5, 2003.

Govoreanu et al., "An Investigation of the Electron Tunneling Leakage Current through Ultrathin Oxides/High-K Gate Stacks at Inversion Conditions," IEEE 2003, pp. 287-290, SISPAD Intl. Conf. Sep. 3-5, 2003.

Kim et al., "Robust Multi-bit Programmable Flash Memory Using a Resonant Tunnel Barrier," Electron Devices Meeting, Dec. 5-7, 2005, IEDM Technical Digest, pp. 861-864.

Likharev, "Layered tunnel barriers for nonvolatile memory devices," Applied Physics Letters, vol. 73, No. 15, Oct. 1998, pp. 2137-2139.

Lue et al., "BE-SONOS: A Bandgap Engineered SONOS with Excellent Performance and Reliability", IEDM Tech. Digest. IEEE Intl., Dec. 2005, 547-550.

Sung et al., "Multi-Layer SONOS with Direct Tunnel Oxide for High Speed and Long Retention Time," IEEE, 2002 Silicon Nanoelectronics Workshop, Jun. 2002, pp. 83-84.

Aminzadeh et al., "Conduction and Charge Trapping in Polysilicon-Silicon Nitride-Oxide-Silicon Structures under Positive Gate Bias," IEEE Transactions on Electron Devices . . . vol. 35, No. 4, Apr. 1998, pp. 459-467.

Yamada et al., "A self-convergence erasing scheme for a simple stacked gate flash EEPROM," Proceedings of the International Electron Devices Meeting, IEEE, Dec. 1991, 307-310.

Takata, M., et al., "New Non-Volatile Memory with Extremely High Density Metal Nano-Dots," IEEE IEDM 03-553, 22.5.1-22.5.4.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22.6.4.

Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 layers," Surface Science Sep. 20, 2004, vol. 566-568, 1185-1189.

Buckley, J., et al., "Engineering of 'Conduction Band—Crested Barriers' or 'Dielectric Constant—Crested Barriers' in view of their application of floating-gate non-volatile memory devices," VLSI 2004, 55-56.

White et al., "On the Go with SONOS" IEEE Circuits and Devices, Jul. 2000, 22-31.

Minami, et al., "New Scaling Guidelines for MNOS Nonvolatile Memory Devices," IEEE Trans on Electron Devices 38(11) Nov. 1991 2519-2526.

Ito, F., et al. "A Novel MNOS Technology Using Gate Hole Injection in Erase Operations for Embedded Nonvolatile Memory Applications," Jul. 2004 Symp. on VLSI Tech Dig. of Tech Papers, 80-81.

DiMaria, D.J., et al., "Conduction Studies in Silicon Nitride: Dark Currents and Photocurrents," IBM J. Res. Dev. May 1977, 227-244.

Office Action mailed Nov. 23, 2007 in U.S. Appl. No. 11/197,668.

Office Action mailed Oct. 19, 2007 in U.S. Appl. No. 11/324,495.

Lue et al., "A Novel P-Channel NAND-Type Flash memory with 2-bit/cell Operation and High Programming Throughput (>20 MB/sec)," IEEE 2005, 4 pages.

Tsai et al., "Novel SONOS-Type Nonvolatile Memory Device with Suitable Band Offset in HfAlO Charge-Trapping Layer," Int'l Symp. on VLSI Tech, Systems and Applications, Apr. 23-25, 2007, 2 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Wen, Huang-Chun, et al., "Issues associated with p-type band-edge effective work function metal electrodes: Fermi-level pinning and flatband roll-off," In'l Symp on VLSI Technology, Systems and Applications, Apr. 23-25, 2007, 2 pages.

Padilla, Alvaro, et al., "Dual-bit SONOS FinFET Non-Volatile Memory Cell and New Method of Charge Detection," Int'l Symp on VLSI Technology, Systems and Applications, Apr. 23-25, 2007, 2 pages.

Hijaya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.

Walker et al., "3D TFT-SONOS Memory Cell for Ultra-High Density File Storage Applications," 2003 Symposium on VLSI Tech Digest of Technical Papers, 29-30.

Minami, et al., "New Scaling Guidelines for MNOS Nonvolatile Memory Devices," IEEE Trans. on Electron Devices 38(11) Nov. 1991 2519-2526.

Ito, et al., "A Novel MNOS Technology Using Gate Hole Injection in Erase Operation for Embedded Nonvolatile Memory Applications," 2004 Symp. on VLSI Tech Dig. of Papers 2004, 80-81.

Eitan, et al., "NROM: A Novel Localized Trapping, 2-Bit Nonvolatile Memory Cell," IEEE Electron Device Lett 21(11) Nov. 2000, 543-545.

Chindalore, et al., "A New Combination-Erase Technique for Erasing Nitride Based (SONOS) Nonvolatile Memories," IEEE Electron Dev. Lett. 24(4) Apr. 2003, 257-259.

Yeh, C.C., et al., "PHINES: A Novel Low Power Program/Erase, Small Pitch, 2-Bit per Cell Flash Memory," IEDM Tech. Dig. 2002, 931-934.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22.6..4.

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.

Lee, Chang, et al., "A Novel SONOS Structure of SiO2/SiN/Al2O3 with TaN Metal Gate for Multi-Giga Bit Flash Memeries," IEEE 2003 4 pages.

Padilla, Alvaro, et al., "Dual-Bit SONOS FinFET Non-Volatile Memory Cell and New Method of Charge Detection," Int'l Symp on VLSI Technology, Systems and Applications, Apr. 23-25, 2007, pp. 1-2.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Maikap, S., et al., "High-k HfO2/TiO2/HfO2 multilayer quantum well flash memory devices," Int'l Symp on VLSI Technology, Sytems and Applications Apr. 23-25, 2007, pp. 1-2.

Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.

Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.

Wen, Huang-Chun, et al., "Issues associated with p-type band-edge effective work function metal electrodes: Fermi-level pinning and flatband roll-off," Int'l Symp on VLSI Technology, Systems and Applications, Apr. 23-25, 2007, pp. 1-2.

Tsai Ping-Hung, et al., "Novel SONOS-Type Nonvolatile Memory Device with Suitable Band Offset in HfAlO Charge-Trapping Layer," Int'l Symp on VLSI Technology, Systems and Applications, Apr. 23-25, 2007, pp. 1-2.

Lue, Hang-Ting, et al., "A BE-SONOS (Bandgap Engineered SONOS) NAND for Post-Floating Gate Era Flash Memory," Int'l Symp on VLSI Technology, Apr. 23-25, 2007, pp. 1-2.

Cho, et al., "Simultaneous Hot-Hole Injection at Drain and Source for Efficient Erase and Excellent Endurance in SONOS Flash EEPROM Cells," IEEE Electron Device Letters, vol. 24, No. 4, Apr. 2003, 260-262.

Shih et al., "A Novel 2-bit/cell Nitride Storage Flash Memory with Greater than 1M P/E-cycle Endurance," IEEE IEDM 2004 881-884 (36.3.1-36.3.4).

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Materials Reliability 4(3), Sep. 2004 345-351.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.

Govoreanu et al., "Simulation of Nanofloating Gate Memory with High-k Stacked Dielectrics," IEEE SISPAD Intl. Conf. Sep. 3-5, 2003 299-302.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Kim et al., "Robust Multi-Bit Programmable Flash Memory Using a Resonant Tunnel Barrier," Electron Dev. Mtg. Dec. 5-7, 2005, IEDM Technical Digest 861-864.

Likharev, "Layered Tunnel Barriers for Nonvolatile Memory Devices," Appl. Phys. Lett. 73(15) Oct. 1998 2137-2139.

Lue et al., "BE-SONOS: A Bangap Engineered SONOS with Excellent Performance and Reliability," IEDM Tech. Digest Dec. 2005 547-550.

Sung et al., "Multi-Layer SONOS with Direct Tunnel Oxide for High Speed and Long Retention Time," IEEE Silicon Nanoelectronics Workshop Jun. 2002 83-84.

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

Yamada et al., "A self-convergence erasing scheme for a simple stacked gate flash EEPROM," Proc. Int'l. Electron Devices Meeting. Dec. 1991 307-310.

Search Report mailed Feb. 14, 2007 in European Application No. 06000064.3 filed on Jan. 3, 2006, 7 pages.

Search Report mailed Nov. 14, 2007 in European Application No. 06000064.3 filed on Jan. 3, 2006, 4 pages.

Search Report mailed May 9, 2008 in European Application No. 06000064.3 filed on Jan. 3, 2006, 3 pages.

Search Report mailed Feb. 14, 2007 in European Application No. 06000093.2 (Pub. No. EP-01677312) filed on Jan. 3, 2006, 7 pages.

Search Report mailed Nov. 14, 2007 in European Application No. 06000064.3 (Pub. No. EP-01677312) filed on Jan. 3, 2006, 4 pages.

Search Report mailed May 9, 2008 in European Application No. 06000093.2 (Pub. No. EP-01677312) filed on Jan. 3, 2006, 4 pages.

Huang, Chih-Jen, et al., "A Novel P-Channel Flash Electrically-Erasable Programmable Read-Only Memory (EEPROM) Cell with Oxide-Nitride-Oxide (ONO) as Split Gate Dielectric," Jpn. J. Appl. Phys. vol. 40, Apr. 2001, 2943-2947.

Search Report mailed Mar. 19, 2009 in European Application No. 06000064.3 filed on Jan. 3, 2006, 3 pages.

English translation of Search Report mailed Aug. 3, 2010 in Japanese 2006-000963, 3 pages.

Arakawa, Tomiyuki et al., "Impact of Tunnel Film Oxynitridation on Band-to-Band Tunneling Current and Electron Injection in Flash memory," Jpn. J. Appl. Phys. vol. 36 (1997), Part 1, No. 3B, Mar. 1997, pp. 1351-1354.

* cited by examiner

LAYOUT EXAMPLE OF THIS VIRTUAL GROUND ARRAY.

EQUIVALENT CIRCUIT OF THE VIRTUAL GROUND ARRAY.

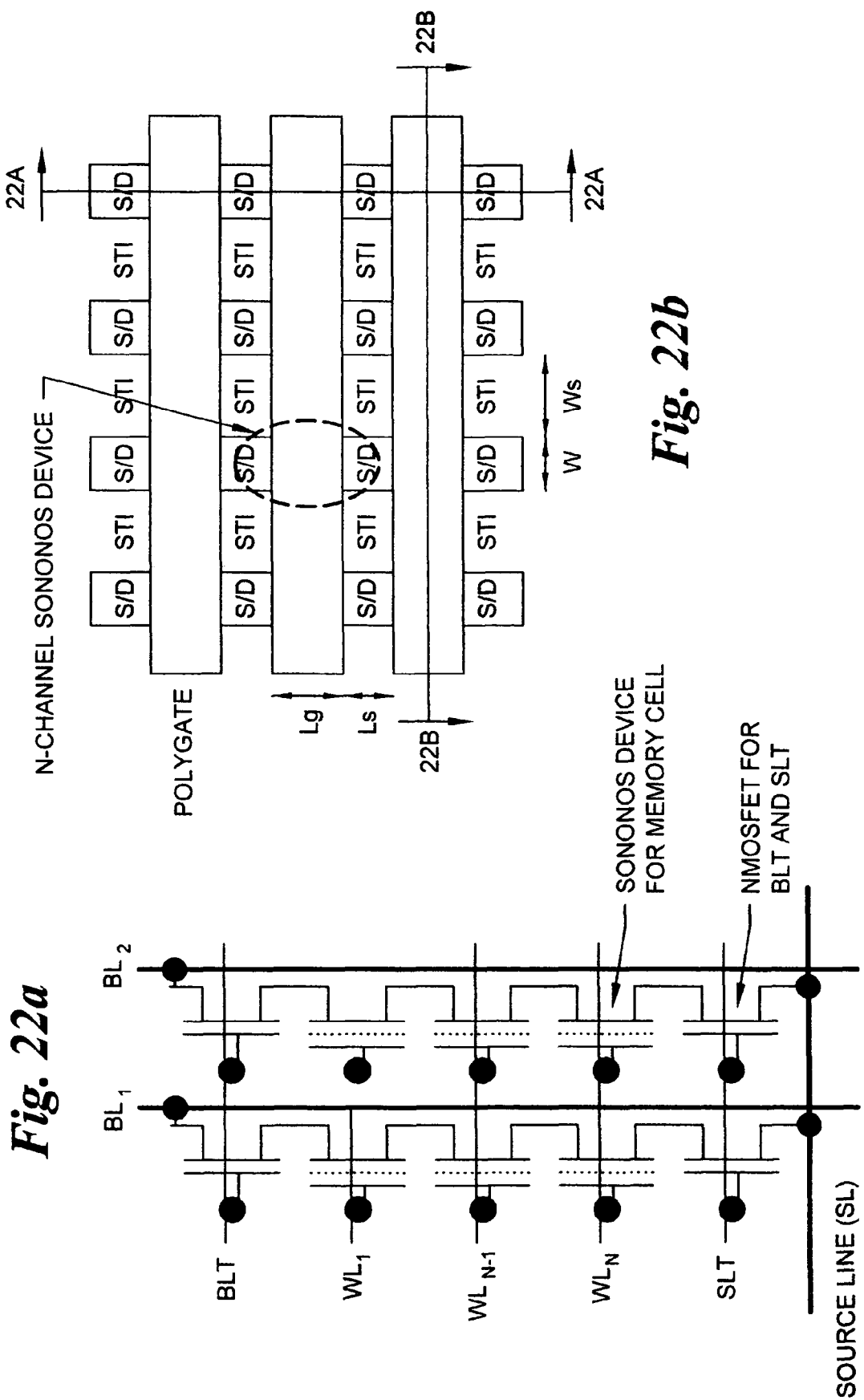

NON-VOLATILE MEMORY CELLS, MEMORY ARRAYS INCLUDING THE SAME AND METHODS OF OPERATING CELLS AND ARRAYS

CROSS-REFERENCE TO RELATED APPLICATIONS

This application is based upon, and claims priority under 35 U.S.C. §119(e) of: provisional U.S. Patent Application No. 60/640,229, filed on Jan. 3, 2005; provisional U.S. Patent Application No. 60/647,012, filed on Jan. 27, 2005; provisional U.S. Patent Application No. 60/689,231, filed on Jun. 10, 2005; and provisional U.S. patent application No. 60/689,314, filed on Jun. 10, 2005; the entire contents of each of which are incorporated herein by reference.

BACKGROUND OF THE INVENTION

Non-volatile memory ("NVM") refers to semiconductor memory which is able to continually store information even when the supply of electricity is removed from the device containing the NVM cell. NVM includes Mask Read-Only Memory (Mask ROM), Programmable Read-Only Memory (PROM), Erasable Programmable Read-Only Memory (EPROM), Electrically Erasable Programmable Read-Only Memory (EEPROM), and Flash Memory. Non-volatile memory is extensively used in the semiconductor industry and is a class of memory developed to prevent loss of programmed data. Typically, non-volatile memory can be programmed, read and/or erased based on the device's end-use requirements, and the programmed data can be stored for a long period of time.

Generally, non-volatile memory devices may have various designs. One example of an NVM cell design is the so-called SONOS (silicon-oxide-nitride-oxide-silicon) device, which may use a thin tunnel oxide layer, to allow hole direct tunneling erase operations. Although such designs may have good erase speed, the data retention is usually poor, in part because direct tunneling may occur even at a low electrical field strengths that may exist during a retention state of a memory device.

Another NVM design is NROM (nitrided read-only memory), which uses a thicker tunnel oxide layer to prevent charge loss during retention states. However, a thick tunnel oxide layer may impact channel erase speed. As a result, band-to-band tunneling hot-hole (BTBTHH) erase methods can be used to inject hole traps to compensate the electrons. However, the BTBTHH erase methods may cause some reliability issues. For example, the characteristics of NROM devices employing BTBTHH erase methods may degrade after numerous P/E (program/erase) cycles.

Thus, a need in the art exists for non-volatile memory cell designs and arrays which can be operated (programmed/erased/read) numerous times with improved data retention performance and increased operation speeds.

BRIEF SUMMARY OF THE INVENTION

The present invention relates to non-volatile memory devices, and more specifically, to non-volatile memory devices including a tunnel dielectric structure that facilitates self-converging erase operations while also maintaining charge retention in a charge storage layer of the memory device during retention states.

One embodiment of the present invention includes memory cells comprising: a semiconductor substrate having a source region and a drain region disposed below a surface of the substrate and separated by a channel region; a tunnel dielectric structure disposed above the channel region, the tunnel dielectric structure comprising at least one layer having a small hole-tunneling-barrier height; a charge storage layer disposed above the tunnel dielectric structure; an insulating layer disposed above the charge storage layer; and a gate electrode disposed above the insulating layer.

Another embodiment of the present invention includes memory cells comprising: a semiconductor substrate having a source region and a drain region disposed below a surface of the substrate and separated by a channel region; a multi-layer tunnel dielectric structure disposed above the channel region, the multi-layer tunnel dielectric structure comprising at least one layer having a small hole-tunneling-barrier height; a charge storage layer disposed above the multi-layer tunnel dielectric structure; an insulating layer disposed above the charge storage layer; and a gate electrode disposed above the insulating layer.

In certain preferred embodiments, the layer providing a small hole-tunneling-barrier height may contain materials such as silicon nitride ($Si_3N_4$) or hafnium oxide ($HfO_2$). In certain preferred embodiments of the present invention memory cells include a tunnel dielectric structure having multiple layers, such as a stacked dielectric tri-layer structure of silicon oxide, silicon nitride, and silicon oxide (ONO). Such tunnel dielectric structures provide a SONONOS (silicon-oxide-nitride-oxide-nitride-oxide-silicon) or a super-lattice SONONOS design.

In certain preferred embodiments of the present invention the tunnel dielectric structure can comprise at least two dielectric layers each having a thickness of up to about 4 nm. Additionally, in certain preferred embodiments of the present invention, the gate electrode comprises a material having a work function value greater than that of $N^+$ polysilicon.

In certain preferred embodiments, the tunnel dielectric structure can include a layer comprising a material having a small hole tunneling barrier height, wherein the material is present in the layer at a concentration gradient such that the concentration of the material is at a maximum at a depth point within the layer.

The present invention also includes non-volatile memory devices which comprise a plurality of memory cells (i.e., an array) in accordance with one or more of the embodiments described herein. As used herein, a "plurality" refers to two or more. Memory devices in accordance with the present invention exhibit significantly improved operational properties including increased erase speeds, improved charge retention and larger windows of operation.

The present invention also includes methods of operating non-volatile memory cells and arrays. Methods of operation in accordance with the present invention include resetting the memory devices by applying a self-converging method to tighten Vt distribution of the memory devices; programming at least one of the memory devices by channel +FN injection; and reading at least one of the memory devices by applying a voltage between an erased state level and a programmed state level of at least one of the memory devices. As used herein, the term "tighten" refers to the narrowing of the threshold voltage distribution among the many memory cells of an array. In general, threshold voltage distribution is "tightened" where the threshold voltages of several cells are within a narrow range of one another such that operation of the array is improved over conventional designs. For example, in some preferred embodiments, such as in a NAND array comprising memory cells in accordance with one or more embodiments of the present invention, a "tightened" threshold voltage distribution indicates that the threshold voltages of the various memory cells are within a 0.5V range of one another. In other array architectures employing memory cells in accordance with the present invention, the "tightened" threshold voltage distribution may have a range of about 1.0V from the upper limit to the lower limit.

One embodiment of a method of operation in accordance with the present invention includes operating an array in accordance with the present invention by applying self-converging reset/erase voltages to the substrate and the gate electrode in each memory cell to be reset/erased; programming at least one of the plurality of memory cells; and reading at least one of the plurality of memory cells by applying a voltage between an erased state level and a programmed state level of at least one of the memory devices.

The present invention also includes methods of forming a memory cell, comprising: providing a semiconductor substrate having a source region and a drain region formed therein below a surface of the substrate and separated by a channel region; forming a tunnel dielectric structure above the channel region, wherein forming the tunnel dielectric structure comprises forming at least two dielectric layers, wherein one of the at least two dielectric layers has a smaller hole tunneling barrier height than the other of the at least two dielectric layers; forming a charge storage layer above the tunnel dielectric structure; forming an insulating layer above the charge storage layer; and forming a gate electrode above the insulating layer.

As used herein, the phrase "small hole tunneling barrier height" refers generally to values which are less than the approximate hole tunneling barrier height of silicon dioxide. In particular, a small hole tunneling barrier height is preferably less than about 4.5 eV. More preferably, a small hole tunneling barrier height is less than about 1.9 eV.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIGS. 22a and 22b are an equivalent circuit diagram and layout view, respectively, of a NAND array of memory cells in accordance with one embodiment of the present invention;

DETAILED DESCRIPTION OF THE INVENTION

Figure 1:
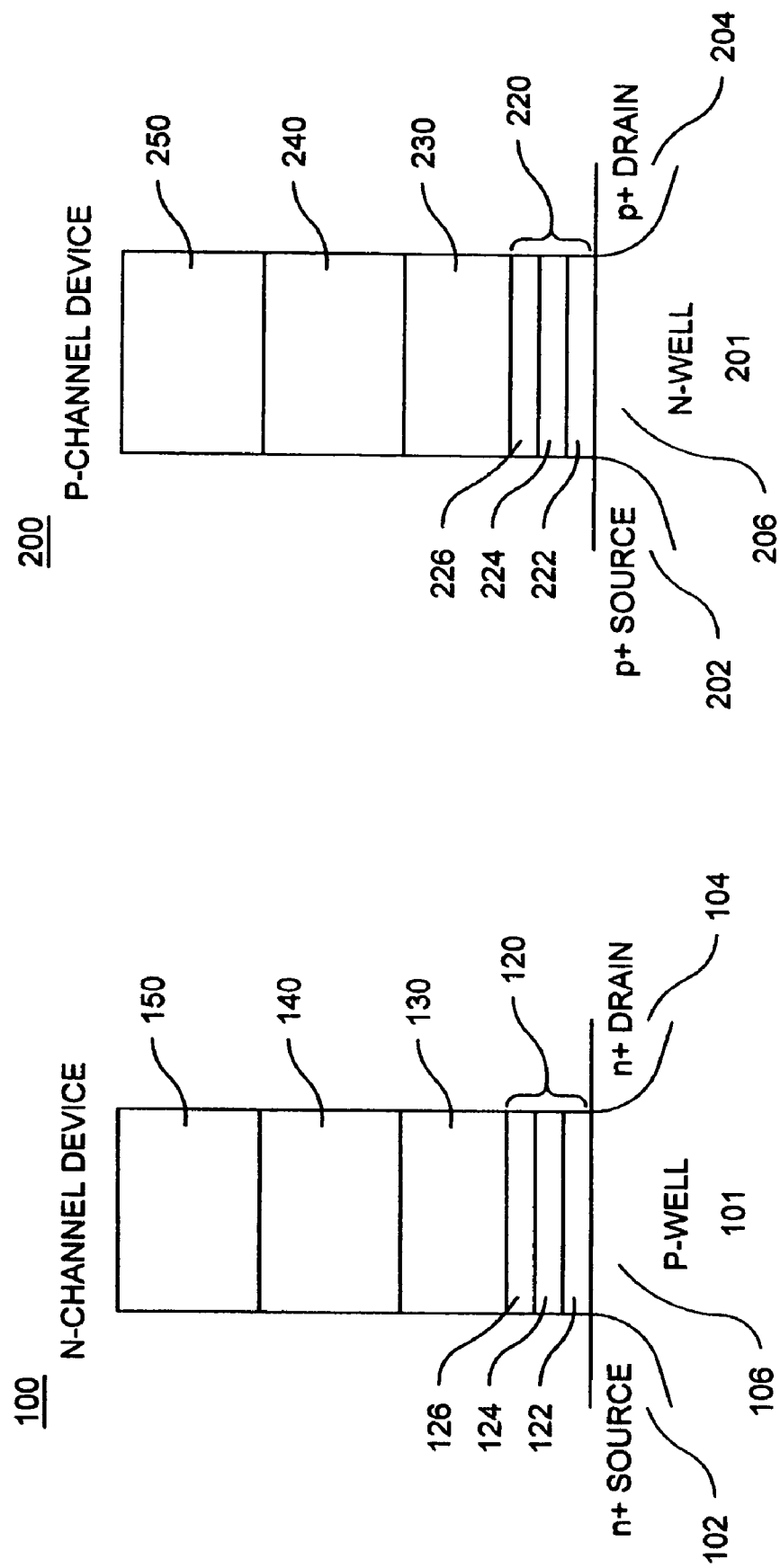
FIGS. 1a and 1b are cross-sectional schematic representations of an N-channel memory cell in accordance with one embodiment of the present invention and a P-channel memory cell in accordance with one embodiment of the present invention, respectively.

Reference will now be made in detail to the invention and the presently preferred embodiments thereof, examples of which are illustrated in the accompanying drawings. Wherever possible, the same or similar reference numbers are used in the drawings and the description to refer to the same or like parts. It should be noted that the non-graph drawings are in greatly simplified form and are not to precise scale. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. It is to be understood and appreciated that the process steps and structures described herein do not cover a complete process flow for the manufacture of entire integrated circuits. The present invention may be practiced in conjunction with various integrated circuit fabrication techniques that are known in the art or to be developed.

Memory cells in accordance with the present invention can overcome some of the reliability issues in SONOS and NROM devices. For example, memory cell structures in accordance with the present invention may allow fast FN channel erase methods, while at the same time, maintaining good charge retention characteristics. Various embodiments of the memory cells according to the present invention can also alleviate reliance on the BTBTHH erase method, thereby avoiding device degradation after numerous P/E cycles.

One example may employ an ultra-thin tunnel dielectric or ultra-thin oxide layer in conjunction with the small hole tunneling barrier height layer in embodiments where the tunnel dielectric structure is a multilayer structure. This may provide better stress immunity. Non-volatile memory cells according to the present invention also show little degradation after numerous P/E cycles.

Memory cells according to the present invention may employ either an n-channel or a p-channel design, such as shown in FIGS. 1a and 1b. FIG. 1a depicts a cross-sectional view of an n-channel memory cell 100 in accordance with one embodiment of the present invention. The memory cell includes a p-type substrate 101 containing at least two n-doped regions 102 & 104, wherein each of the doped regions 102 & 104 may function as either a source or drain depending upon voltages applied. As shown in FIG. 1a, for reference purposes, doped region 102 can serve as the source and doped region 104 can serve as the drain. The substrate 101 further includes a channel region 106 between the two n-doped regions. Above the channel region 106, on the surface of the substrate 101, is a tunnel dielectric structure 120.

In certain preferred embodiments, the tunnel dielectric structure 120 can comprise a tri-layer thin ONO structure wherein a small hole-tunneling-barrier height nitride layer 124 is sandwiched between a thin lower oxide layer 122 and an upper thin oxide layer 126. The memory cell 100 further includes a charge-trapping (or charge storage) layer 130, preferably a nitride, above the tunnel dielectric structure 120, and an insulating layer 140, preferably comprising a blocking oxide, disposed above the charge-trapping layer 130. A gate 150 is disposed on the insulating layer 140.

FIG. 1b, depicts a cross-sectional view of an p-channel memory cell 200 in accordance with one embodiment of the present invention. The memory cell includes an n-type substrate 201 containing at least two p-doped regions 202 & 204, wherein each of the doped regions 202 & 204 may function as either a source or drain. The substrate 201 further includes a channel region 206 between the two p-doped regions. The p-channel memory cell 200 similarly includes a tunnel dielectric structure 220, comprising a tri-layer thin ONO structure wherein a small hole-tunneling-barrier height nitride layer 224 is sandwiched between a thin lower oxide layer 222 and an upper thin oxide layer 226, a charge-trapping (or charge storage) layer 230, an insulating layer 240, and a gate 250.

Thus, for example, as depicted in FIGS. 1a and 1b, memory cells in accordance with the present invention may include: a multi-layer thin film tunnel dielectric structure, including a first silicon oxide layer O1, a first silicon nitride layer N1, and a second silicon oxide layer O2; a charge-storage layer, such as a second silicon nitride layer N2; and an insulating layer such as a third silicon oxide layer O3, on or over ("above") a substrate, such as a semiconductor substrate (e.g., a silicon substrate). The tunneling dielectric structure allows hole tunneling from the substrate to the charge-storage layer during an erase/reset operation of the memory device. Preferably, the tunnel dielectric structure in a non-volatile memory cell of the present invention has a negligible charge-trapping efficiency, and more preferably, does not trap charge at all during memory operations.

Charge storage materials such as a silicon nitride layer, $HfO_2$, and $Al_2O_3$ may be used as the small hole tunneling barrier height layer in a tunnel dielectric structure. In certain preferred embodiments of the present invention, an efficient charge storage material, such as a silicon nitride can be used as a charge storage layer in the memory device. A blocking oxide that prevents charge loss may serve as an insulating layer, such as a third silicon oxide layer O3. The memory cells according to the present invention also include a gate or gate electrode, such as a polysilicon gate, above the insulating layer. The tunnel dielectric structure, charge storage layer, insulating layer and gate can be formed above the substrate above at least a portion of a channel region, which is defined by and is disposed between a source region and a drain region.

Memory cells according to various embodiments of the present invention comprise a tunnel dielectric structure which can provide fast FN erase speeds of around 10 msec under a negative gate voltage (Vg), such as a Vg of about −10 to about −20 V. On the other hand, the charge retention can still be maintained, and, in some examples, may be better than many conventional SONOS devices. Memory cells according to the present invention can also avoid the use of band-to-band hot hole erase operations, which, are commonly used in NROM devices. Avoidance of such band-to-band hot hole erase operations may greatly eliminate hot-hole introduced damages and such avoidance is therefore desirable.

Figure 2:
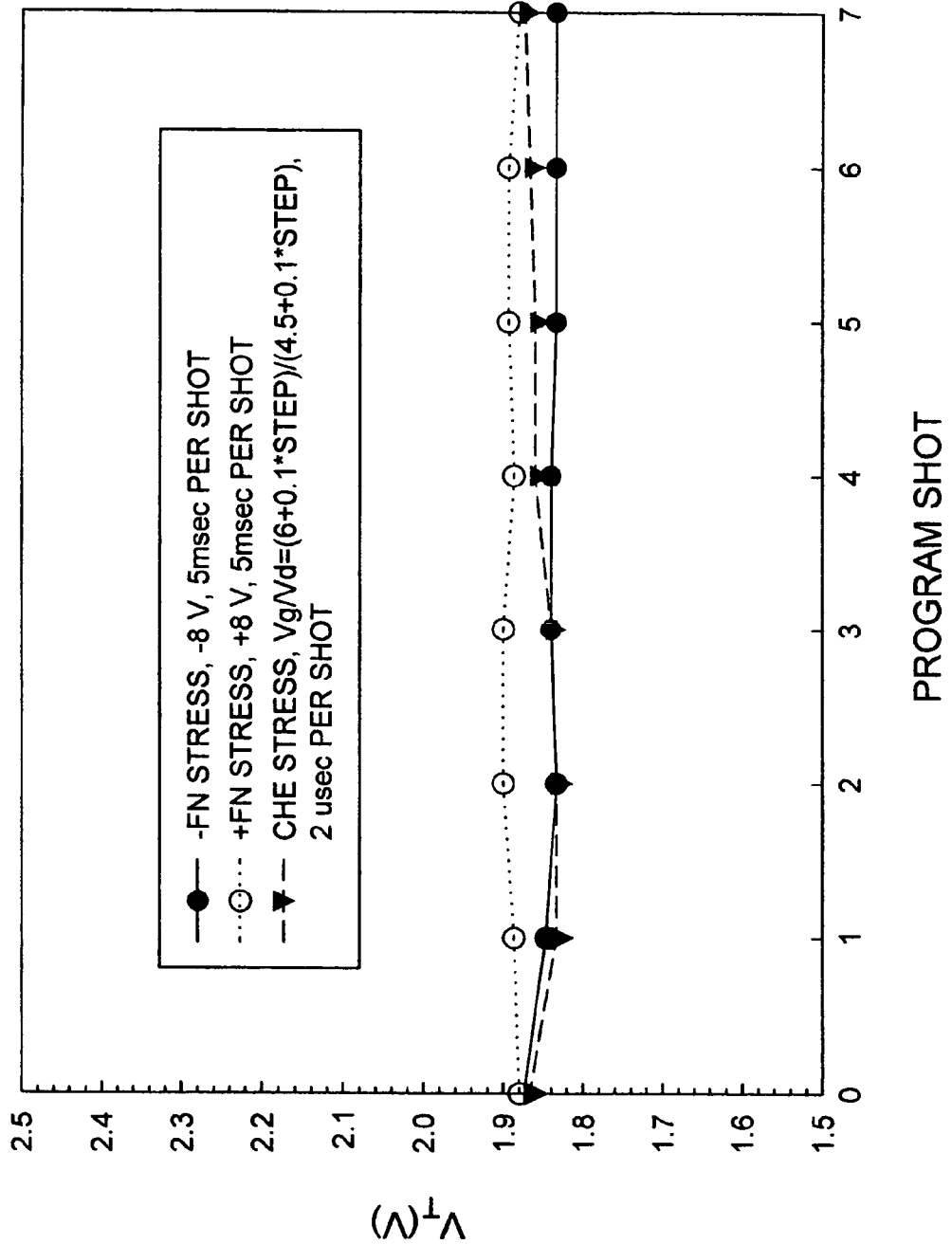
FIG. 2 is a graphical representation of the threshold voltage (charge trapping capacity) of a tunnel dielectric structure in accordance with one embodiment of the present invention under various programming methods.

Referring to FIG. 2, experimental measurements of threshold voltage for a tunnel dielectric structure in accordance with one embodiment of the present invention shows that an ultra-thin O1/N1/O2 structure can have a negligible trapping efficiency, as evidenced by the unchanged threshold voltage level under successive programming pulses. In the example tested for FIG. 2, the O1/N1/O2 layers had thicknesses of 30, 30 and 35 angstroms (Å), respectively. As shown in FIG. 2, the threshold voltage Vt remains steady at approximately 1.9 volts over the course of several program shots using various methods of programming, namely −FN programming, +FN programming and CHE (channel hot electron) programming. Thus, such an ultra thin O1/N1/O2 film may serve as a modulated tunnel dielectric structure. The results under various charge injection methods including CHE, +FN and −FN all suggest negligible charge trapping. Manufacturing processes or device structures may be designed to minimize interfacial traps, so that neither O1/N1 nor N1/O2 interface is active.

Figure 3:
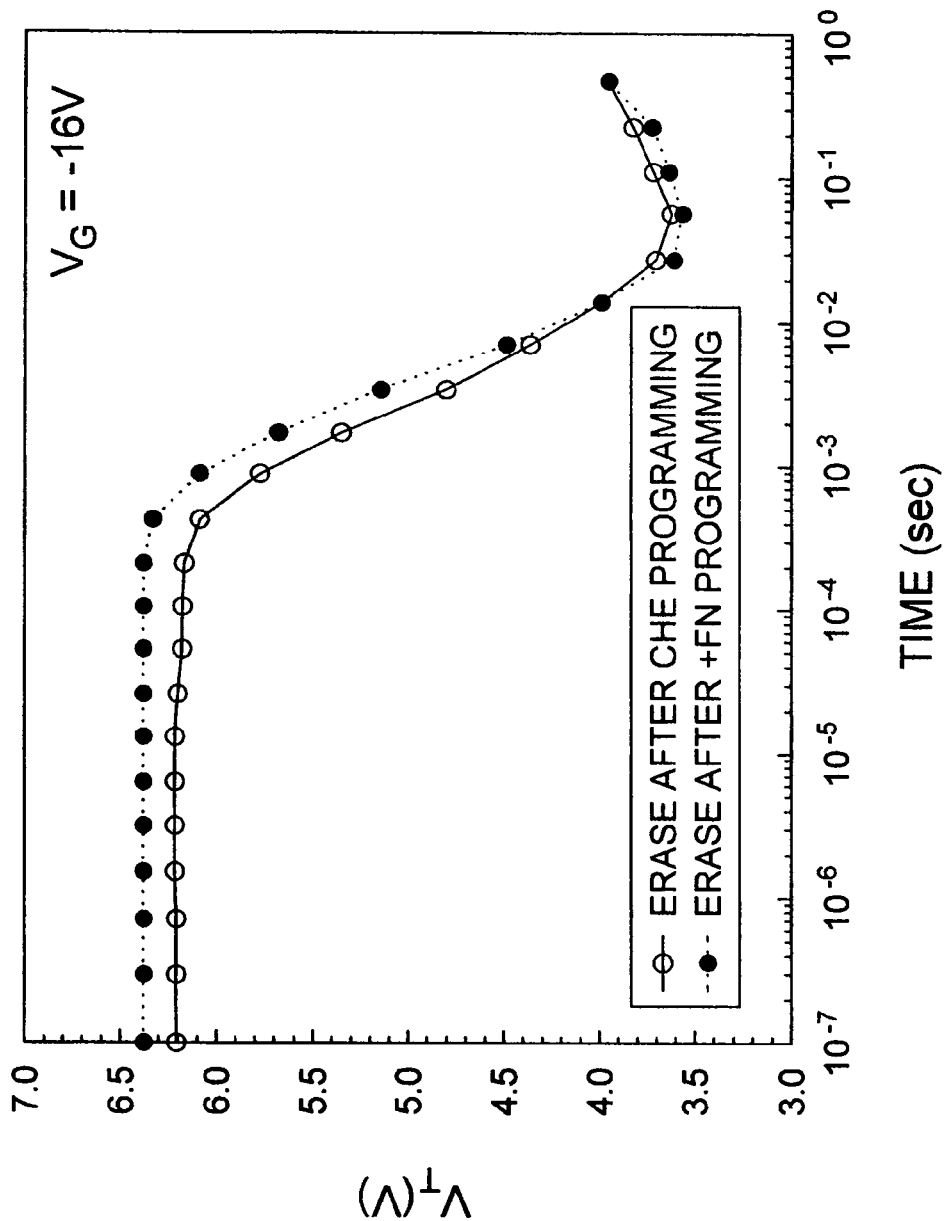
FIG. 3 is a graphical representation of the threshold voltage of a SONONOS memory cell in accordance with one embodiment of the present invention over time during erase.

FIG. 3 illustrates the erase characteristics of a memory cell having a SONONOS design in accordance with one embodiment of the present invention. The memory cell in the embodiment described in FIG. 3 comprises an n-MOSFET design with an ONO tunnel dielectric structure having thicknesses of 15 Å, 20 Å and 18 Å, respectively. The memory cell of this embodiment comprises a silicon nitride charge storage layer having a thickness of about 70 Å, an insulating silicon oxide layer with a thickness of about 90 Å, and a gate comprising any suitable conductive material, for example, n-doped polycrystalline silicon. Referring to FIG. 3, fast FN erase may be achieved, such as within 10 msec, and an excellent self-convergent erase properties may also be obtained.

Figure 4:
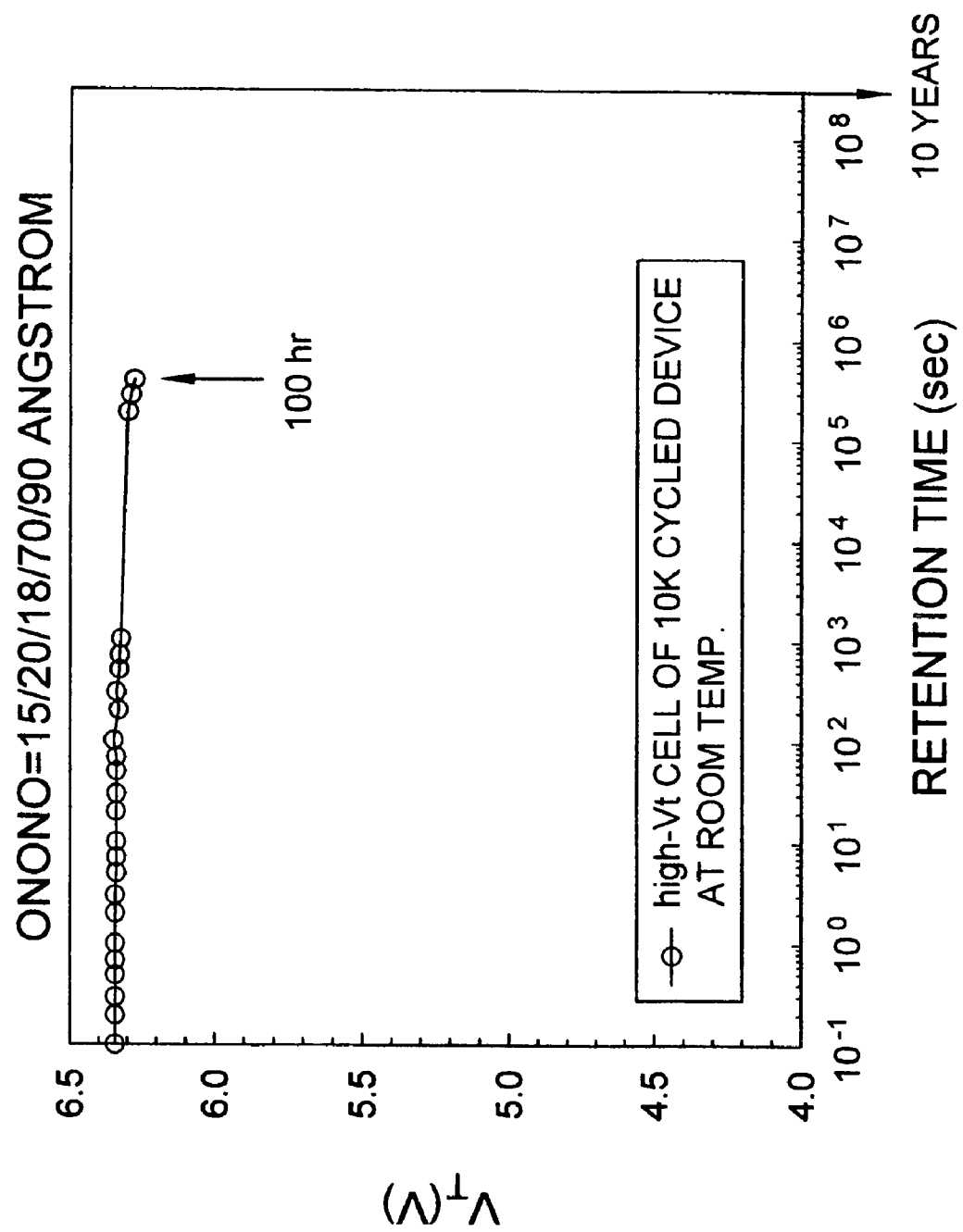
FIG. 4 is a graphical representation of the threshold voltage of a SONONOS memory cell in accordance with one embodiment of the present invention over time during retention.

FIG. 4 illustrates the charge retention characteristics of a SONONOS device in accordance with an embodiment of a memory cell according to the present invention as described with reference to FIG. 3. As shown, the retention characteristics can be better than those of conventional SONOS devices, and in terms of magnitude, may be many orders better.

Figure 5B:
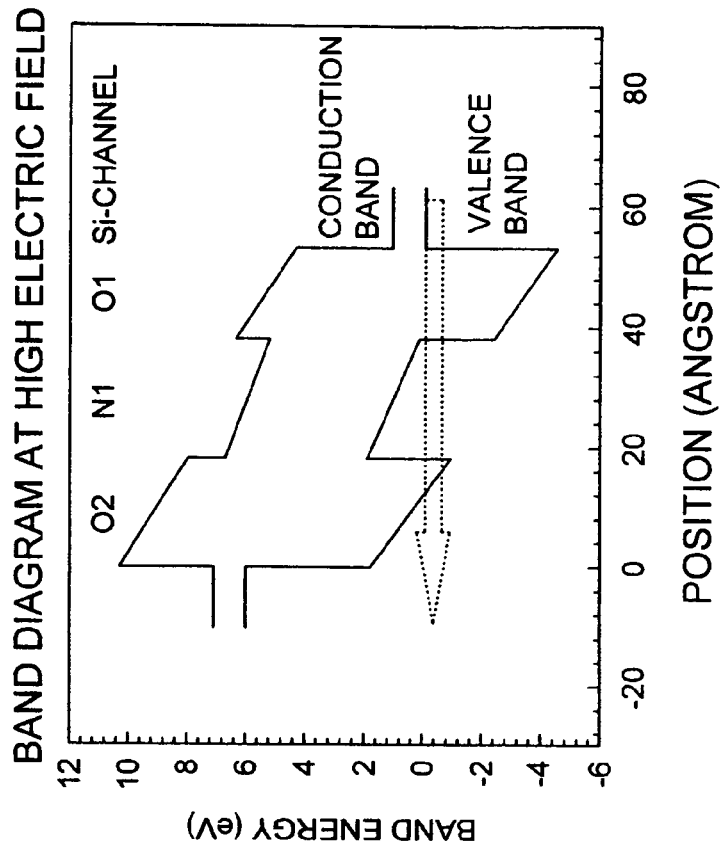
FIGS. 5a-5e are band energy diagrams of ONO tunnel dielectric structures in accordance with various embodiments of the present invention.
Figure 5A:
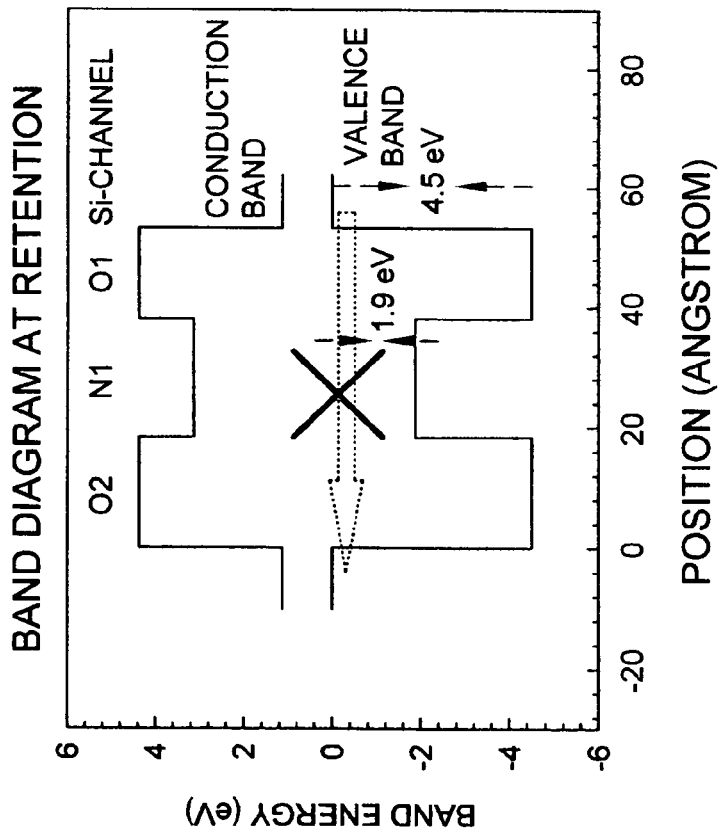

FIGS. 5a and 5b are band diagrams which illustrate possible effects of using a tunnel dielectric structure containing at least one layer having a small hole-tunneling-barrier height. The band diagram of the tunnel dielectric structure, an O1/N1/O2 trilayer in this example, under a low electrical field, which may exist during memory data retention, is shown in FIG. 5a. Direct tunneling as represented by the dotted arrow may be eliminated under low electrical fields, thereby providing good charge retention during retention states. On the other hand, band diagram offset under a high electrical field, as shown in FIG. 5b, can reduce the barrier effect of N1 and O2 such that the direct tunneling through O1 may occur. A tunnel dielectric structure having at least one small hole-tunneling-barrier height layer may allow efficient FN erase operation.

Figure 5D:
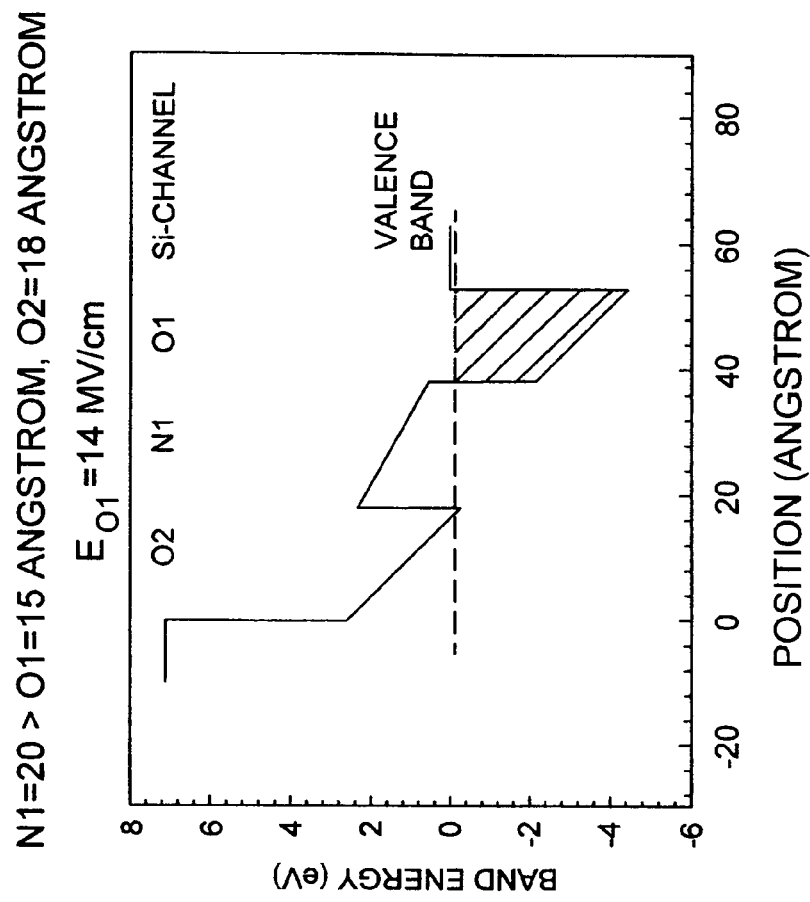
Figure 5C:
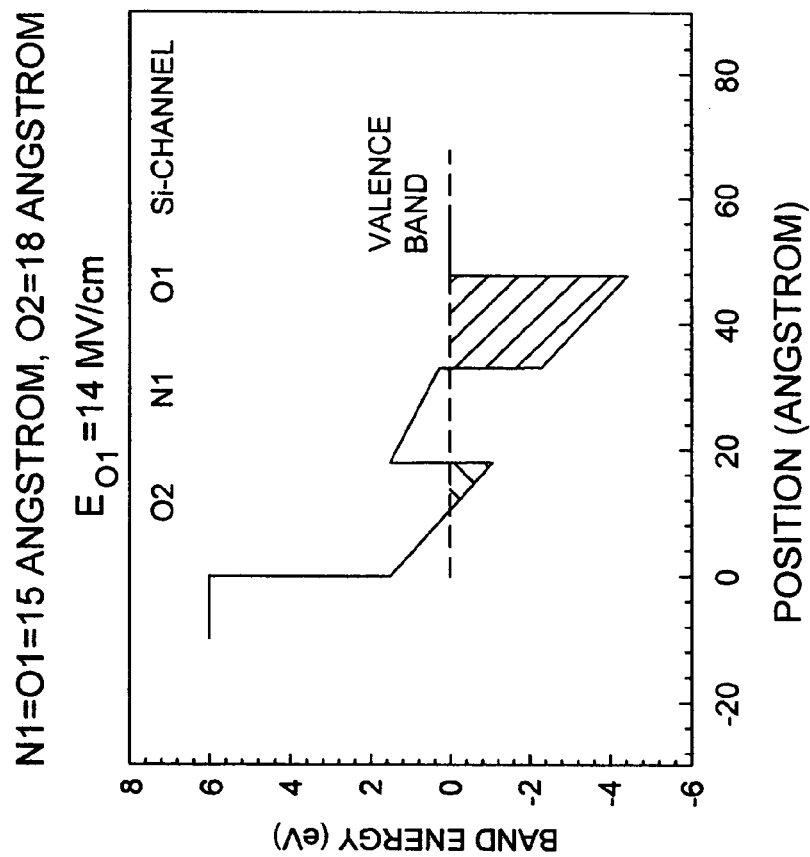

FIGS. 5c and 5d illustrate another set of band diagrams in one example. For a better band offset condition in one example, the thickness of N1 may be larger than that of O1. The band diagram of valence band is plotted at the same electrical field E01=14 MV/cm. The tunneling probability according to WKB approximation is correlated to the shadow area. In this example, for N1=O1 in thickness, the band offset does not completely screen out the barrier of O2. On the other hand, for N1>O1, the band offset can more easily screen out O1. Therefore, for N1>O1 in thickness, the hole tunneling current may be larger under the same electrical field in O1.

Figure 6:
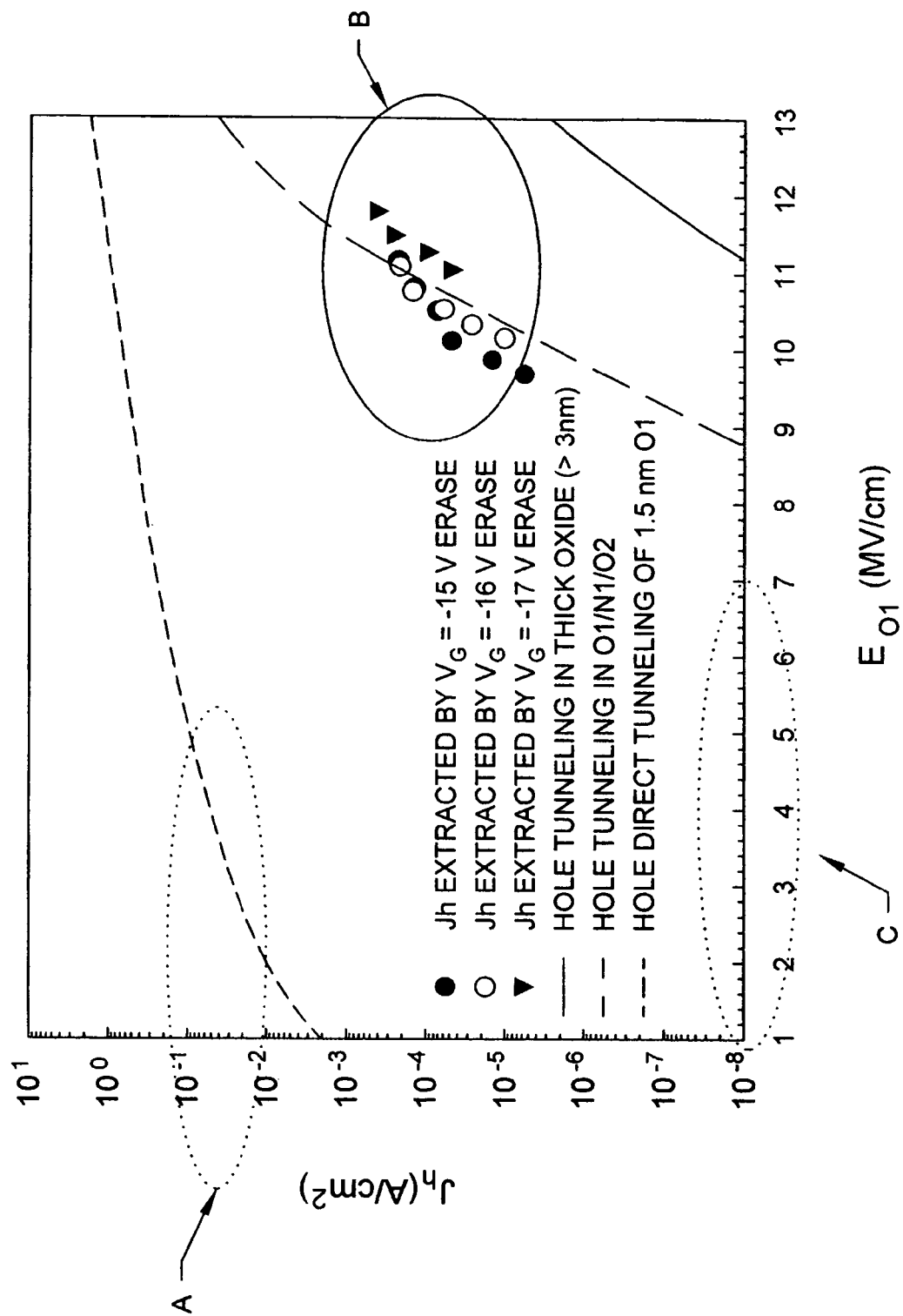
FIG. 6 is a graphical representation of hole-tunneling current versus electrical field strength for three different tunnel dielectric structures.

An experiment with measured and simulated hole tunneling currents, as shown in FIG. 6, further describes hole tunneling through a tunnel dielectric structure according to certain embodiments of the present invention. For example, hole tunneling current through the O1/N1/O2 dielectric may fall between that of an ultra-thin oxide and a thick oxide. In one example, under a high electrical field, the hole tunneling current may approximate that of an ultra-thin oxide. However, under a low electrical field, the direct tunneling can be suppressed. As shown in FIG. 6, hole tunneling current is detected through a thin oxide layer even at low electrical field strengths of only 1 MV/cm. Hole tunneling current is negligible through a thick oxide even at relatively high field strengths such as, for example, 11-13 mV/cm. However, hole tunneling current through an ONO tunnel dielectric structure approaches that of a thin oxide layer when high electric field strengths are present. In FIG. 6, the large current leakage due to hole tunneling through an ultra-thin oxide at low electrical fields can be seen at area A of the graph. In FIG. 6, hole tunneling current through an O1/N1/O2 tunnel dielectric structure at high electric field strengths can be seen at area B of the graph. In FIG. 6, the virtually non-existent tunneling current through an O1/N1/O2 tunnel dielectric structure and a thick oxide at low electrical fields can be seen at area C of the graph.

Memory cell designs in accordance with the present invention may be applied to various memory types, including but not limited to, NOR and/or NAND-type flash memories.

As noted above, a tunnel dielectric layer may include two or more layers, including one layer that may provide a small hole-tunneling-barrier height. In one example, the layer providing a small hole-tunneling-barrier height may contain silicon nitride. The layer may be sandwiched between two silicon oxide layers, thereby forming an O/N/O tunnel dielectric if silicon nitride is used as the intermediate layer. In certain preferred embodiments of the present invention, each layer in a tunnel dielectric structure is up to about 4 nm thick. In some preferred embodiments, each of the layers in the tunnel dielectric structure can have a thickness of about 1 nm to 3 nm. In one exemplary device, a tri-layer structure may have a bottom layer, such as a silicon oxide layer, of about 10 Å to 30 Å, an intermediate layer, such as a silicon nitride layer, of about 10 Å to 30 Å, and a top layer, such as another silicon oxide layer, of about 10 Å to 30 Å. In one particular example, an O/N/O tri-layer structure having a 15 Å bottom silicon oxide layer, a 20 Å intermediate silicon nitride layer, and an 18 Å top silicon oxide layer may be used.

In one example, a thin O/N/O tri-layer structure shows negligible charge trapping. Theoretical band diagram and tunneling current analysis, such as described with reference to FIGS. 5a, 5b and 6, may suggest that a tunnel dielectric structure, such as an O1/N1/O2 structure having thicknesses of 3 nm or less for each of the layers, can suppress the hole direct-tunneling at low electric field during retention. At the same time, it still may allow efficient hole tunneling at high electric field. This may be because the band offset can effectively screen out the tunneling barrier of N1 and O2. Therefore, this proposed device may offer fast hole tunneling erase, while it is immune from the retention problem of the conventional SONOS devices. Experimental analysis shows excellent endurance and retention properties of memory cells in accordance with various embodiments of the present invention.

In certain preferred embodiments, the tunnel dielectric structure includes at least a middle layer and two adjacent layers on opposing sides of the middle layer, wherein each of the middle layer and two adjacent layers comprises a first material and a second material, wherein the second material has a valence band energy level greater than the valence band energy level of the first material and the second material has a conduction band energy level less than the conduction band energy level of the first material; and wherein the concentration of the second material is higher in the middle layer than in the two adjacent layers and the concentration of the first material is higher in the two adjacent layers than in the middle layer. Preferably, in a tunnel dielectric structure in accordance with this embodiment of the present invention, the first material comprises oxygen and/or an oxygen-containing compound and the second material comprises nitrogen and/or a nitrogen-containing compound. For example, the first material can comprise an oxide, such as silicon oxide, and the second material can comprise a nitride, such as $Si_3N_4$ or $Si_xO_yN_z$.

Tunnel dielectrics in accordance with this aspect of the invention may be comprised of three or more layers, all of which can contain similar elements (such as Si, N and O), so long as the concentration of the material having the smallest hole tunneling barrier height is higher within the middle layer than in the two adjacent layers.

In certain tunnel dielectric structures according to the preceding embodiment of the present invention, the second material can be present in the middle layer in a gradient concentration such that the concentration of the second material in the middle layer increases from one adjacent layer/middle layer interface to a maximum concentration at a depth point within the middle layer, and decreases from the maximum concentration depth point to a lower concentration at the other adjacent layer/middle layer interface. The increase and decrease in concentration is preferably gradual.

In still other embodiments of the present invention, the tunnel dielectric structure includes at least a middle layer and two adjacent layers on opposing sides of the middle layer, wherein the two adjacent layers comprise a first material and the middle layer comprises a second material, wherein the second material has a valence band energy level greater than the valence band energy level of the first material and the second material has a conduction band energy level less than the conduction band energy level of the first material; and wherein the second material is present in the middle layer in a gradient concentration such that the concentration of the second material in the middle layer increases from one adjacent layer/middle layer interface to a maximum concentration at a depth point within the middle layer, and decreases from the maximum concentration depth point to a lower concentration at the other adjacent layer/middle layer interface. The increase and decrease in concentration is preferably gradual. Preferably, in a tunnel dielectric structure in accordance with this embodiment of the present invention, the first material comprises oxygen and/or an oxygen-containing compound and the second material comprises nitrogen and/or a nitrogen-containing compound. For example, the first material can comprise an oxide, such as silicon oxide, and the second material can comprise a nitride, such as $Si_3N_4$ or $Si_xO_yN_z$.

For example, in embodiments of the present invention where the tunnel dielectric layer comprises a tri-layer ONO structure, the bottom oxide and top oxide layers can comprise silicon dioxide and the middle nitride layer can be comprised of, for example, silicon oxynitride and silicon nitride wherein the concentration of silicon nitride (i.e., the material having the smaller hole tunneling barrier height of the two) is not constant within the layer, but rather reaches a maximum at some depth point within the layer between the two interfaces with the sandwiching oxide layers.

The precise point within the middle layer where the material with the smallest hole tunneling barrier height reaches its maximum concentration is not critical, so long as it is present in a gradient and reaches its maximum concentration in the tunnel dielectric layer at some point within the middle layer.

The gradient concentration of the material having the smallest hole tunneling barrier height can be advantageous in improving various properties of non-volatile memory devices, particularly those having a SONONOS, or SONONOS-like structure. For example, retention state charge loss can be diminished, hole tunneling under high electric fields can be improved and, to the extent it may occur, charge-trapping in the tunnel dielectric can be avoided.

Figure 5E:
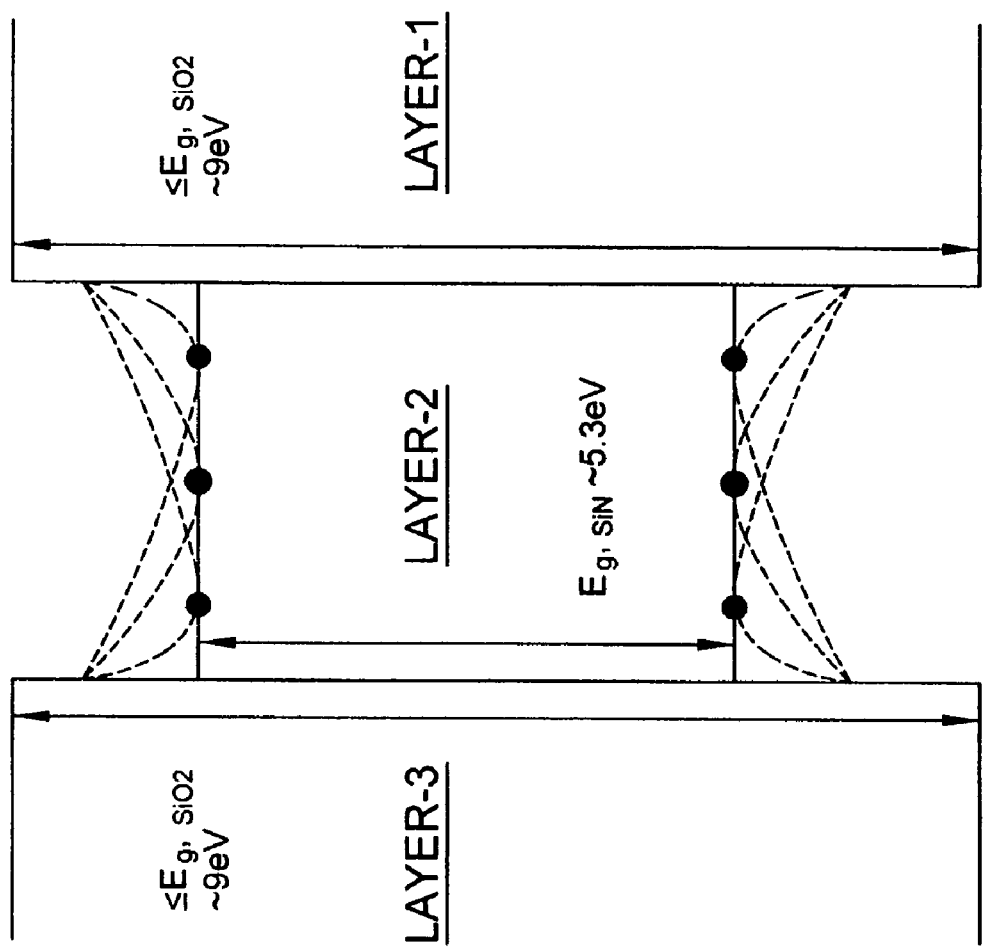

The band diagram of a tunnel dielectric layer can be advantageously modified in accordance with this aspect of the present invention such that the valence band energy level and the conduction band energy level of the middle layer do not have a constant value, but rather vary across the thickness of the layer with the concentration of the material having the smallest hole tunneling barrier height. Referring to FIG. 5e, modification of an ONO tri-layer tunnel dielectric in accordance with this aspect of the invention is shown via a band diagram. The middle layer (Layer-2) is comprised of silicon nitride. The outer layers (Layer-1 and Layer-3) are comprised of silicon dioxide. The concentration of silicon nitride in Layer-2 is varied such that the valence band energy level and the conduction band energy level reach a maximum and minimum value, respectively, at the depth in Layer-2 where the concentration of silicon nitride is highest. Three possible silicon nitride concentration gradients are shown in FIG. 5e, depicted by dashed lines representing the variable valence band energy conduction band energy levels that result from the concentration gradients. As shown in FIG. 5e, by the circles on the dashed lines representing three alternative silicon nitride concentration maximums within Layer-2, the lowest valence band energy level and the highest conduction band energy level coincide with the silicon nitride concentration maximum.

Multi-layer tunnel dielectric structures in accordance with such embodiments of the present invention, can be prepared in a variety of ways. For example, a first silicon dioxide or silicon oxynitride layer can be formed using any number of conventional oxidation approaches including, but not limited to thermal oxidation, radical (ISSG) oxidation, and plasma oxidation/nitridation, as well as chemical vapor deposition processes. A middle layer with a gradient concentration of SiN can then be formed, for example, via chemical vapor deposition processes, or alternatively, by plasma nitridation of excess oxide or oxynitride formed on top of the first layer. A third layer, the upper oxide layer, can then be formed, for example, by oxidation or chemical vapor deposition.

A charge storage layer can then be formed over the tunnel dielectric structure. In one example, a charge storage layer of about 5 nm to 10 nm may be formed over the tunnel dielectric structure. In one particular example, a silicon nitride layer of about 7 nm or thicker may be used. The insulating layer above the charge storage layer may be about 5 nm to 12 nm. For example, a silicon oxide layer of about 9 nm or thicker may be used. And the silicon oxide layer may be formed by a thermal process converting at least a portion of a nitride layer to form the silicon oxide layer. Any method, known or to be developed, for forming layers of suitable materials described herein can be used to deposit or form tunnel dielectric layers, charge-storage layers and/or insulating layers. Suitable methods include, for example, thermal growth methods and chemical vapor deposition methods.

In one example, a thermal conversion process may provide a high density or concentration of interfacial traps that can enhance the trapping efficiency of a memory device. For example, thermal conversion of nitride can be carried out at 1000° C., while the gate flow ratio is H2:O2=1000:4000 sccm.

In addition, because silicon nitride generally has very low (about 1.9 eV) hole barrier, it may become transparent to hole tunneling under high field. Meanwhile, the total thickness of a tunnel dielectric, such as an ONO structure, may prevent direct tunneling of electrons under a low electric field. In one example, this asymmetrical behavior may provide a memory device offering not only fast hole-tunneling erase, but also reduction or elimination of charge leakage during retention.

An exemplary device may be fabricated by 0.12 µm NROM/NBit technologies. Table 1 shows the device structure and parameters in one example. The proposed tunnel dielectric with an ultra-thin O/N/O may alter the hole tunneling current. A thicker (7 nm) N2 layer may serve as a charge-trapping layer and an O3 (9 nm) layer may serve as the blocking layer in one example. Both N2 and O3 may be fabricated using NROM/NBit technologies.

TABLE 1

| Layer | Approximate Thickness (Angstroms) |
|---|---|
| Bottom Oxide (O1) | 15 |
| Inter Nitride (N1) | 20 |
| Inter Oxide (O2) | 18 |
| Trapping Nitride (N2) | 70 |
| Blocking Oxide (O3) | 90 |
| Gate: | N+ - polysilicon |
| Channel length: | 0.22 µm |
| Channel width: | 0.16 µm |

In certain embodiments of the present invention, a gate can comprise a material having a work function greater than that of $N^+$ polysilicon. In certain preferred embodiments of the present invention, such a high work function gate material can comprise a metal such as, for example, platinum, iridium, tungsten, and other noble metals. Preferably, the gate material in such embodiments has a work function greater than or equal to about 4.5 eV. In particularly preferred embodiments, the gate material comprises a high work function metal such as, for example, platinum or iridium. Additionally, preferred high work function materials include, but are not limited to $P^+$ polysilicon, and metal nitrides such as, for example, titanium nitride and tantalum nitride. In particularly preferred embodiments of the present invention, the gate material comprises platinum.

An exemplary device in accordance with an embodiment of the present invention having a high work function gate material may also be fabricated by 0.12 NROM/NBit technologies. Table 2 shows the device structure and parameters in one example. The proposed tunnel dielectric with an ultra-thin O/N/O may alter the hole tunneling current. A thicker (7 nm) N2 layer may serve as a charge-trapping layer and an O3 (9 nm) layer may serve as the blocking layer in one example. Both N2 and O3 may be fabricated using NROM/NBit technologies.

TABLE 2

| Layer | Approximate Thickness (Angstroms) |
|---|---|
| Bottom Oxide | 15 |
| Inter Nitride | 20 |
| Inter Oxide | 18 |
| Trapping Nitride (N2) | 70 |
| Blocking Oxide | 90 |
| Gate: | Platinum |
| Channel length: | 0.22 µm |
| Channel width: | 0.16 µm |

Memory cells in accordance with high work function gate material embodiments of the present invention exhibit erase properties which are even more improved over other embodiments. High work function gate materials suppress gate electron injection into the trapping layer. In certain embodiments of the present invention wherein the memory cells comprise an N+ polysilicon gate, hole tunneling into the charge-trapping layer during erase occurs simultaneously with gate electron injection. This self-converging erase effect results in higher threshold voltage levels in the erased state, which can be undesirable in NAND applications. Memory cells in accordance with high work function gate material embodiments of the present invention can be used in various type of memory applications including, for example, NOR- and NAND-type memories. However, the memory cells according to high work function gate material embodiments of the present invention are particularly suitable for use in NAND applications where elevated threshold voltages in the erased/reset state can be undesirable. Memory cells in accordance with high work function gate material embodiments of the present invention can be erased via hole tunneling methods and preferably via −FN erasing operations.

Figure 7A:
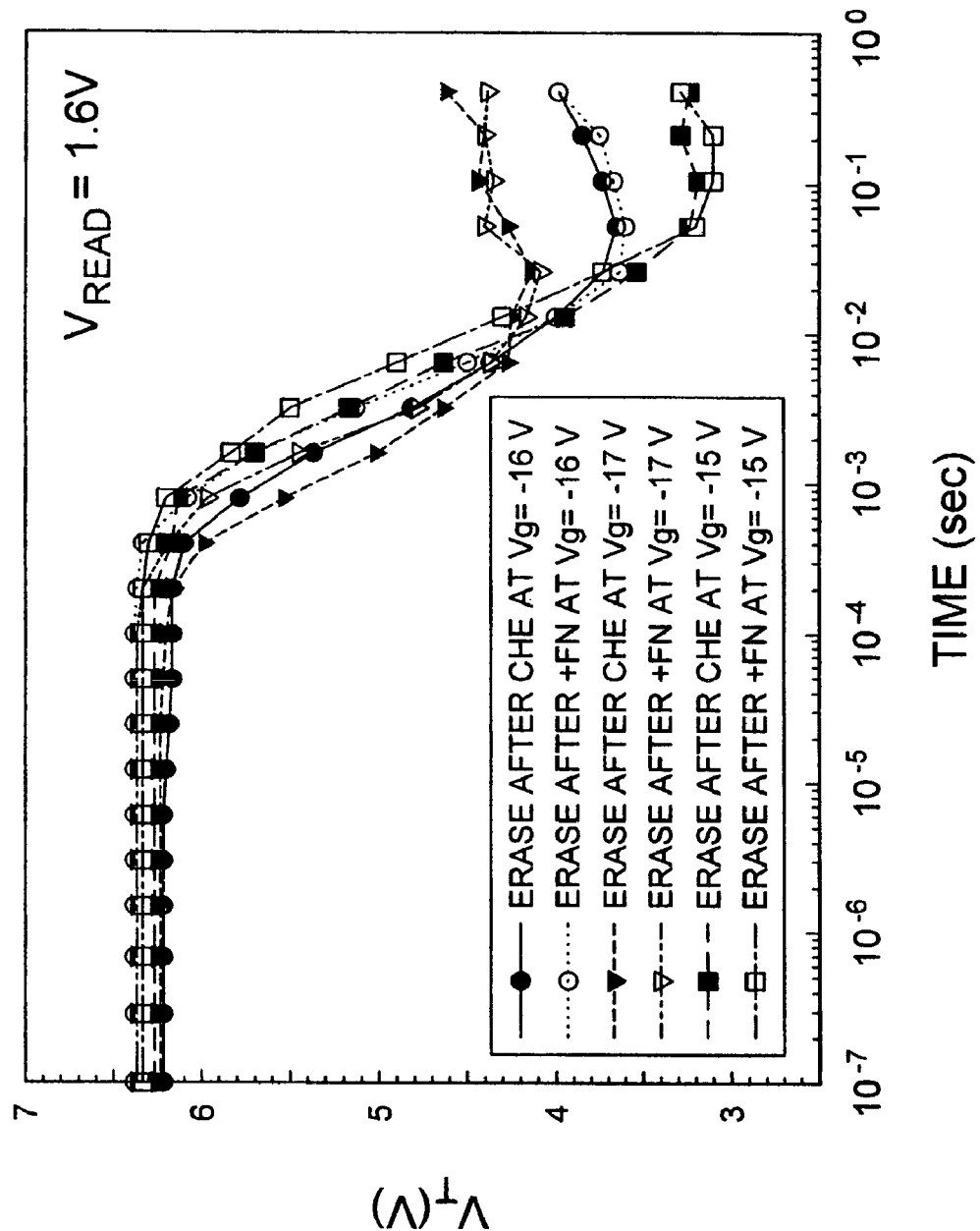
FIG. 7a is a graphical representation of the threshold voltage over time of a memory cell in accordance with one embodiment of the present invention during erase after various types of programming.

An exemplary device having an ONO tunneling dielectric and an N+ polysilicon gate may be programmed by conventional SONOS or NROM method and erased by channel FN hole tunneling. FIG. 7*a* shows the erase characteristics of an exemplary SONONOS device having an ONO tunneling dielectric in one example. Referring to FIG. 7*a*, a higher gate voltage results in a faster erase speed. It also has a higher saturation Vt, because gate injection is also stronger and the resulting dynamic balance point (which determines the Vt) is higher. This is shown on the right-hand side of the graph as the threshold voltage reaches a minimum at values of from about 3 to about 5 volts depending upon the erase gate voltage. The hole tunneling current can be extracted by a transient analysis method by differentiating the curves in FIG. 7*a*. The extracted hole current from the measurement in FIG. 7*a* is illustrated in FIG. 6 as discussed above. For comparison, there is also plotted simulated hole tunneling current using WKB approximation. The experimental results are in reasonable agreement with our prediction. The tunneling current through the O1/N1/O2 stack approaches that of the ultra-thin O1 under a high electric field, while it is turned-off under a low electric field.

Figure 7B:
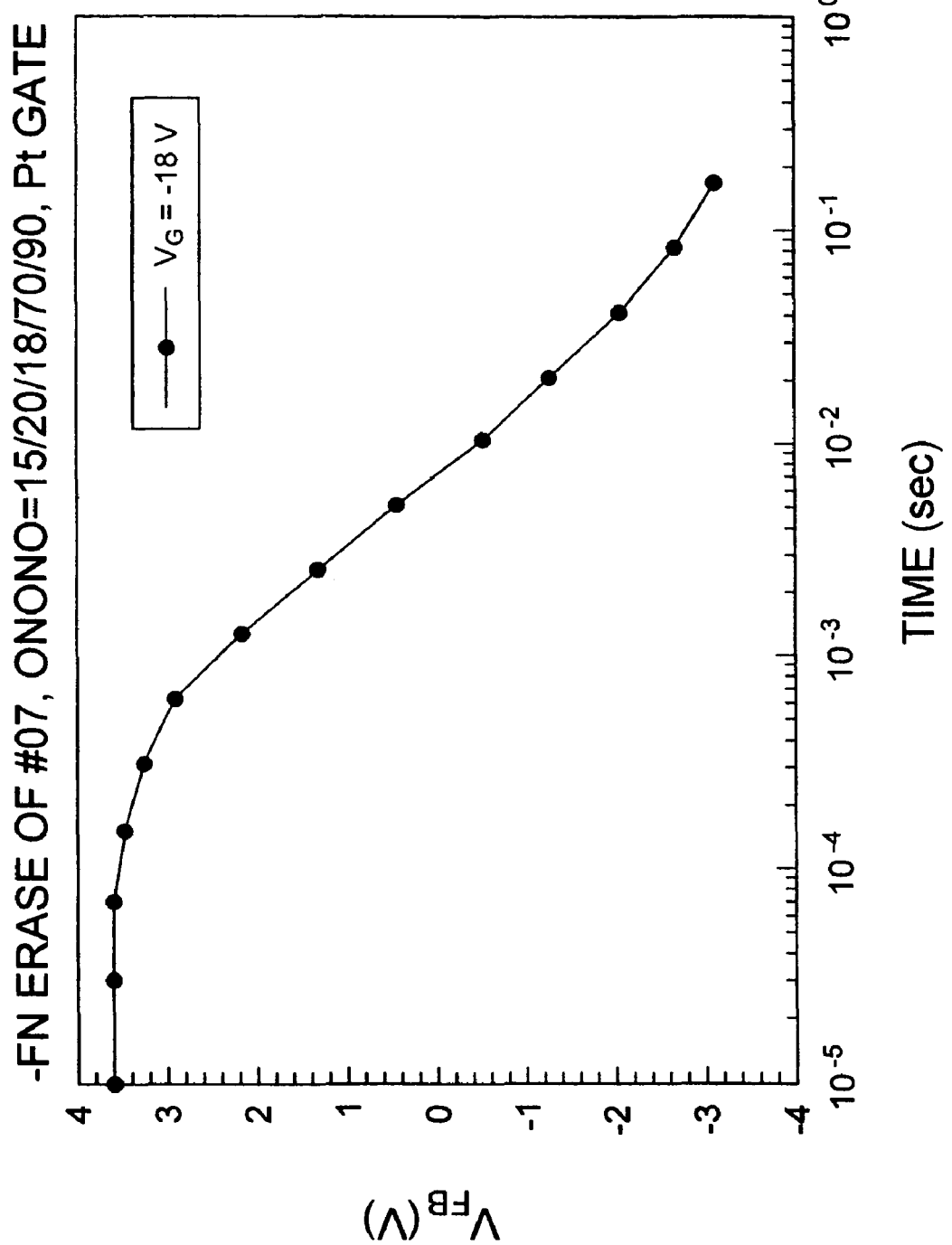
FIG. 7b is a graphical representation of the threshold voltage over time of a memory cell having a platinum gate in accordance with one embodiment of the present invention during erase.
Figure 7C:
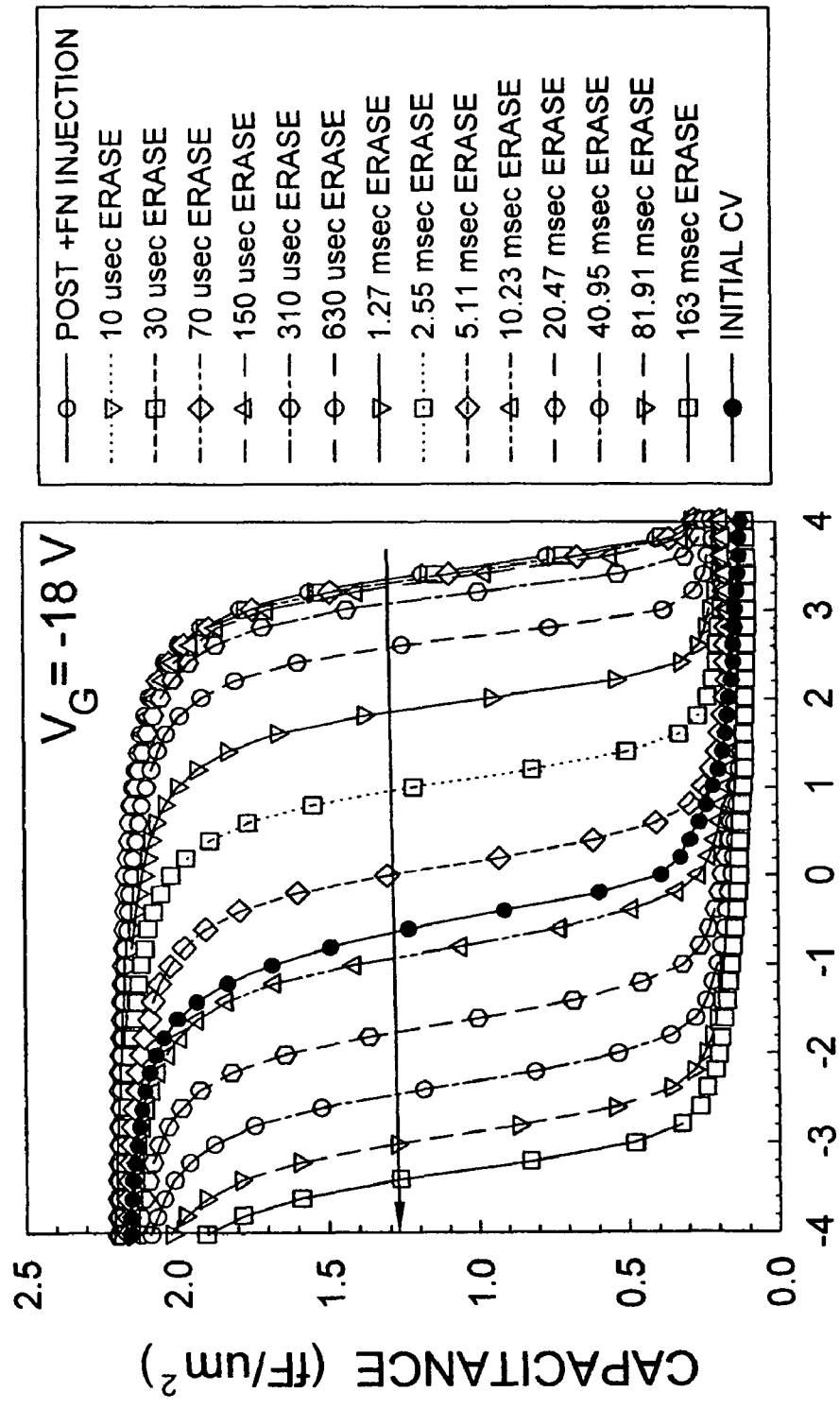
FIGS. 7c and 7d are graphical representations of capacitance versus voltage for the memory cell referred to in FIG. 7b.

In accordance with certain embodiments of memory cells of the present invention having high work function gate materials, wherein the high work function gate suppresses gate electron injection, the threshold voltage of the device in an erased or reset state can be much lower, and even negative, depending upon erase time. The threshold voltage values of a memory device in accordance with one embodiment of the present invention wherein the gate is comprised of platinum and the tunnel dielectric layer comprises a 15/20/18 angstrom ONO structure are shown in FIG. 7*b*. As shown in FIG. 7*b*, at a similar gate voltage (−18 V) during a-FN erase operation, the flat band voltage (which correlates with threshold voltage) of the device can be set below −3V. The corresponding capacitance versus gate voltage values for the device are shown in FIG. 7*c*.

Figure 7D:
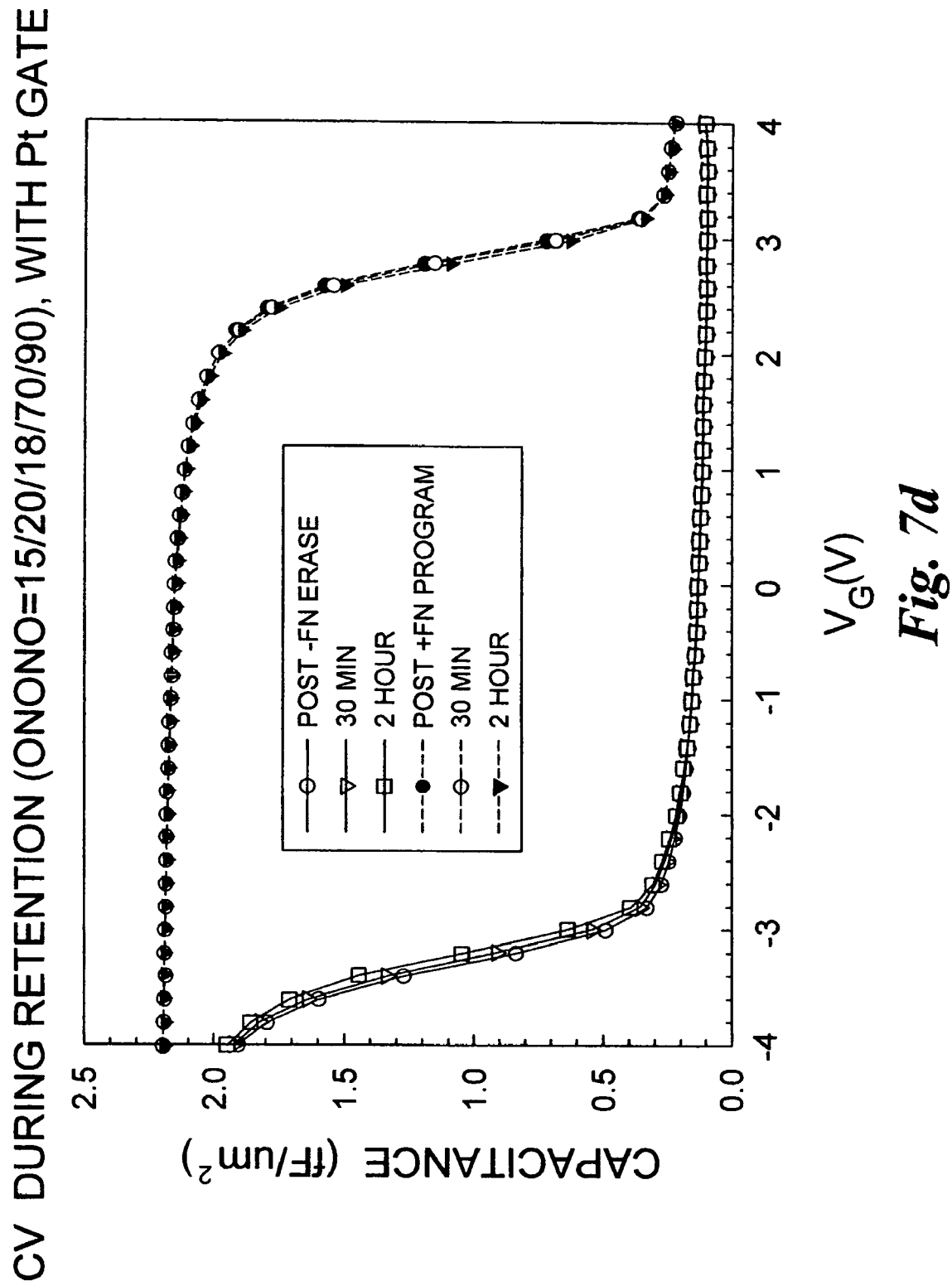

Moreover, retention properties of memory devices in accordance with high work function gate material embodiments the present invention are improved. The retention properties of a memory device having a platinum gate are shown in FIG. 7*d* wherein the capacitance is graphed as a function of gate voltage following erase and program, and then 30 minutes after each operation and two hours after each operation. Minimal deviation is observed.

Memory cells in accordance with various embodiments of the present invention may be operated with at least two separate schemes. For example, CHE programming with reverse read (mode 1) may be used to perform a 2-bits/cell operation. Additionally, low-power +FN programming (mode 2) may also be used for a 2-bits/cell operation. Both modes can use the same hole tunneling erase method. Mode 1 may preferably be used for a virtual ground array architecture for NOR-type flash memories. Mode 2 may preferably be used for NAND-type flash memories.

Figure 8:
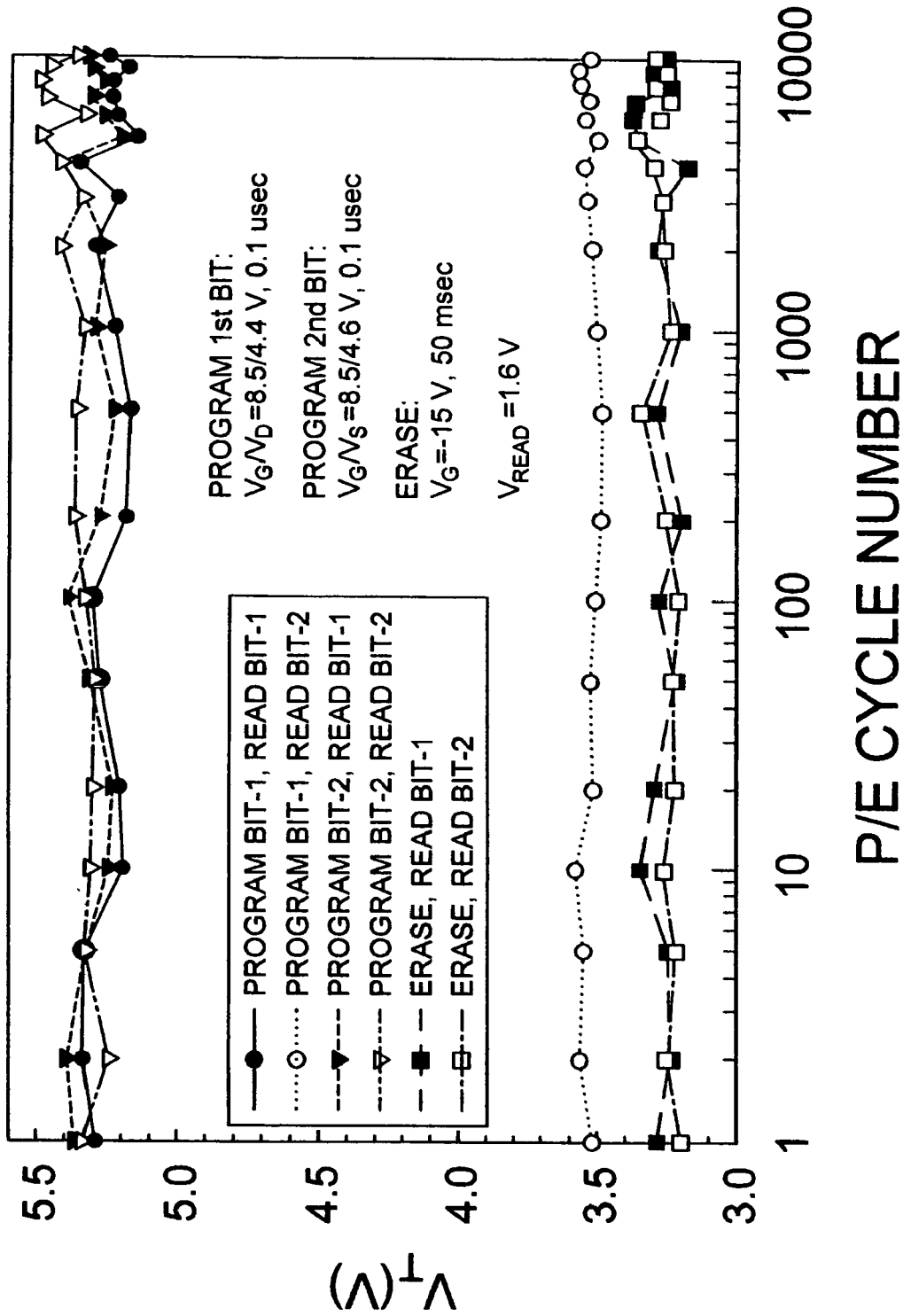
FIG. 8 is a graphical representation of the threshold voltage of a memory cell in accordance with one embodiment of the present invention over the course of numerous programs/erase cycles under various operating conditions.
Figure 9:
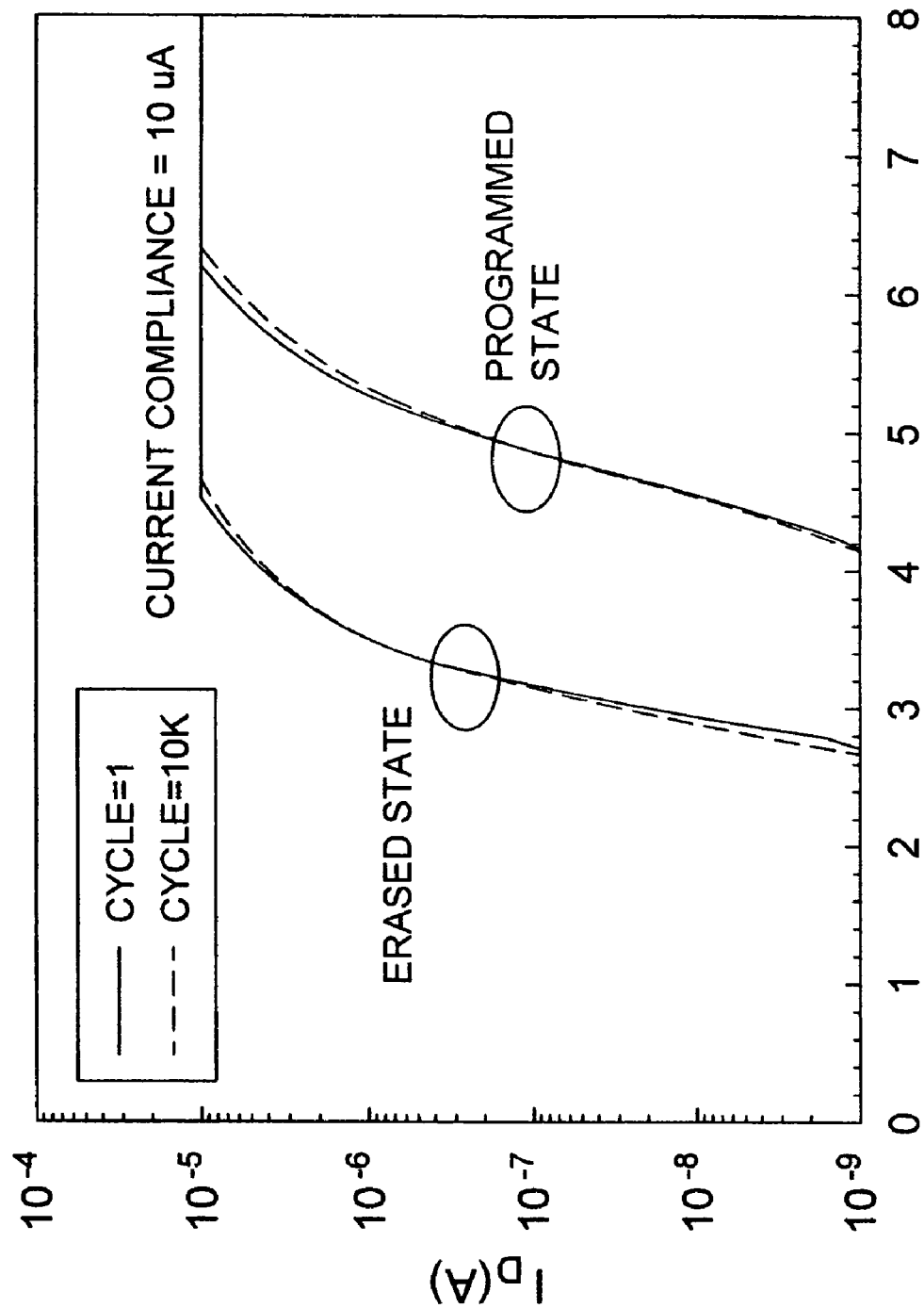
FIG. 9 is a graphical representation of the current-voltage (IV) relationship for a memory cell in accordance with one embodiment of the invention after one cycle and $10^3$ cycles.
Figure 10:
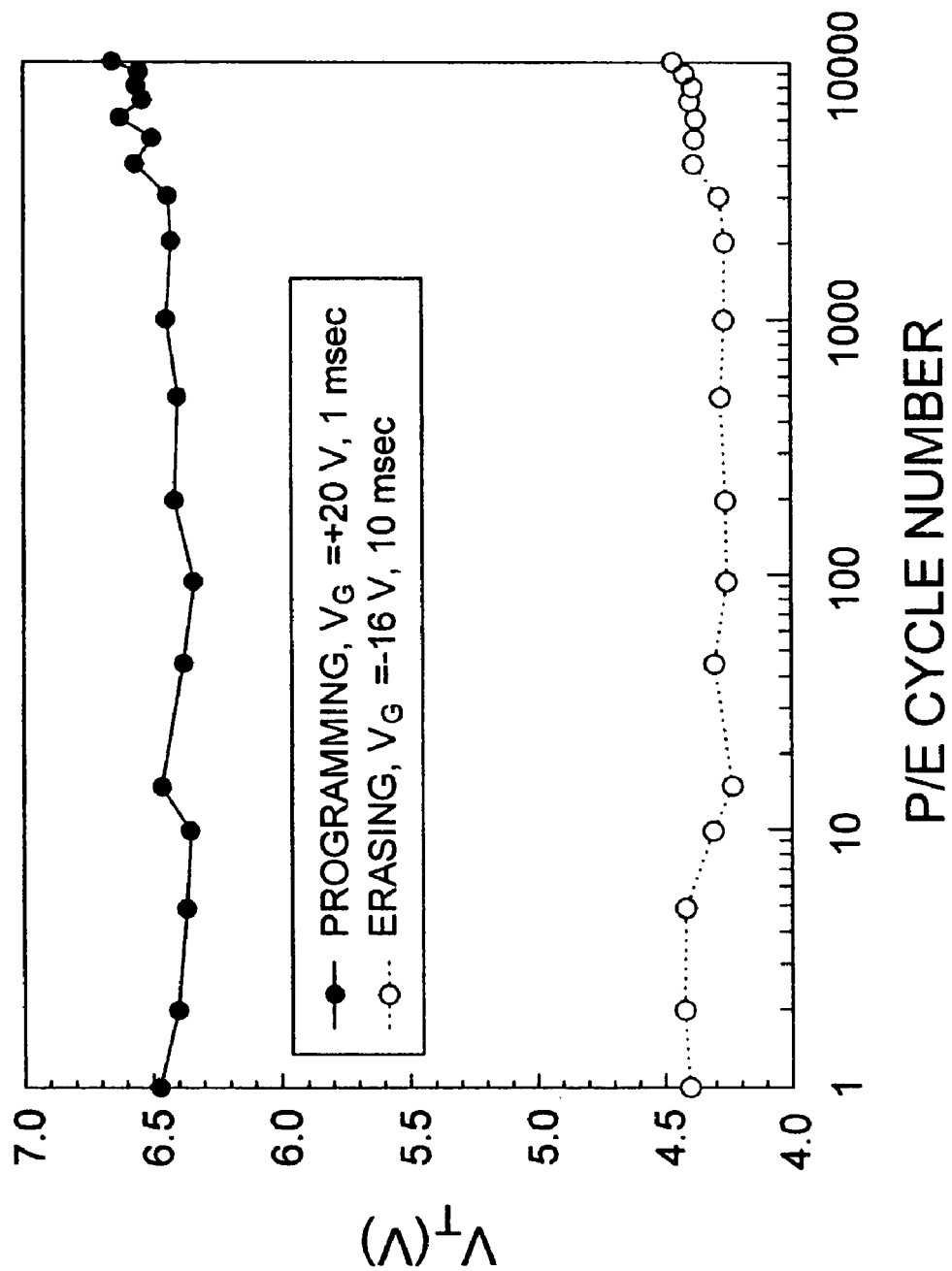
FIG. 10 is a graphical representation of the threshold voltage of a memory cell in accordance with one embodiment of the present invention over the course of numerous programs/erase cycles under one set of programming and erasing conditions.

As an example, FIG. 8 shows the excellent endurance properties of a virtual ground array architecture NOR-type flash memory in accordance with one embodiment of the present invention under mode 1 operation. Erase degradation of such memory devices having a tunnel dielectric structure does not occur, because hole tunneling erase (Vg=−15 V) is a uniform channel erase method. The corresponding IV curves are also shown in FIG. 9, which suggest little degradation of the device after numerous P/E cycles. In one example, this may be because ultra-thin oxide/nitride layers possess good stress immunity properties. Additionally, the memory device is free of hot-hole introduced damages. The endurance properties of a NAND-type flash memory in accordance with one embodiment of the present invention under Mode 2 operation are shown in FIG. 10. For a faster convergent erasing time, one may use a larger bias (Vg=−16 V). Excellent endurance may also be obtained in this example.

Figure 11:
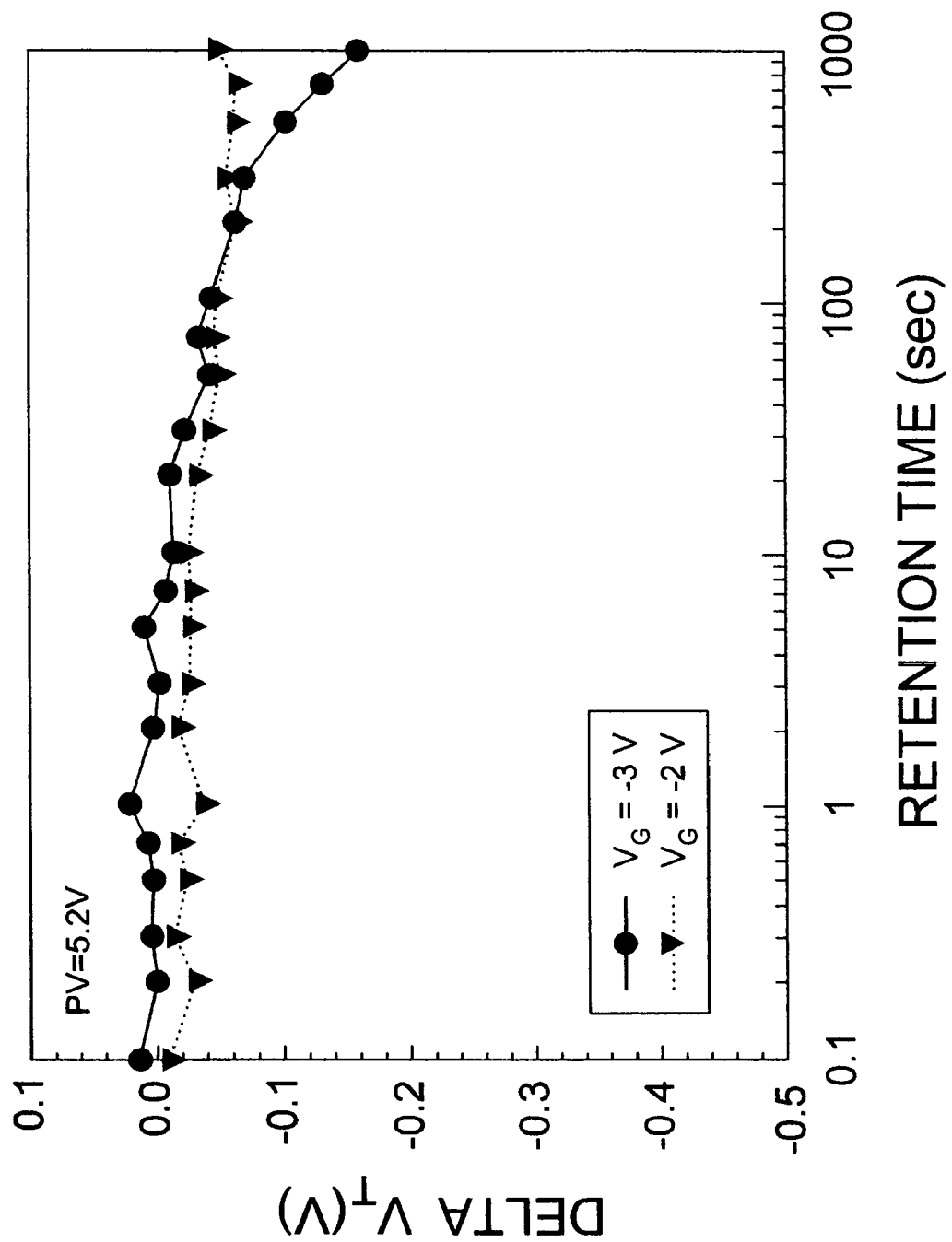
FIG. 11 is a graphical representation of the change in threshold voltage over time in a memory cell according to one embodiment of the present invention under VG-accelerated retention testing.

The charge retention of an exemplary SONONOS device in accordance with one embodiment of the present invention is shown in FIG. 4, where only a 60 mV charge loss is observed after 100 hours. The improvement of retention is many orders of magnitude better than conventional SONOS devices. VG-accelerated retention test also shows that direct tunneling can be suppressed at the low electrical field. FIG. 11 illustrates an example of a VG-accelerated retention test for a 10K P/E cycled device. The charge loss is small at −VG stress after a 1000 sec stress, indicating that the hole direct tunneling at small electrical field can be suppressed.

Accordingly, the SONONOS design identified in the above examples may provide a fast hole tunneling erase with excellent endurance properties. As noted above, the design may be implemented in both NOR and NAND-type nitride-storage flash memories. Additionally, a memory array in accordance with the present invention may include multiple memory devices with similar or different configurations.

In various embodiments of arrays according to the present invention, memory cells according to the present invention may be used in place of conventional NROM or SONOS devices in a virtual ground array architecture. The reliability problems and erase degradations may be solved or mitigated by using FN hole tunneling instead of hot-hole injection. Without limiting the scope of the invention to the specific structures described below, various operation methods in accordance with memory arrays of the present invention are described below for exemplary NOR virtual ground array architectures.

CHE or CHISEL (channel initiated secondary electron) programming and reverse read may be used for 2-bit/cell memory array. And the erase method may be a uniform channel FN hole tunneling erase. In one example, the array architecture may be a virtual ground array or a JTOX array. With reference to FIGS. 12*a*-20, an O1/N1/O2 tri-layer structure may be used as the tunnel dielectric, each layer having about 3 nm or less in thickness to provide hole direct tunneling. With reference to FIGS. 12*a*-20, N2 may be thicker than 5 nm to provide a high trapping efficiency. An insulating layer, O3, may be a silicon oxide layer formed by wet oxidation, such as a wet converted top oxide (silicon oxide), to provide a large density of traps at the interface between O3 and N2. O3 may be about 6 nm or thicker to prevent charge loss from this silicon oxide layer.

Figure 12B:
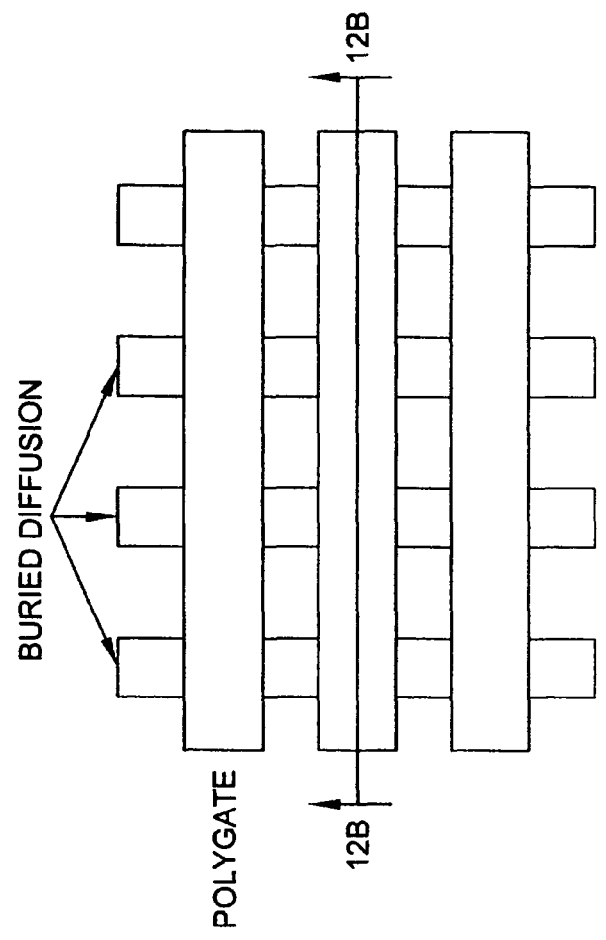
FIGS. 12a and 12b are an equivalent circuit diagram and layout view, respectively, of a virtual ground array of memory cells in accordance with one embodiment of the present invention.
Figure 12A:
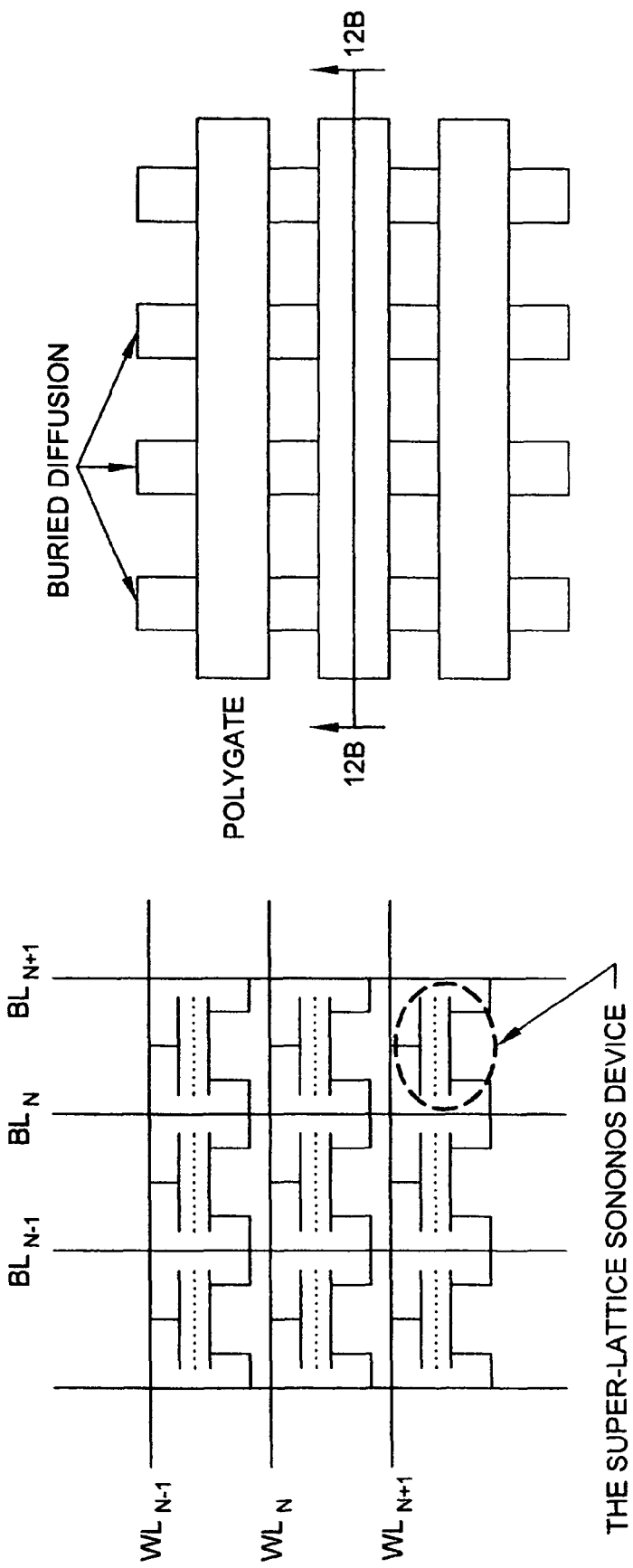

FIGS. 12a and 12b illustrate an example of a virtual ground array architecture incorporating the memory cells discussed above, such as memory cells having a tri-layer ONO tunnel dielectric. In particular, FIG. 12a illustrates an equivalent circuit of a portion of a memory array, and FIG. 12b illustrates an exemplary layout of a portion of the memory array.

Figure 13:
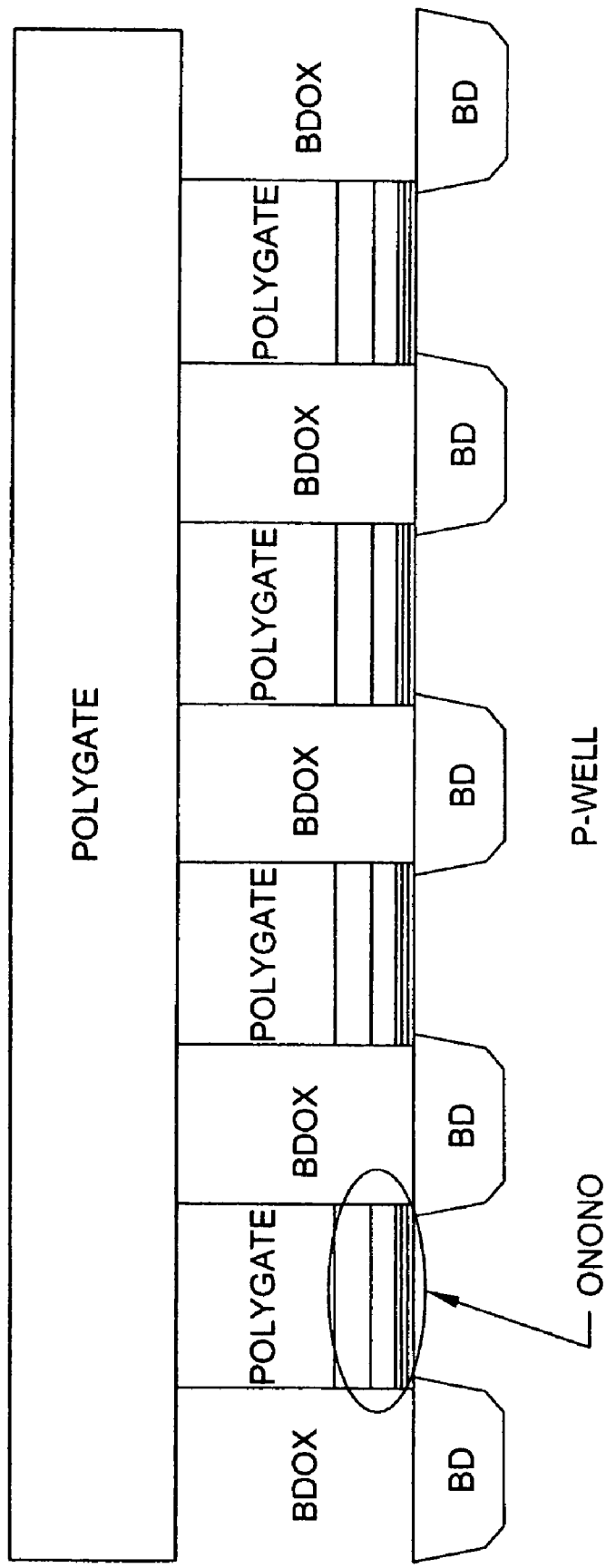
FIG. 13 is a cross-section schematic representation of a virtual ground array of memory cells in accordance with one embodiment of the present invention taken along line 12B-12B as shown in FIG. 12b.

In addition, FIG. 13 illustrates a schematic diagram of the cross-sectional view of several memory cells incorporated in the array. In one example, the buried diffusion (BD) areas may be N+-doped junctions for the source or drain regions of the memory cells. The substrate may be a p-type substrate. In order to avoid possible breakdown of the BDOX areas (oxide above BD) during −FN erase, a thick BDOX (>50 nm) may be used in one example.

Figures 14A, 14B:
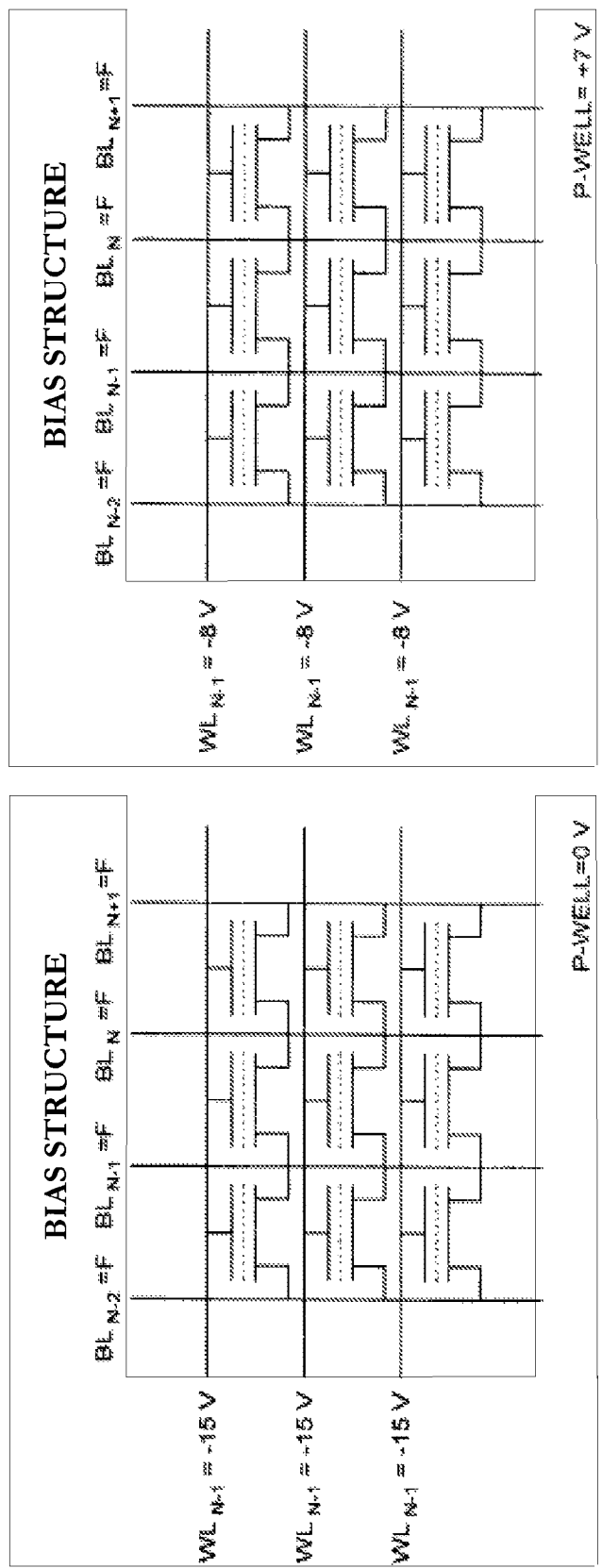
FIGS. 14a and 14b are equivalent circuit diagrams of memory arrays comprising memory cells in accordance with one embodiment of the present invention and depicting suitable reset/erase voltages in accordance with two embodiments of operation in accordance with the present invention.

FIGS. 14a and 14b illustrate possible electrical RESET schemes for an exemplary virtual ground array incorporating 2 bits/cell memory cells having a tunnel dielectric design discussed above. Before performing further P/E cycles, all the devices may first undergo an electrical "RESET". A RESET process may ensure the Vt uniformity of memory cells in the same array and raise the device Vt to the convergent erased state. For example, applying Vg=−15 V for 1 sec, as shown in FIG. 14a, may have the effect of injecting some charge into a charge trapping layer of silicon nitride to reach a dynamic balancing condition. With the RESET, even memory cells that are non-uniformly charged due, for example, to the plasma charging effect during their fabrication processes may have their Vt converged. An alternative way for creating a self-converging bias condition is to provide bias for both gate and substrate voltages. For example, referring to FIG. 14b, Vg=−8 V and P-well =+7 V may be applied.

Figure 15B:
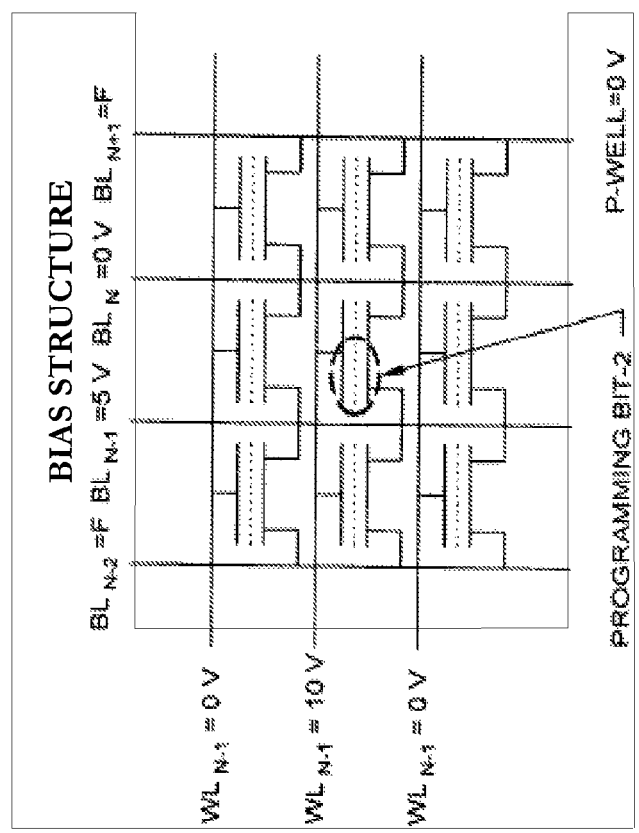
FIGS. 15a and 15b are equivalent circuit diagrams of memory arrays comprising memory cells in accordance with one embodiment of the present invention depicting one method of programming in accordance with the present invention.
Figure 15A:
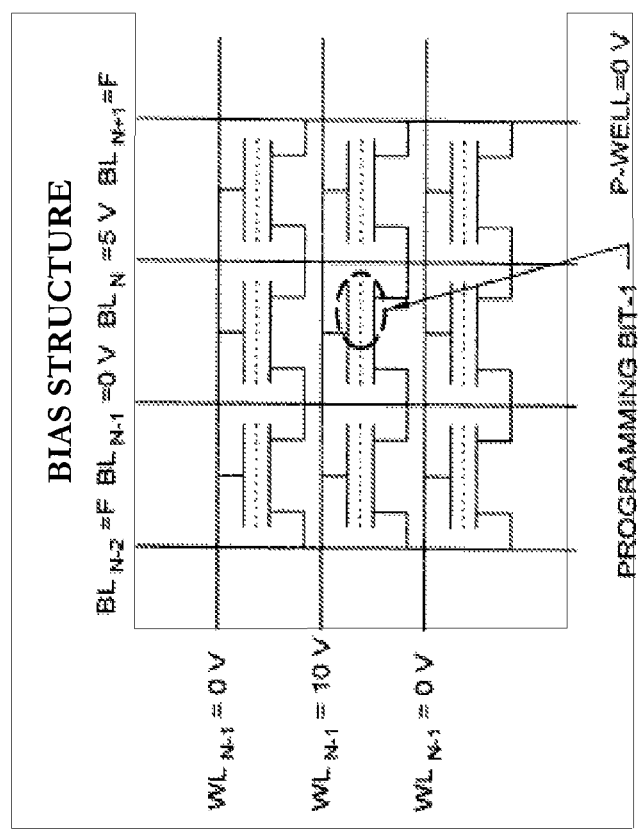

FIGS. 15a and 15b illustrate programming schemes for an exemplary virtual ground array incorporating 2 bits/cell memory cells having a tunnel dielectric design discussed above. Channel hot-electron (CHE) programming may be used to program the device. For Bit-1 programming illustrated in FIG. 15a, the electrons are locally injected into the junction edge above BLN (bit line N). For Bit-2 programming shown in FIG. 15b, the electrons are stored above BLN-1. Typical programming voltage for WL (word line) is around 6 V to 12 V. Typical programming voltage for BL (bit line) is about 3 to 7 V, and the p-well may be kept grounded.

Figure 16B:
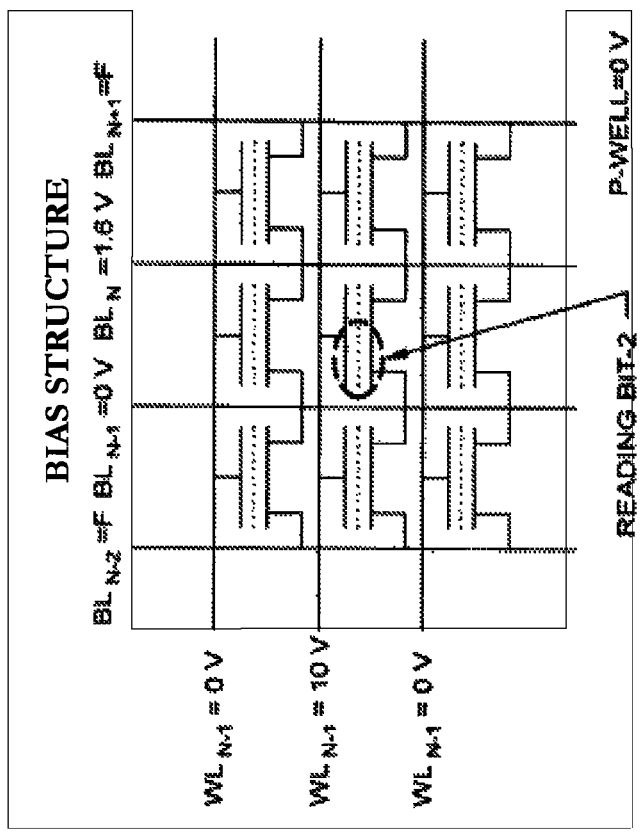
FIGS. 16a and 16b are equivalent circuit diagrams of memory arrays comprising memory cells in accordance with one embodiment of the present invention depicting one method of reading a bit in accordance with the present invention.
Figure 16A:
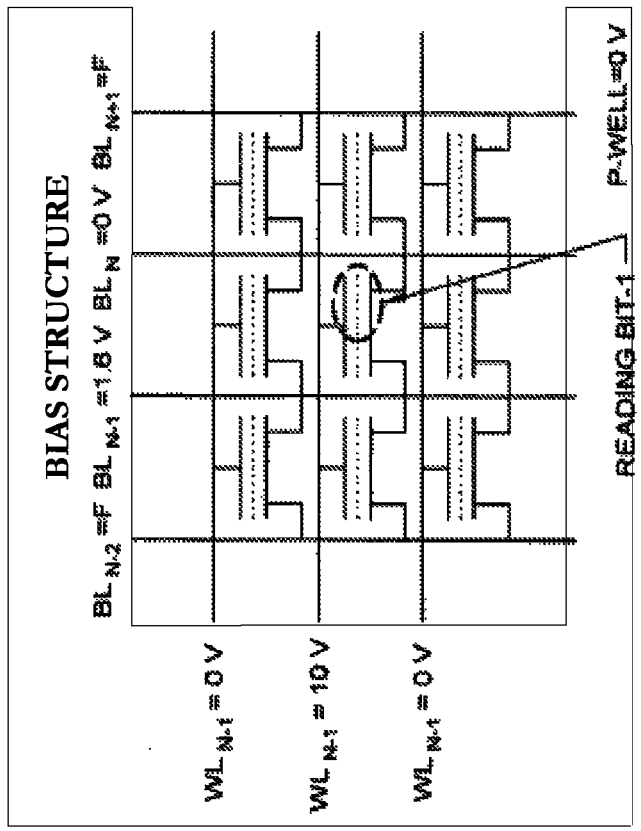

FIGS. 16a and 16b illustrate reading schemes for an exemplary virtual ground array incorporating 2 bits/cell memory cells having a tunnel dielectric design discussed above. In one example, reverse read is used to read the device to perform a 2 bits/cell operation. Referring to FIG. 16a, for reading Bit-1, BLN-1 is applied with a suitable read voltage, such as 1.6 V. Referring to FIG. 16b, for reading bit-2, BLN is applied with a suitable read voltage, such as 1.6V. In one example, the reading voltage may be in the range of about 1 to 2 V. The word lines and the P-well may be 13 kept grounded.

However, other modified read schemes, such as a raised-Vs reverse read method can be performed. For example, a raised-Vs reverse read method may use Vd/Vs=1.8/0.2 V for reading Bit-2, and Vd/Vs=0.2/1.8 for reading Bit-1.

FIGS. 14a and 14b also illustrate sector erase schemes for an exemplary virtual ground array incorporating 2 bits/cell memory cells having a tunnel dielectric design discussed above. In one example, sector erase with channel hole tunneling erase may applied to erase the memory cells simultaneously. An ONO tunnel dielectric in a memory cell having the SONONOS structure may offer a fast erase, which may occur in about 10 to 50 msec and a self-convergent channel erase speed. In one example, a sector erase operation condition may be similar to a RESET process. For example, referring to FIG. 14a, applying VG=about −15 V at the WL's simultaneously and leaving all the BL's floating may achieve a sector erase. And the p-well may be kept grounded.

Alternatively, referring to FIG. 14b, applying about −8 V to the WL's and about +7 V to the p-well may also achieve a sector erase. In some examples, a complete sector erase operation may be carried out within 100 msec or less without having any over-erase or hard-to-erase cells. The device design discussed above may facilitate a channel erase providing excellent self-converging properties.

Figure 17:
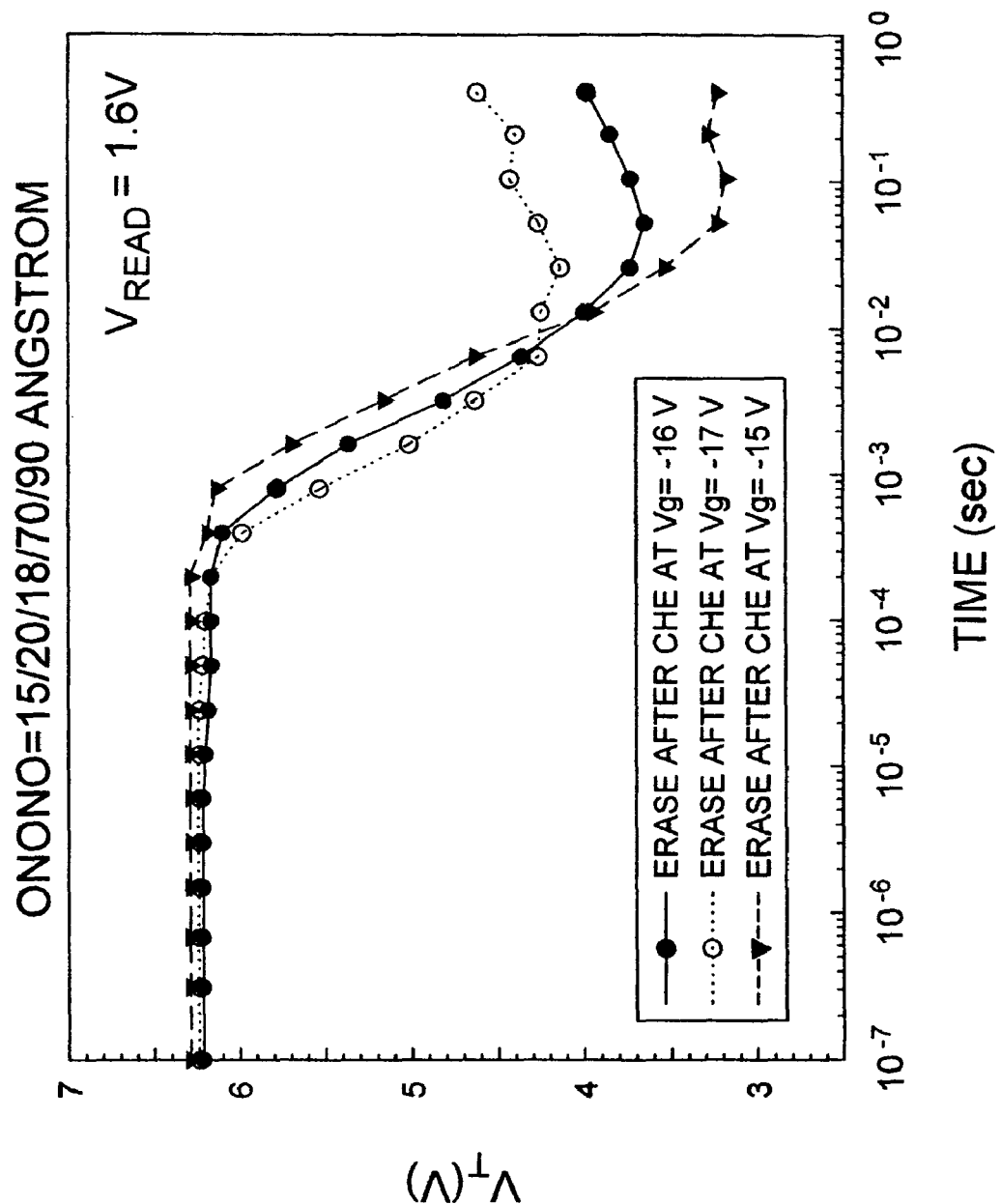
FIG. 17 is a graphical representation of the threshold voltage of a memory cell in accordance with one embodiment of the present invention over time under various erasing conditions.

FIG. 17 illustrates the erase characteristics in one example of using an SONONOS device. An example of an SONONOS device may have the thickness of O1/N1/O2/N2/O3 respectively as about 15/20/18/70/90 Angstroms, with an N+-polysilicon gate and thermally converted top oxide as O3. The erase speeds for various gate voltages are shown. The erase operation on the cell having the O1/N1/O2 tunnel dielectric with layers having thicknesses respectively as about 15/20/18 Angstroms, results in a reduction of the threshold voltage of about 2 volts in less than 50 msec, for example about 10 msec, under the conditions shown for −FN erase voltages between −15 and −17 volts. A higher gate voltage results in a faster erase speed.

However, the convergent Vt is also higher. This is because gate injection is more active under higher gate voltages. To reduce gate injection, P+-polysilicon gate or other metal gate with a high work function may be used alternatively as the gate material to reduce the gate-injected electrons during the erase.

Figure 18:
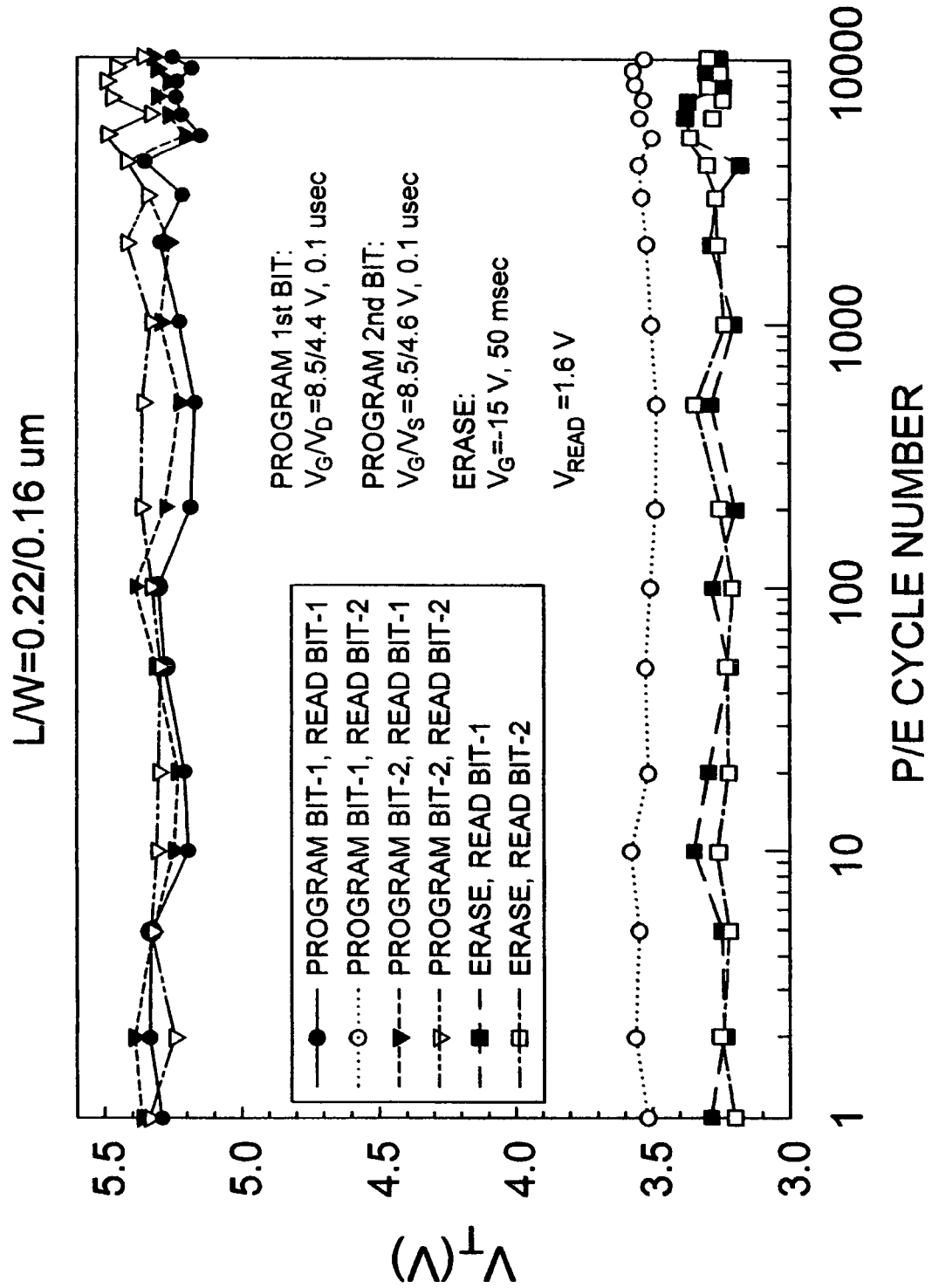
FIG. 18 is a graphical representation of the threshold voltage of a memory cell in accordance with one embodiment of the present invention over the course of numerous programs/erase cycles.

FIG. 18 illustrates the endurance properties of using SONONOS devices in a virtual ground array architecture. The endurance properties of in some examples are excellent. The programming condition is Vg/Vd=8.5/4.4 V, 0.1 μsec for Bit-1 and Vg/Vs=8.5/4.6 V, 0.1 μsec for Bit-2. The FN erase may use Vg=−15 V for about 50 msec to erase the two bits simultaneously. Because the FN erase is self-convergent uniform channel erase, hard-to-erase or over-erase cells usually do not present. In some examples, the devices proposed above show excellent endurance properties even without using a Program/Erase verifying or stepping algorithm.

Figure 19B:
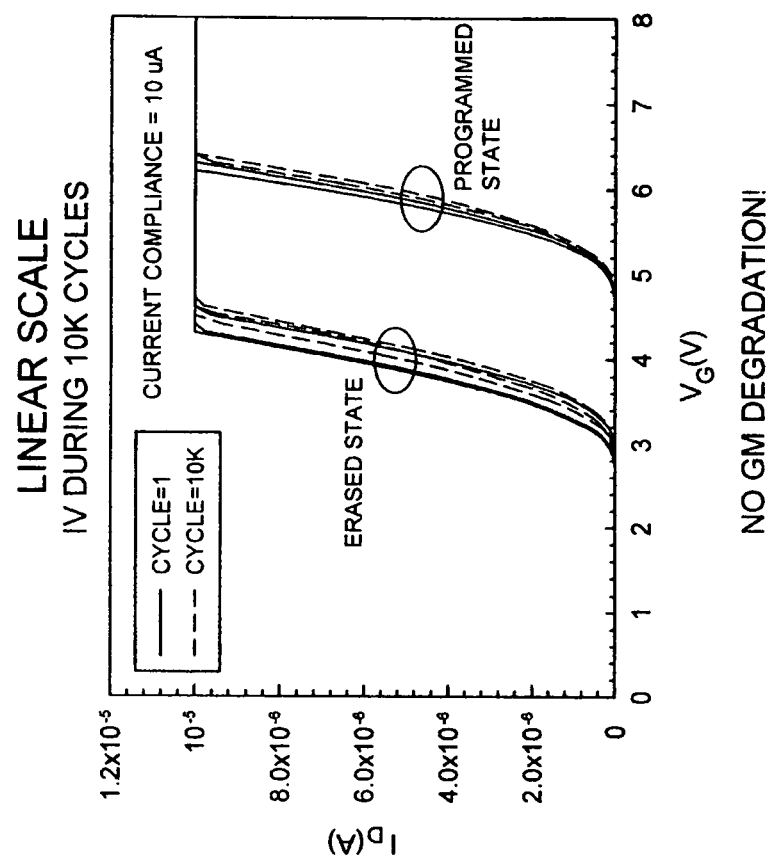
FIGS. 19a and 19b are graphical representations of the current at the drain of a memory cell in accordance with one embodiment under various gate voltages depicted in a logarithmic scale and a linear scale, respectively.
Figure 19A:
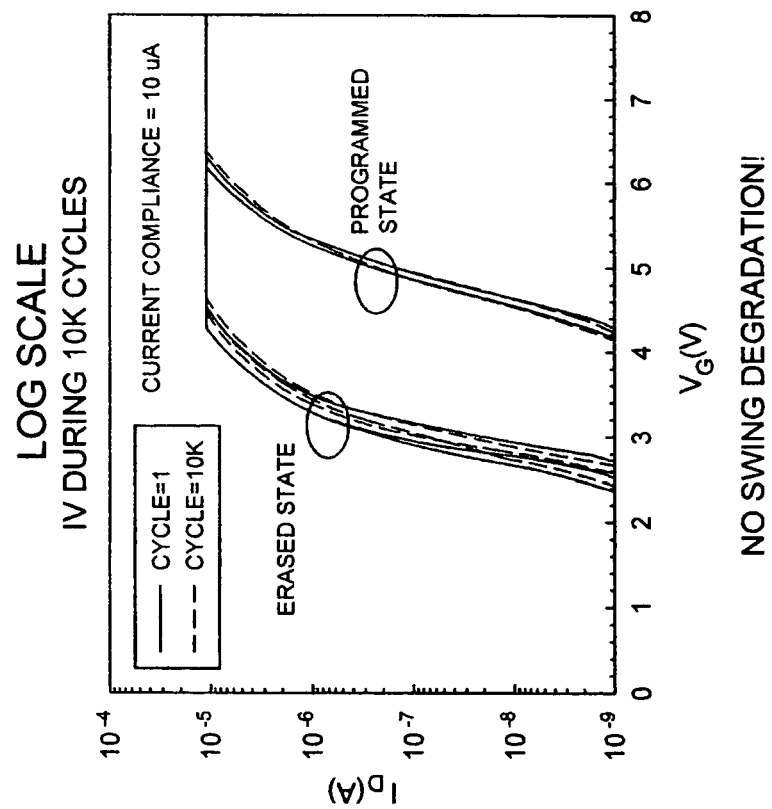

FIGS. 19a and 19b illustrate I-V characteristics during P/E cycles in one example. The corresponding I-V curves in both log scale (FIG. 19a) and linear scale (FIG. 19b) are shown. In one example, an SONONOS device possesses little degradations after numerous P/E cycles, such that both the sub-threshold swing (S.S.) and trans-conductance (gm) are almost the same after numerous cycles. This SONONOS device possesses superior endurance properties than NROM device. One reason may be that hot-hole injection is not used. Additionally, an ultra-thin oxide as noted above may possess better stress immunity properties than a thick tunnel oxide.

Figure 20:
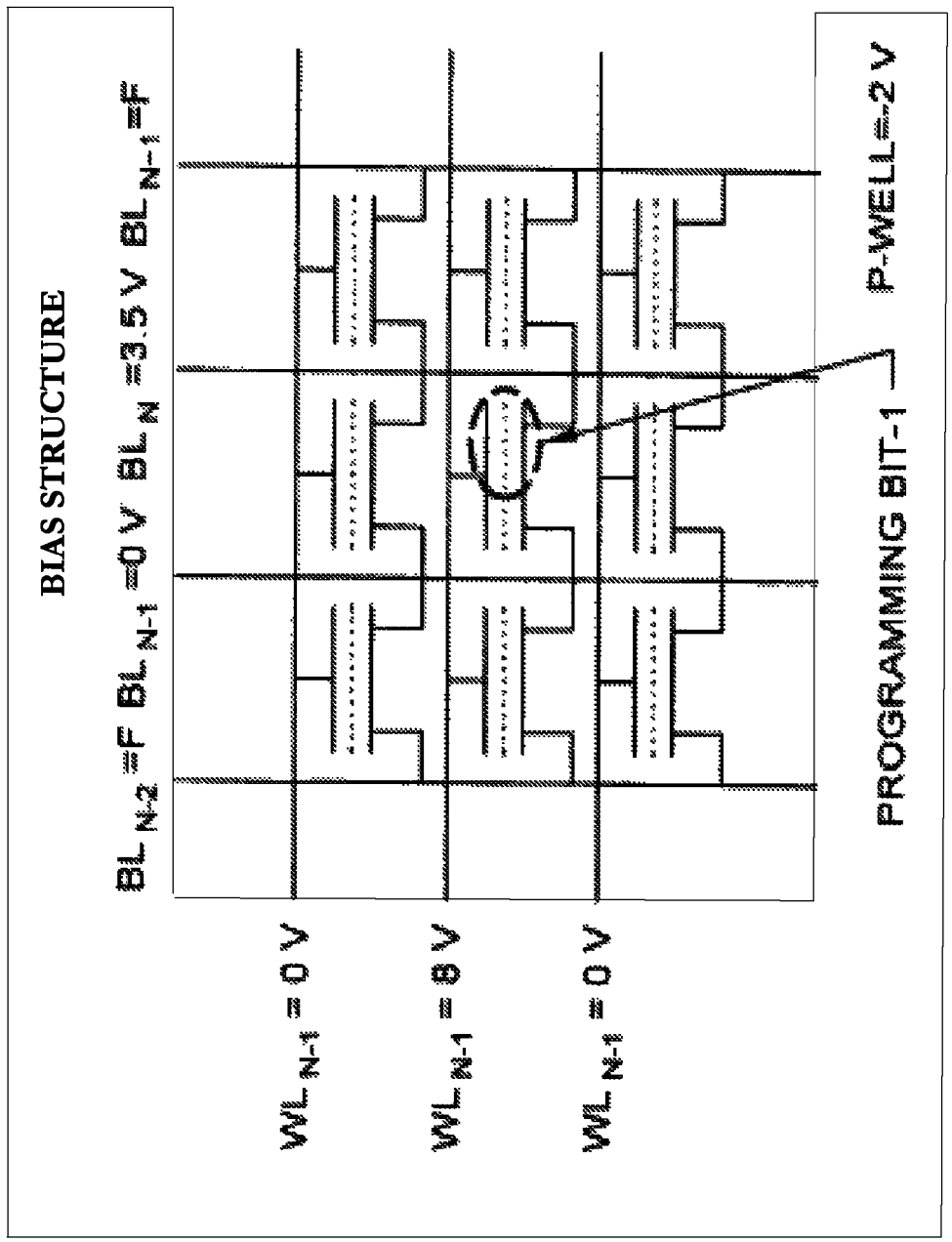
FIG. 20 is an equivalent circuit diagram of an array including memory cells in accordance with one embodiment of the present invention depicting one method of programming a bit in accordance with the present invention.

FIG. 20 illustrates a CHISEL programming scheme in one example. An alternative way to program the device is to use CHISEL programming scheme, which uses negative substrate bias enhanced impact ionization to increase the hot carrier efficiency. The programming current can be also reduced due to the body effect. Typical condition is illustrated in this figure, where substrate is applied with a negative voltage (−2 V), and the junction voltage is reduced to about 3.5 V. For conventional NROM devices and technologies, CHISEL programming is not applicable because it may inject more electrons near the channel center region. And hot-hole erase is inefficient to remove the electrons near the channel center region in the conventional NROM devices.

Figure 21B:
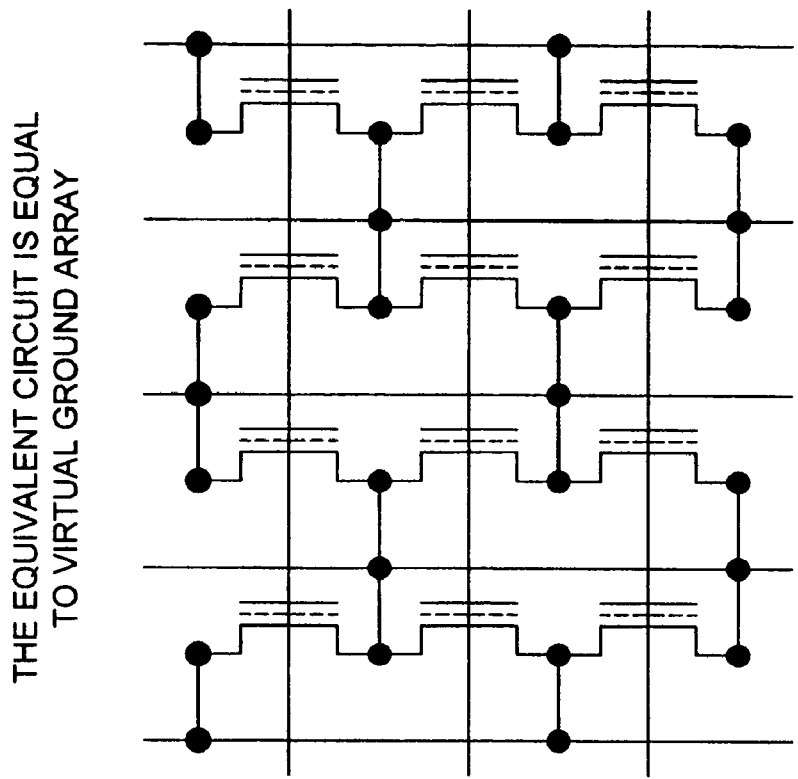
FIGS. 21a and 21b are a layout view and equivalent circuit diagram of a virtual ground array in accordance with one embodiment of the present invention.
Figure 21A:
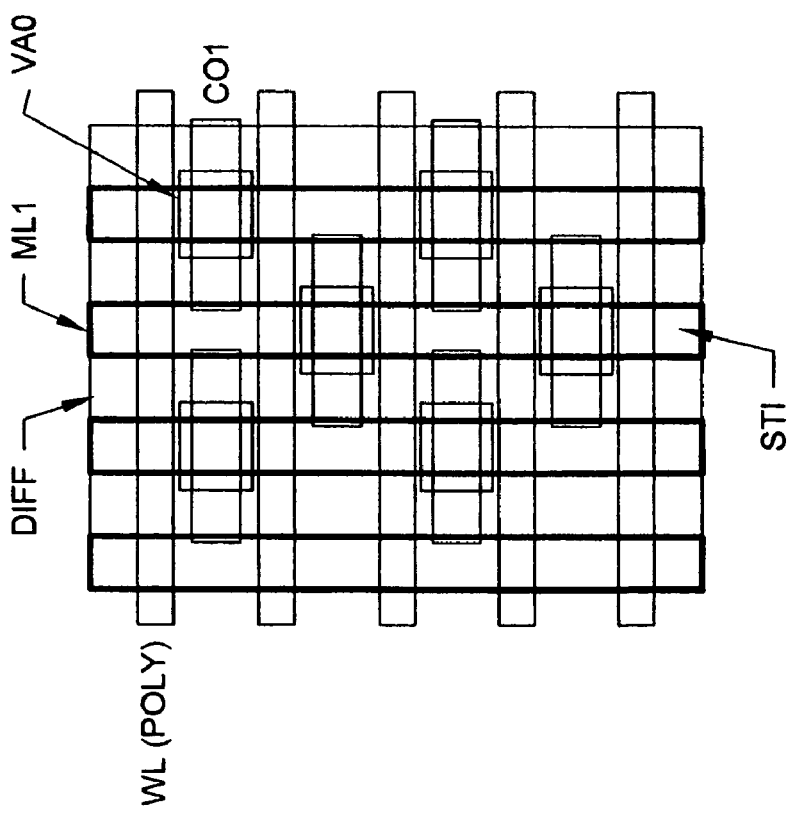

FIGS. 21a and 21b illustrate the design of a JTOX virtual ground array in one example. The JTOX virtual ground array provides an alternative implementation of using SONONOS memory cells in a memory array. In one example, one difference between the JTOX structure and a virtual ground array is that the devices in the JTOX structure that are isolated by STI processes. A typical layout example is illustrated in FIG. 21a. FIG. 21b illustrates a corresponding equivalent circuit, which is the same as that of a virtual ground array.

As noted above, memory cell structures in accordance with the present invention are suitable for both NOR- and NAND-type flash memories. The following will describe additional examples of memory array designs and their operation methods. Without limiting the scope of the invention to the specific structures described below, various operation methods in accordance with memory arrays of the present invention are described below for exemplary NAND architectures.

Figure 23A:
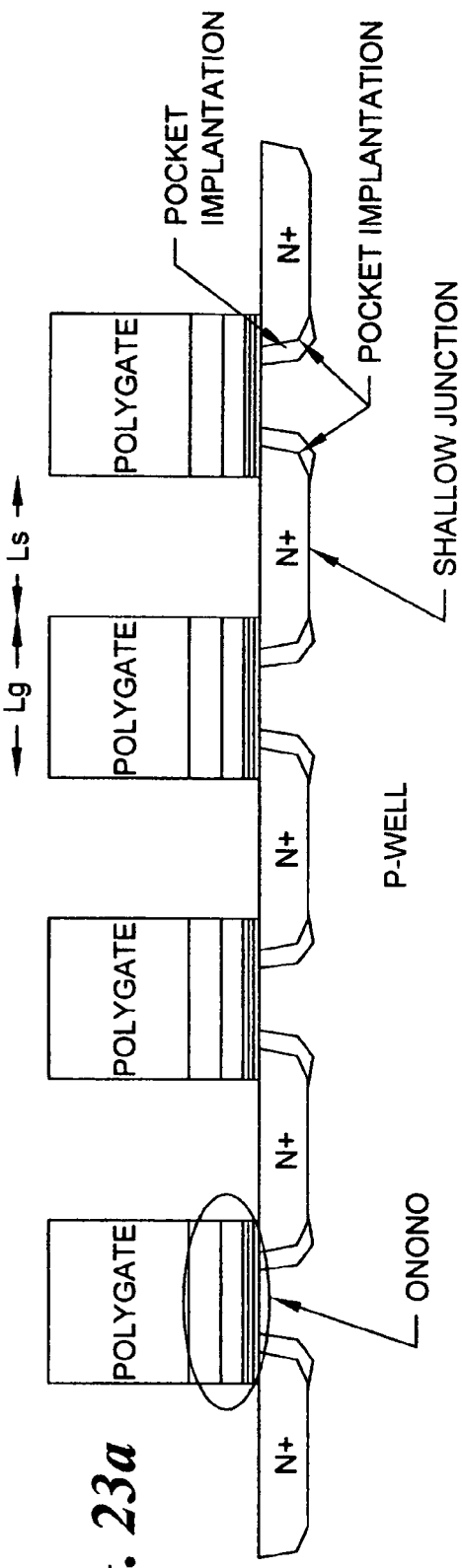
FIGS. 23a and 23b are cross-sectional schematic representations of a NAND array of memory cells in accordance with one embodiment of the present invention taken along lines 22A-22A and 22B-22B, respectively, as shown in FIG. 22b.
Figure 23B:
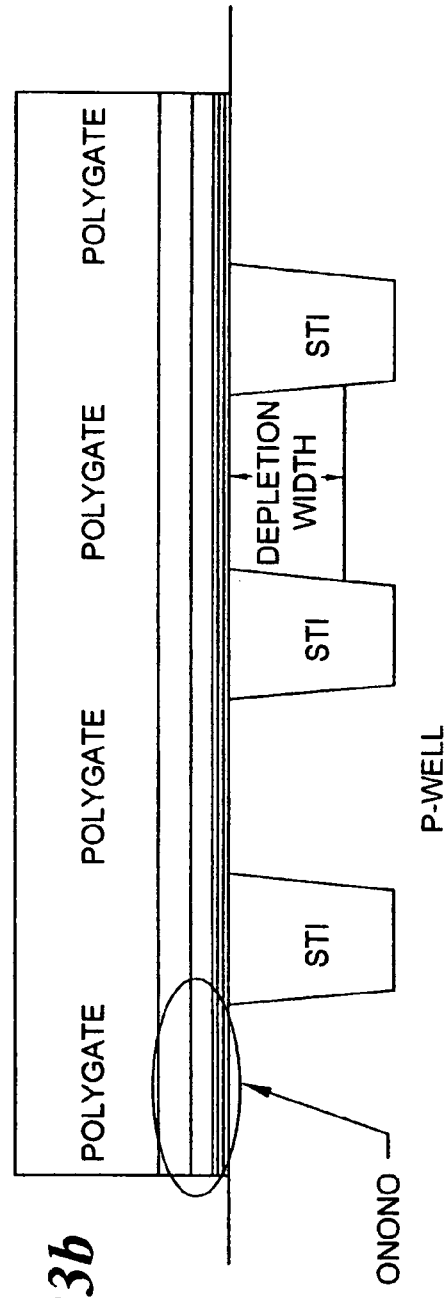

As noted above, n-channel SONONOS memory devices having an ONO tunneling dielectric may be used in a memory device. FIGS. 22a and 22b illustrate an example of a NAND array architecture. FIGS. 23a and 23b illustrate the cross-sectional views of an exemplary memory array design from two different directions. In some examples, the operation methods of a memory array may include +FN programming, self-converging reset/erase, and reading methods. Additionally, circuit operation methods may be included to avoid program disturb in some examples.

In addition to the single-block gate structure design, a split-gate array, such as a NAND array using SONONOS devices positioned between two transistor gates which are located next to the source/drain regions, may also be used. In some examples, a split-gate design may scale down device dimension to F=30 nm or below. Furthermore, the devices may be designed to obtain good reliability, to reduce or eliminate the inter-floating-gate coupling effect, or to achieve both. As discussed above, an SONONOS memory device may provide excellent self-converging erase, which may help sector-erase operations and Vt distribution control. Furthermore, a tightened erased state distribution may facilitate multi-level applications (MLC).

By using certain designs for a memory array structure, the effective channel length (Leff) may be enlarged to reduce or eliminate short-channel effects. Some examples may be designed to use no diffusion junctions, thereby avoiding the challenges in providing shallow junctions or using pocket implantations during the manufacturing processes of memory devices.

FIG. 1 illustrates an example of a memory device having an SONONOS design. In addition, Table 1 noted above illustrates an example of materials used for different layers and their thicknesses. In some examples, P+-polysilicon gate may be used to provide a lower saturated Reset/Erase Vt, which may be achieved by reducing gate injection.

FIGS. 22a and 22b illustrate an example of a memory array, such as an SONONOS-NAND array having memory cells in accordance with embodiment described in Table 1, with diffusion junctions. In one example, separate devices may be isolated from each other by various isolation techniques, such as by using shallow-trench isolation (STI) or the isolation technique of silicon-on-insulator (SOI). Referring to FIG. 22a, a memory array may include multiple bit lines, such as BL1 and BL2, and multiple word lines, such as WL1, WLN-1, and WLN. Additionally, the array may include source line transistor(s) (or source-line-selecting transistor(s) or SLTs) and bit line transistor(s) (or bit-line-selecting transistor(s) or BLTs). As illustrated, the memory cells in the array may use an SONONOS design, and the SLT and BLT may include n-type metal-oxide-semiconductor field-effect transistors (NMOSFETs).

FIG. 22b illustrates an exemplary layout of a memory array, such as a NAND array. Referring to FIG. 22b, Lg is the channel length of memory cells, and Ls is the space between each separate lines of memory devices. Additionally, W is the channel width of memory cells, and Ws is the width of isolation areas between separate bit lines or source/drain areas, which may be the STI width in one example.

Referring again to FIGS. 22a and 22b, the memory devices may be connected in series and form a NAND array. For example, a string of memory devices may include 16 or 32 memory devices, providing a string number of 16 or 32. The BLTs and SLTs may be used as selecting transistors to control the corresponding NAND strings. In one example, the gate dielectric for BLTs and SLTs may be a silicon oxide layer that does not include a silicon nitride trapping layer. Such configuration, although not necessarily required in every case, may avoid possible Vt shift of BLTs and SLTs during the operations of the memory array in some examples. Alternatively, the BLTs and SLTs may use the combination of ONONO layers as their gate dielectric layers.

In some examples, the gate voltages applied to BLTs and SLTs may be less than 10 V, which may cause less gate disturb. In cases where the gate dielectric layer of BLTs and SLTs may be charged or trapped with charges, additional –Vg erase can be applied to the gates of BLT or SLT to discharge their gate dielectric layers.

Referring again to FIG. 22a, each BLT may be coupled to a bit-line (BL). In one example, a BL may be a metal line having the same or approximately the same pitch to that of STI. Also, each SLT is connected to a source line (SL). The source line is parallel to the WL and connected to the sense amplifier for read sensing. The source line may be a metal, such as tungsten, or polysilicon line, or a diffusion N+-doped line.

FIG. 23a illustrates a cross-sectional view of an exemplary memory array, such as an SONONOS-NAND memory array, along the channel-length direction. Typically, Lg and Ls is approximately equal to F, which generally represents the critical dimension of a device (or node). The critical dimension may vary with the technologies used for fabrication. For example, F=50 nm stands for using a 50 nm node. FIG. 23b illustrates a cross-sectional view of an exemplary memory array, such as an SONONOS-NAND memory array, along the channel-width direction. Referring to FIG. 23b, the pitch in the channel-width direction is approximately equal or slightly larger than that in the channel length direction. Therefore, the size of a memory cell is approximately 4F2/cell.

In examples of manufacturing a memory array, such as the arrays noted above, the processes may involve using only two primary masks or lithography processes, such as one for the polysilicon (word line) and another for STI (bit lines). In contrast, the manufacturing of NAND-type floating gate devices may require at least two-poly processing and another inter-poly ONO processing. Accordingly, the structure and manufacturing processes of the proposed devices may be simpler than those of NAND-type floating gate memories.

Referring to FIG. 23a, in one example, the spaces (Ls) between word lines (WLs) may be formed with shallow junctions, such as shallow junctions of N+-doped regions, which may serve as source or drain regions of the memory devices. As illustrated in FIG. 23A, additional implantation and/or diffusion process, such as a tilt-angle pocket implantation, may be carried out to provide one or more "pocket" regions or pocket extensions of junctions that neighbor one or more of the shallow junction regions. In some examples, such configuration may provide better device characteristics.

In examples where STI is used of isolating separate memory devices, the trench depth of STI regions may be larger than the depletion width in p-well, especially when the junction bias used is raised higher. For example, the junction bias may be as high as about 7V for program inhibited bit line(s) (unselected bit line(s) during programming). In one example, the depth of STI regions may be in the range of about 200 to 400 nm.

Figure 24A:
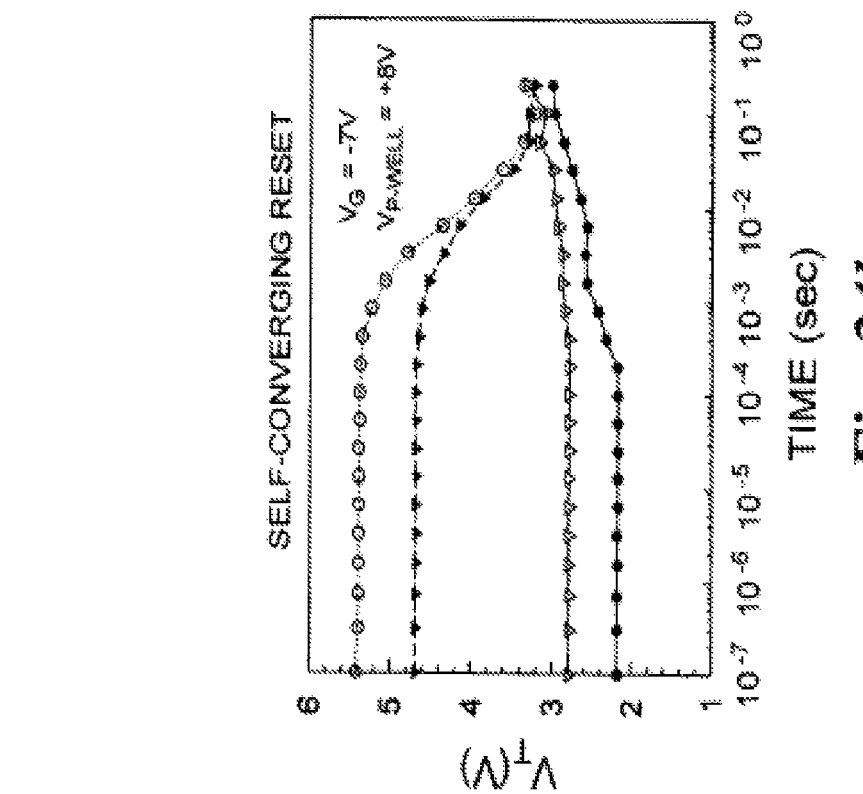
FIG. 24a is an equivalent circuit diagram of a NAND array in accordance with one embodiment of the present invention depicting one method of operation in accordance with the present invention.
Figure 24B:
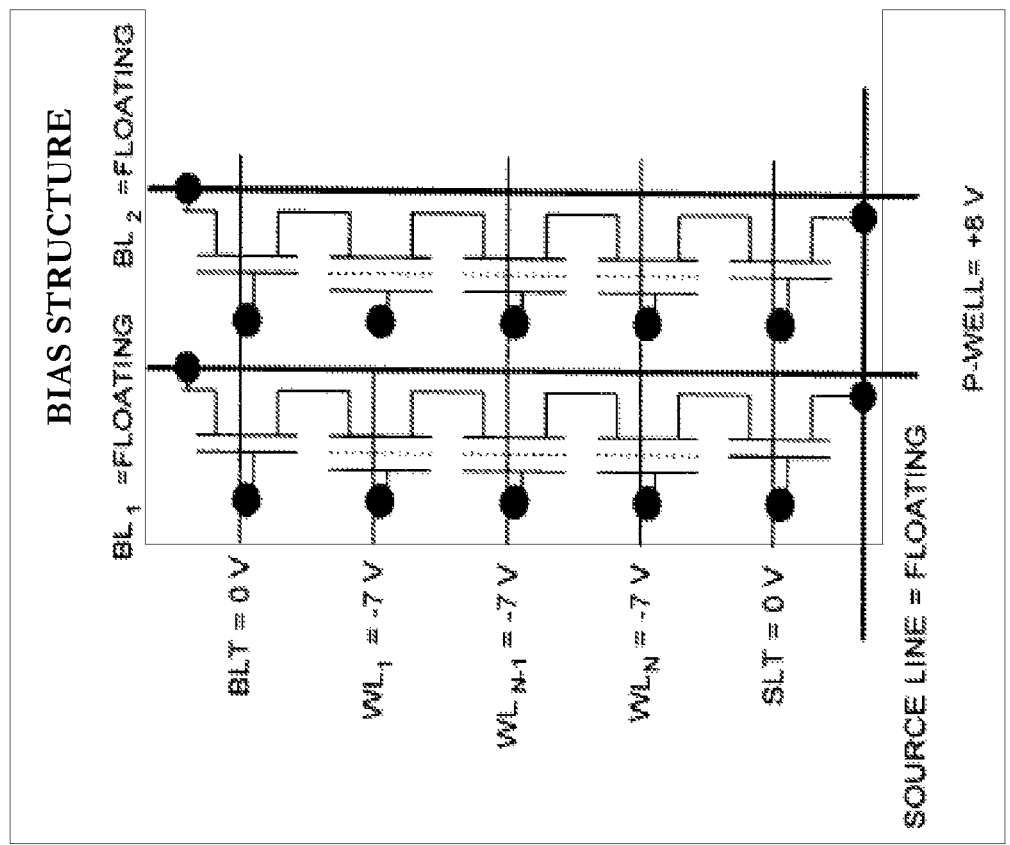
FIG. 24b is a graphical representation of threshold voltages over time during a reset operation in accordance with one embodiment of the present invention for two memory cells having different initial threshold voltages.

After a memory array is manufactured, a reset operation may be performed to tighten the Vt distribution first before other operations of the memory array. FIG. 24a illustrates an example of such operation. In one example, before other operations start, one may first apply VG=about −7 V and VP-well=+8 V to reset the array (The voltage drop of VG and VP-Well can be partitioned into the gate voltage into each WL and p-well). During RESET, the BL's can be floating, or raised to the same voltage as the P-Well. As illustrated in FIG. 24b, the reset operation may provide excellent self-convergent properties. In one example, even SONONOS devices are initially charged to various Vts, the reset operation can "tighten" them to a Reset/Erase state. In one example, the reset time is about 100 msec. In that example, the memory array may use n-channel SONONOS devices with ONONO=15/20/18/70/90 angstroms having an N+-polysilicon gate with Lg/W=0.22/0.6 μm.

Generally, traditionally floating-gate devices are not capable of providing self-converging erase. In contrast, SONONOS devices may be operated with converging Reset/Erase methods. In some examples, this operation may become essential because the initial Vt distribution is often in a wide range due to certain process issues, such as process non-uniformity or plasma charging effects. The exemplary self-converging "Reset" may help to tighten, or narrow the range of, the initial Vt distribution of memory devices.

In one example of programming operations, the selected WL may be applied with a high voltage, such as a voltage of about +16 V to +20 V, to induce channel +FN injection. Other PASS gates (other unselected WL's) may be turned on to induce the inversion layer in a NAND string. +FN programming may be a low-power method in some examples. In one example, parallel programming methods such as page programming with 4K Bytes cells in parallel can burst the programming throughput to more than 10 MB/sec, while the total current consumption can be controlled within 1 mA. In some examples, to avoid program disturb in other BLs, a high voltage, such as a voltage of about 7 V may be applied to other BLs so that the inversion layer potential is raised higher to suppress the voltage drop in the unselected BLs (such as cell B in FIG. 25).

In examples of read operations, the selected WL may be raised to a voltage that is between an erased state level (EV) and a programmed state level (PV). Other WLs may serve as the "PASS gates" so that their gate voltages may be raised a voltage higher than PV. In some examples, erase operations may be similar to the reset operation noted above, which may allow self-convergence to the same or similar reset Vt.

Figure 25:
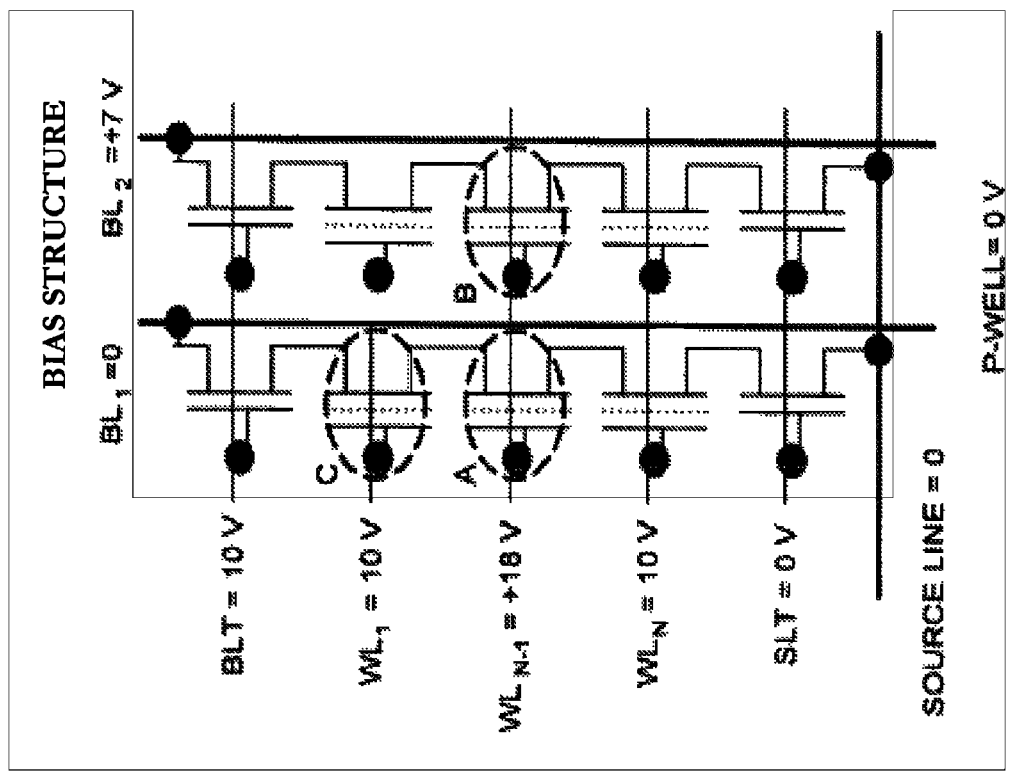
FIG. 25 is an equivalent circuit diagram depicting a method of operation in accordance with one embodiment of the present invention.

FIG. 25 illustrates an example of operating a memory array. Programming may include channel +FN injection of electrons into an SONONOS nitride trapping layer. Some examples may include applying Vg=about +18 V to the selected WLN-1, and applying VG=about +10 V to other WLs, as well as the BLT. The SLT can be turned off to avoid channel hot electron injection in cell B. In this example, because all the transistors in the NAND string are turned-on, the inversion layer passes through the strings. Furthermore, because BL1 is grounded, the inversion layer in BL1 has zero potential. On the other hand, other BLs are raised to a high potential, such as a voltage of about +7 V, so that the inversion layer of other BLs are higher.

In particular, for cell A, which is the cell selected for programming, the voltage drop is about +18 V, which causes +FN injection. And the Vt may be raised to PV. For cell B, the voltage drop is +11 V, causing much less +FN injection, as FN injection is sensitive to Vg. For cell C, only +10 V is applied, causing no or negligible +FN injection. In some examples, a programming operation is not limited to the technique illustrated. In other words, other adequate program inhibit techniques may be applied.

Figure 26:
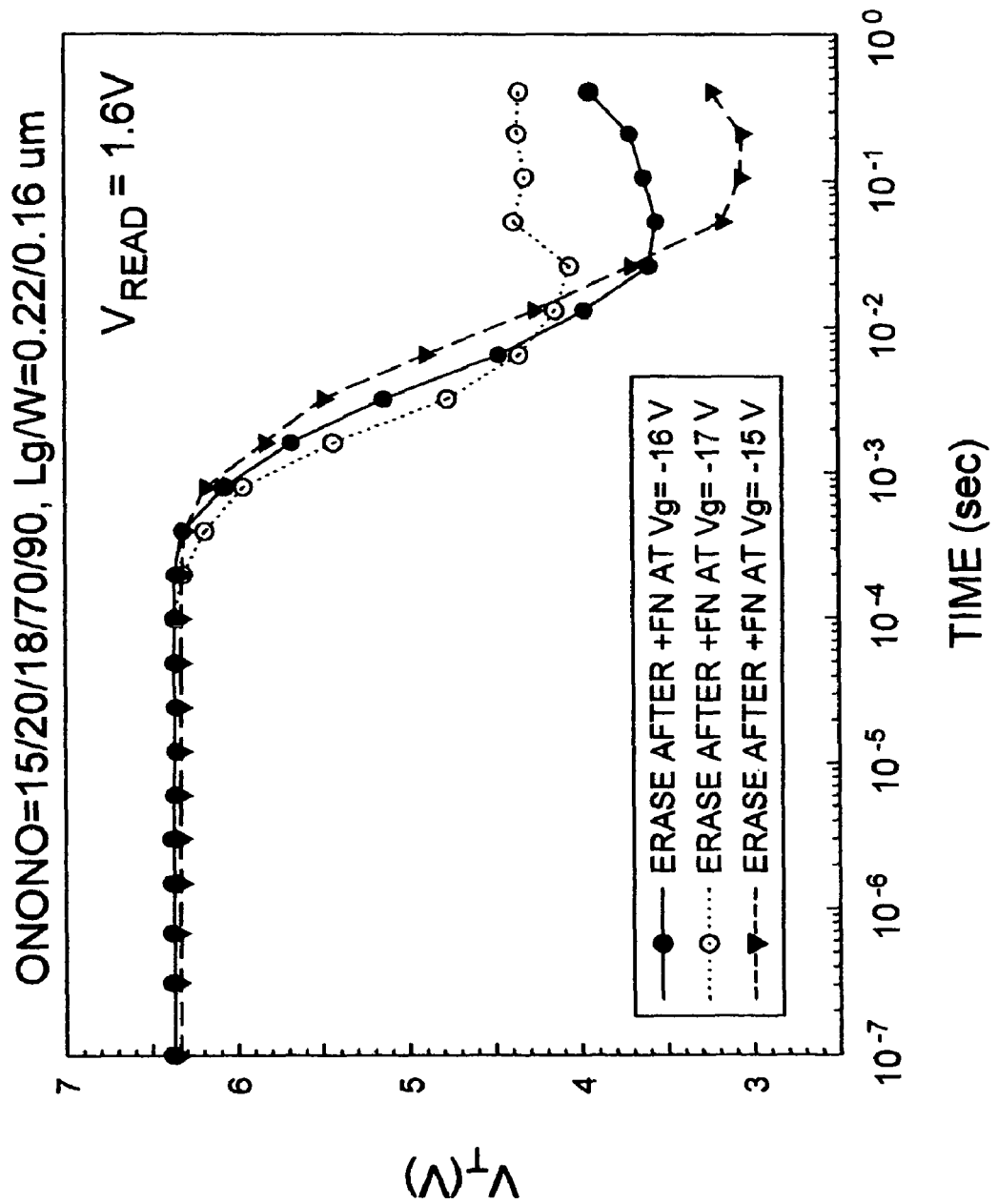
FIG. 26 is a graphical representation of the threshold voltage of a memory cell in accordance with one embodiment of the present invention over time under various erasing conditions.
Figure 27:
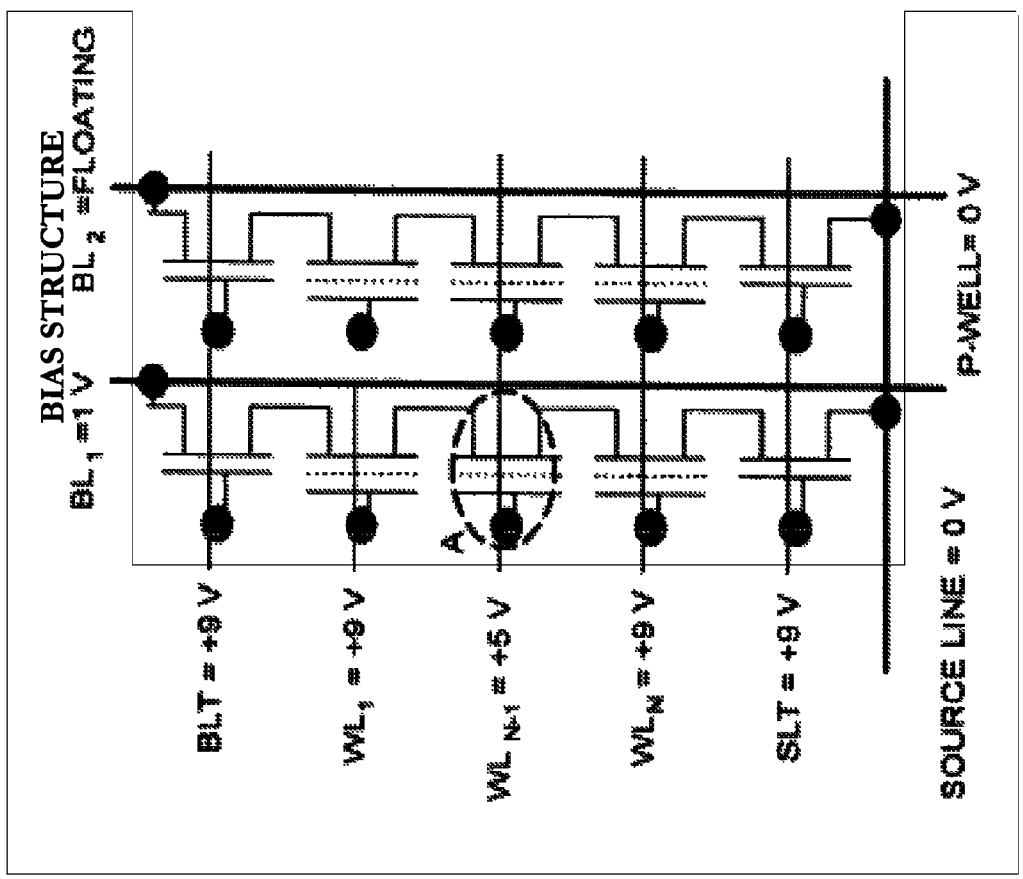
FIG. 27 is an equivalent circuit diagram depicting a method of operation in accordance with one embodiment of the present invention.

FIGS. 24a, 26, and 27 further illustrate some examples of array operations and illustrate the endurance and retention properties of some examples. As illustrated, the device degradation after a number of operation cycles may remain very small. FIG. 24A illustrates an exemplary erase operation, which may be similar to a reset operation. In one example, the erase is performed by sector or block. As noted above, the memory devices may have good self-converging erase property. In some examples, the erase saturation Vt may be dependent on Vg. For example, a higher Vg may cause a higher saturated Vt. As illustrated in FIG. 26, the convergent time may be around 10 to 100 msec.

FIG. 27 illustrates an exemplary reading operation. In one example, reading may be performed by applying a gate voltage that is between an erased state Vt (EV) and a programmed state Vt (PV). For example, the gate voltage may be about 5 V. On the other hand, other WLs and BLT and SLT are applied with a higher gate voltage, such as a voltage of about +9 V, to turn-on all the other memory cells. In one example, if Vt of cell A is higher than 5 V, the read current may be very small (<0.1 uA). If Vt of cell A is lower than 5 V, the read current may be higher (>0.1 uA). As a result, the memory state, i.e. the stored information, can be identified.

In some examples, the pass gate voltage for other WLs should be higher than the high-Vt state or the programmed state Vt, but not too high to trigger gate disturb. In one example, the PASS voltage is in the range of about 7 to 10 V. The applied voltage at the BL may be about 1 V. Although a larger read voltage may induce more current, the read disturb may become more apparent in some examples. In some examples, the sensing amplifier can be either placed on a source line (source sensing) or on a bit line (drain sensing).

Some examples of NAND strings may have 8, 16, or 32 memory devices per string. A larger NAND string may save more overhead and increase array efficiency. However, in some examples, the read current may be smaller and disturb may become more apparent. Therefore, adequate numbers of NAND string should be chosen based on various design, manufacture, and operation factors.

Figure 28:
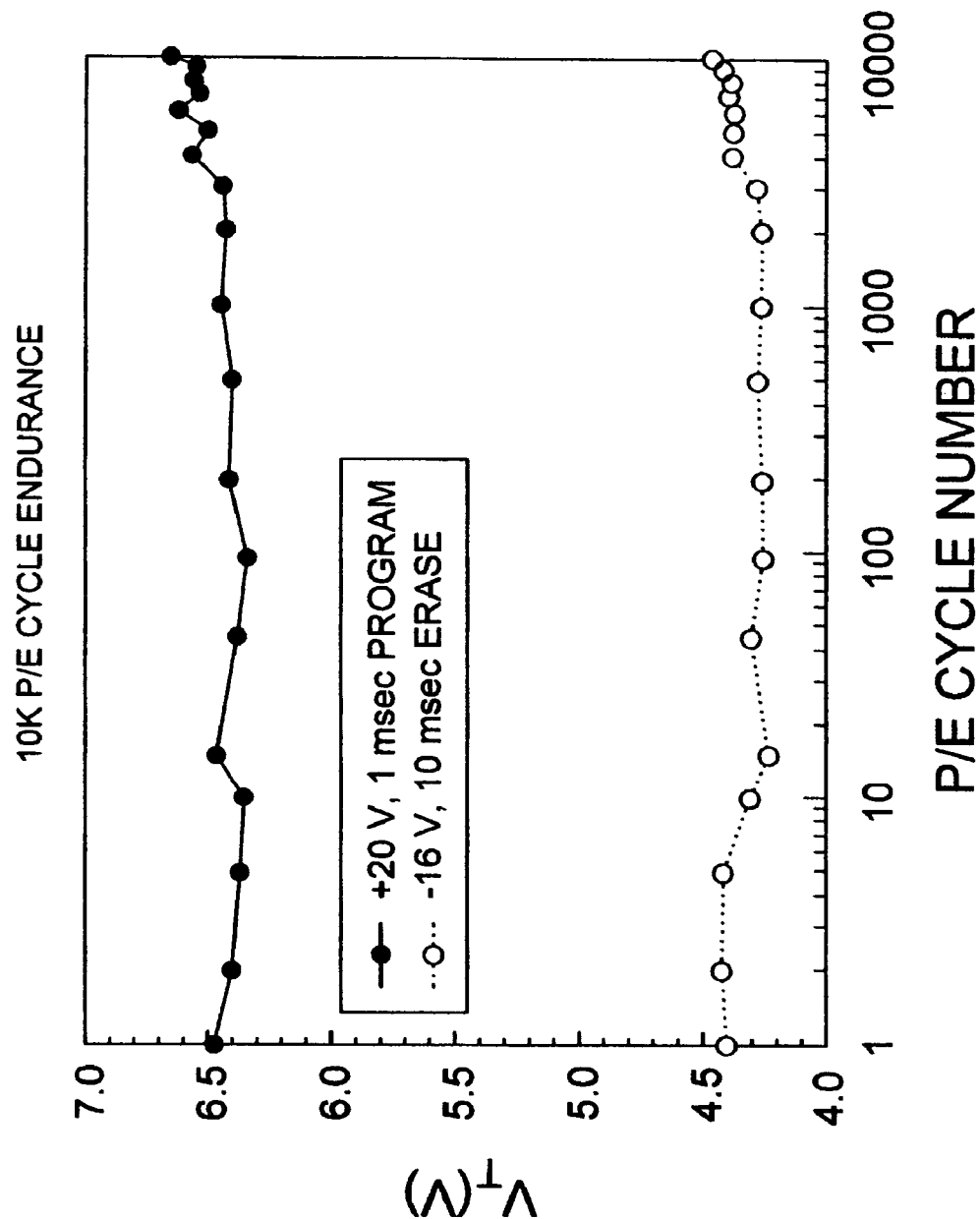
FIG. 28 is a graphical representation of the threshold voltage of a memory cell in accordance with one embodiment of the present invention over the course of numerous programs/ erase cycles under one set of programming and erasing conditions

FIG. 28 illustrates the cycle endurance of certain exemplary devices. Referring to FIG. 28, P/E cycles with +FN program and −FN erase may be carried out, and the results suggest good endurance characteristics. In this example, the erase condition is Vg=about −16 V for 10 msec. In some examples, only single shot of erase is needed and verification of status is not necessary. The memory Vt window is good without degradation.

Figure 29B:
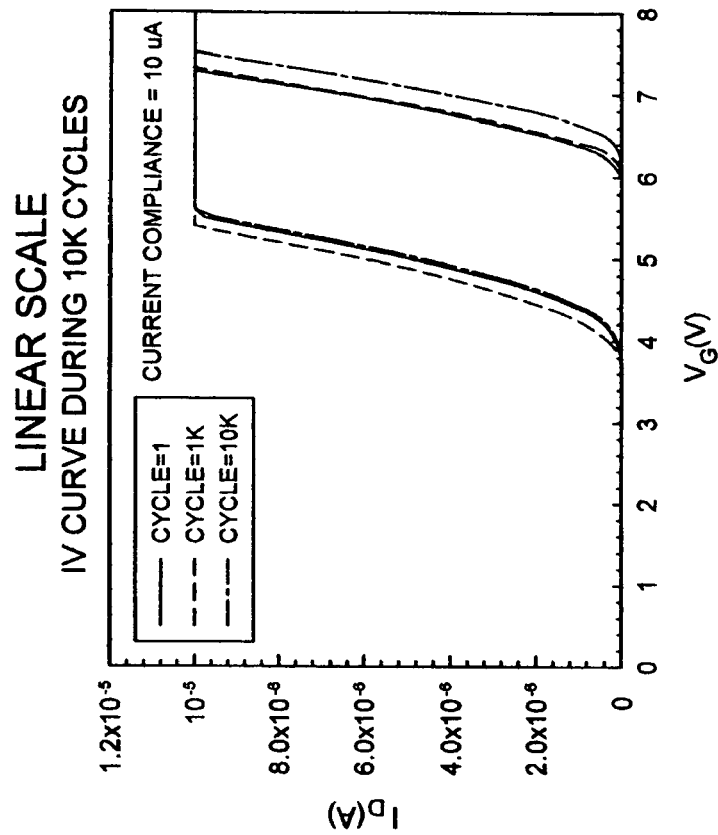
FIGS. 29a and 29b are graphical representations of the current at the drain of a memory cell in accordance with one embodiment under various gate voltages at three different cycle numbers depicted in a logarithmic scale and a linear scale, respectively
Figure 29A:
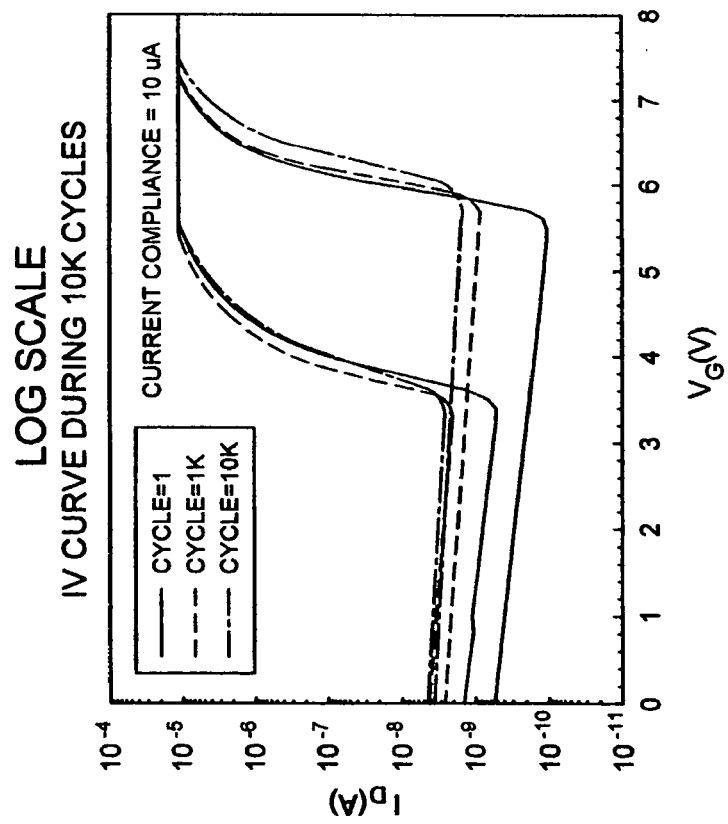
Figure 30:
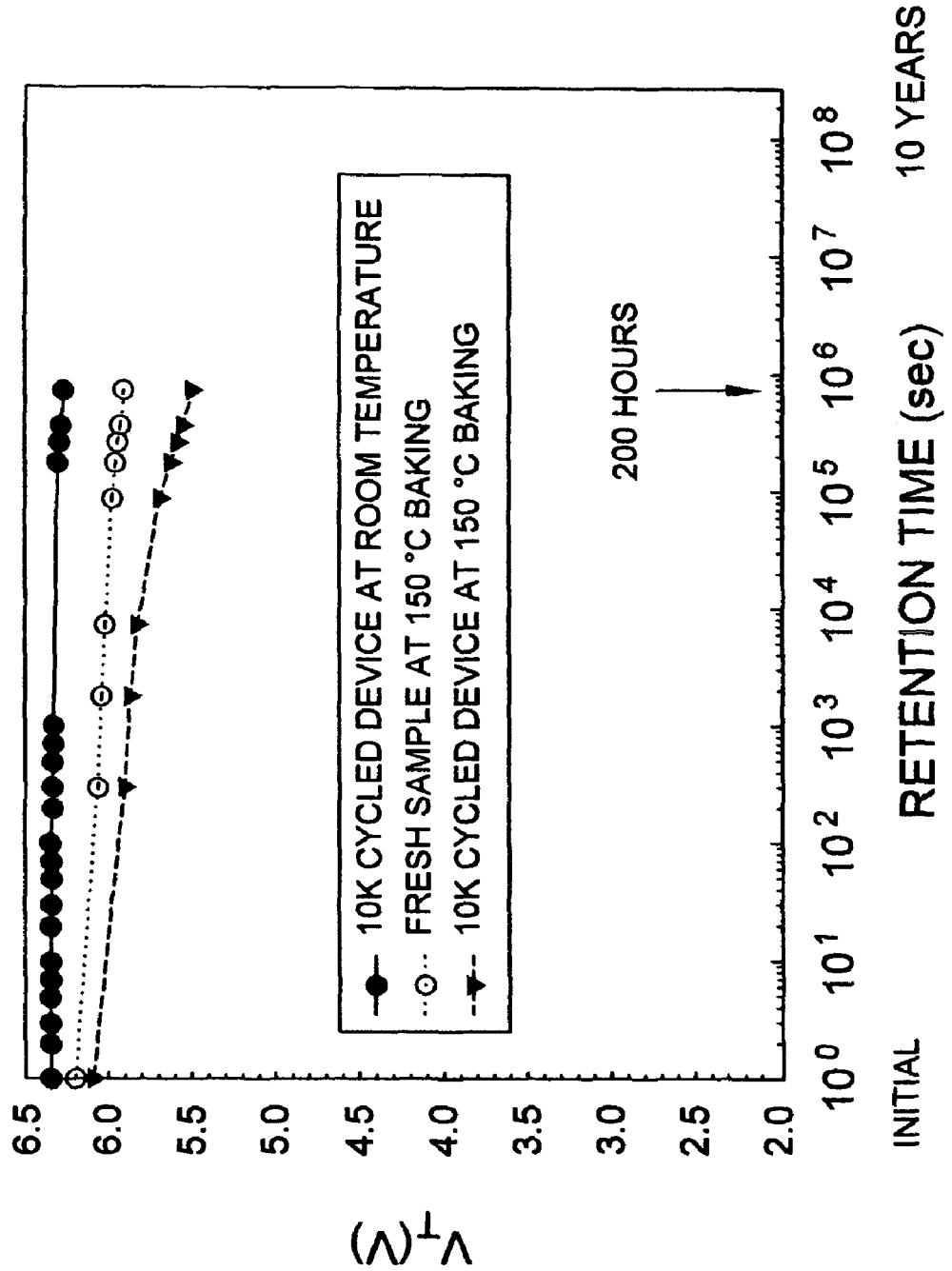
FIG. 30 is a graphical representation of the threshold voltage of memory cells in accordance with one embodiment of the present invention over time during retention at three different temperature and cycle conditions.

FIGS. 29a and 29b illustrate the IV characteristics of exemplary memory devices using different scales. In particular, FIG. 29a illustrates a small swing degradation of the device, and FIG. 29b illustrates a small gm degradation of the device. FIG. 30 illustrates the retention characteristics of an exemplary SONONOS device. Referring to FIG. 30, a good retention is provided by having less than 100 mV charge loss for device operated after 10K cycles and after leaving for 200 hours at room temperature. FIG. 30 also illustrates an acceptable charge loss at high temperatures.

Figure 31:
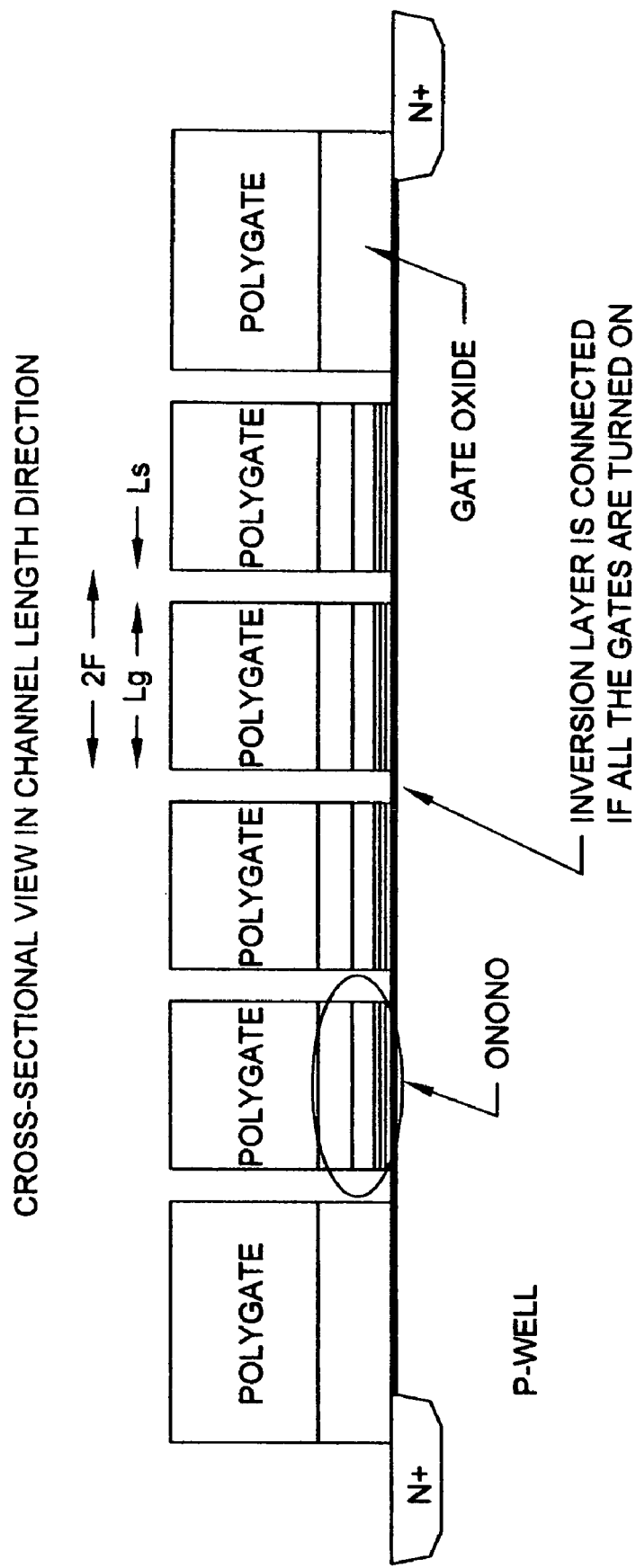
FIG. 31 is a cross-sectional schematic representation of a NAND array wordline in accordance with one embodiment of the present invention.

In some examples, a split-gate design, such as a split-gate SONONOS-NAND design, may be used to achieve a more aggressive down-scaling of a memory array. FIG. 31 illustrates an example of using such design. Referring to FIG. 31, the spaces (Ls) between each word line, or between two neighboring memory devices sharing the same bit line, may be reduced. In one example, Ls may be shrunk to about or less than 30 nm. As illustrated, the memory devices using a split-gate design along the same bit line may share only one source region and one drain region. In other words, a split-gate SONONOS-NAND array may use no diffusion regions or junctions, such as N+-doped regions, for some of the memory devices. In one example, the design may also reduce or eliminate the need for shallow junctions and neighboring "pockets", which in some examples may involve a more complicated manufacturing process. Furthermore, in some examples, the design is less affected by short-channel effects, because the channel length has been increased, such as increased to Lg=2F-Ls in one example.

Figure 32:
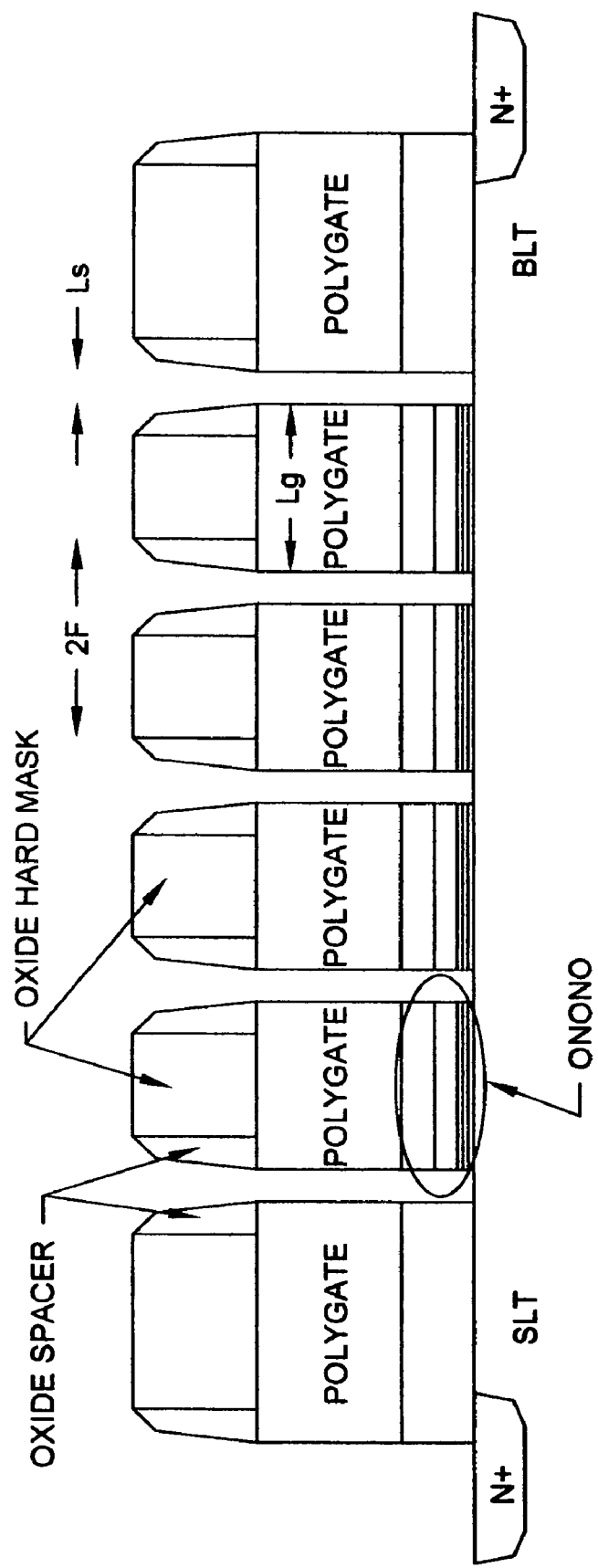
FIG. 32 is a cross-sectional schematic representation of a NAND array wordline formation technique in accordance with one embodiment of the present invention.

FIG. 32 illustrates an exemplary manufacturing process of a memory array using a split-gate design. The schematic diagram is merely an illustrative example, and the memory array may be designed and manufactured in various different ways. Referring to FIG. 32, after multiple layers of materials for providing the memory devices are formed, those layers may be patterned using a silicon oxide structure as a hard mask formed over those layers. For example, the silicon oxide regions may be defined by lithography and etching processes. In one example, the pattern used for defining the initial silicon oxide regions may have a width of about F and the space between the silicon oxide regions of about F, resulting a pitch of about 2F. After the initial silicon oxide regions are patterned, silicon oxide spacers may then be formed surrounding the patterned regions to enlarge each silicon oxide region and narrow their spacing.

Referring again to FIG. 32, after the silicon oxide regions are formed, they are used as a hard mask to define or pattern their underlying layers to provide one or more memory devices, such as multiple NAND strings. In addition, insulating materials, such as silicon oxide, may be used to fill in the spaces, such as Ls spaces shown in FIG. 32, between the neighboring memory devices.

In one example, the space Ls between neighboring memory devices along the same bit line may be in the range of about 15 nm to about 30 nm. As noted above, the effective channel length may be enlarged to 2F-Ls in this example. In one example, if F is about 30 nm and Ls is about 15 nm, Leff is about 45 nm. For the operation of those exemplary memory devices, the gate voltage may be reduced to below 15 V. In addition, the inter-polysilicon voltage drop between word lines may be designed to be no larger than 7V to avoid breakdown of the spacers in the Ls spaces. In one example, this may be achieved by having an electric field of less than 5 MV/cm between neighboring word lines.

The Leff with diffusion junctions for conventional NAND floating-gate devices is about half of the their gate length. In contrast, if F is about 50 nm and Leff is about 30 nm, Leff is about 80 nm for the proposed design (the split-gate NAND) in one example. The longer Leff can provide better device characteristics by reducing or eliminating the impact of short-channel effects.

As illustrated above, a split-gate NAND design may further shrink the space (Ls) between neighboring memory cells of the same bit line. In contrast, traditional NAND-type floating-gate devices may not provide a small spacing, because inter-floating-gate coupling effect may lose the memory window The inter-floating gate coupling is the interference between adjacent memory cells when the coupling capacitance between adjacent floating gate is high (the space between the floating gates is small so that the coupling capacitance between the adjacent floating gates becomes very high such that read disturb happens). As noted above, the design may eliminate the need to fabricate certain diffusion junctions, and the inversion layer can be directly connected if all the word lines are turned on. Therefore, the design may simplify the manufacturing process of memory devices.

A multi-layer SONOS device is described using and ultra-thin ONO tunneling dielectric. With an n+ polysilicon gate, a self-convergent positive erase threshold voltage of for example about +3 V is achieved suitable for a NOR architecture, in which channel hot electron programming can be applied for storing two-bits per cell, read using the standard reverse read method, and erased with hole tunneling erase apply electric field assisted FN tunneling with a gate voltage of for example −15 volts. With a p+ polysilicon (or other high work function material) gate, a depletion mode device can be obtained having an erase threshold voltage less than zero, with a very large memory window with a program threshold voltage over about 6 volts can be achieved, suitable for NAND architecture using electric field assisted FN electron tunneling for program and electric field assisted FN hole tunneling for erase operations, with a gate voltage during erasing of for example −18 Volts.

Figure 33:
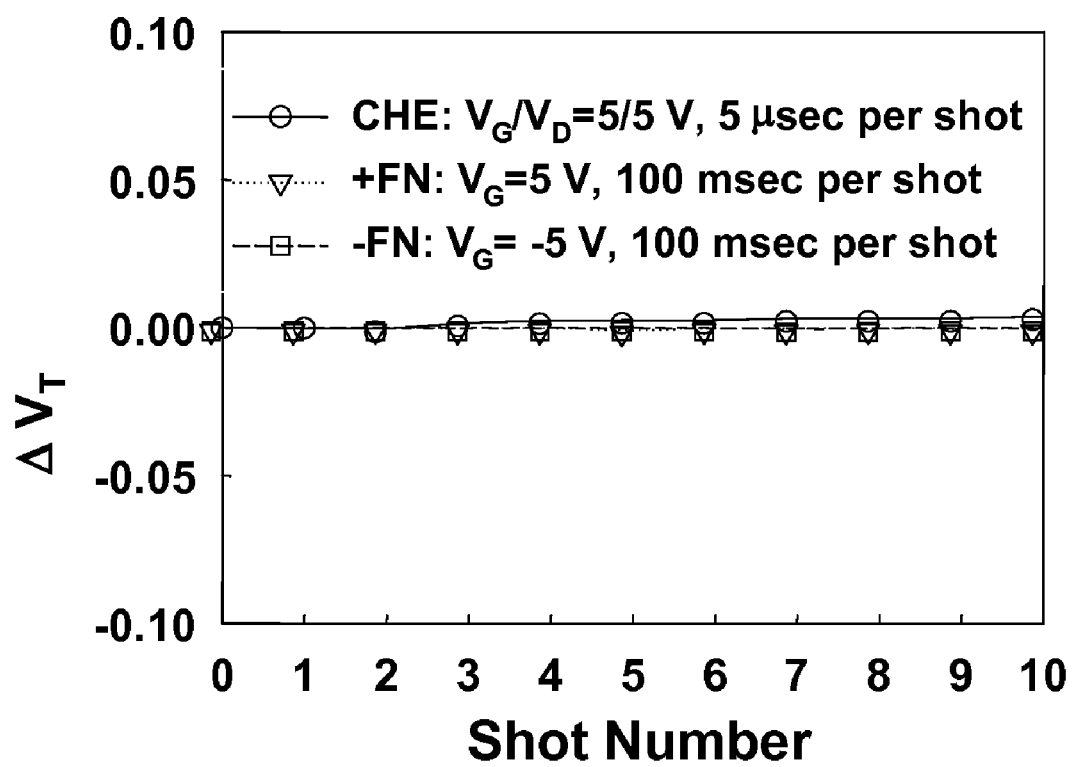
FIG. 33 is a graph of the change in threshold voltage versus the number of programming pulses for an nMOSFET having an ONO tunneling dielectric for a number of programming bias arrangements.

FIG. 33 is a graph of change in threshold voltage of a MOSFET having an ultra-thin multi layer gate dielectric (O1/N1/O2=15/20/18 Angstroms) versus an number of shots of program disturb bias pulses or erase disturb bias pulses showing negligible charge trapping in the ONO gate dielectric regardless of the injection mode CHE, +FN, —FN in an exemplary device with a tunneling dielectric.

Figure 34:
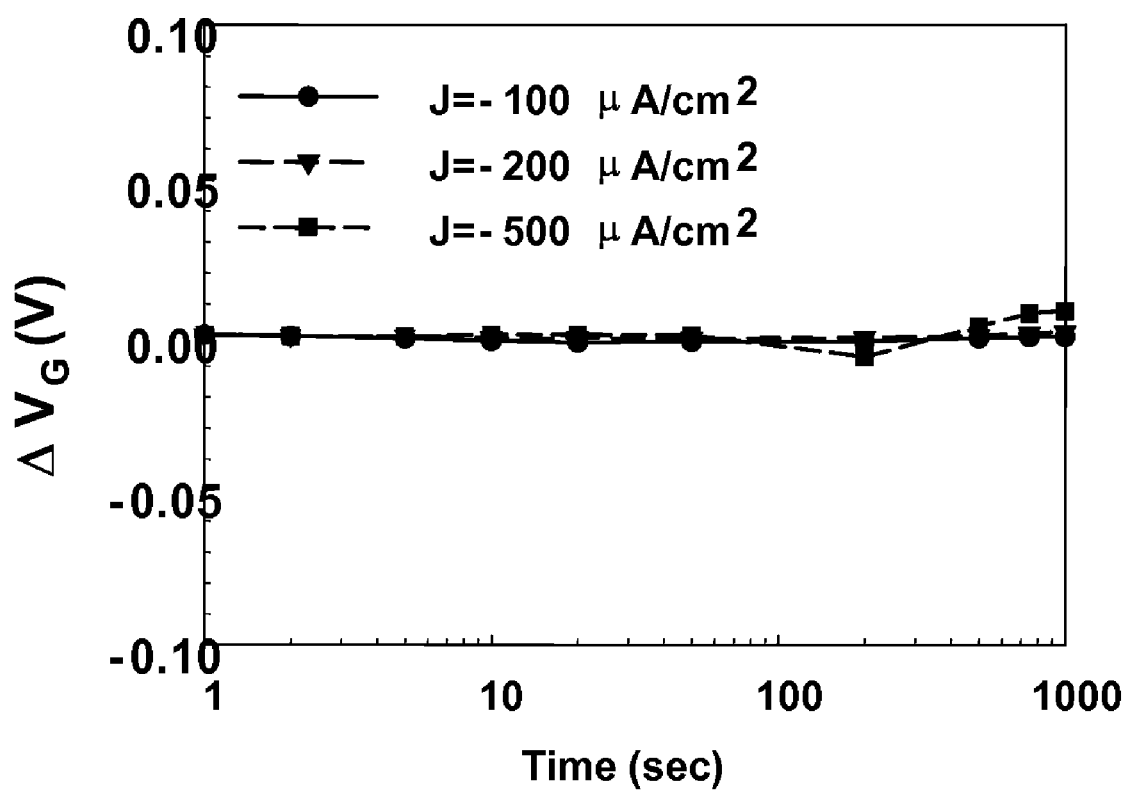
FIG. 34 a graph of the change in voltage versus time under negative current stress for a capacitor having an ONO tunneling dielectric insulator.

FIG. 34 is a graph of change in gate voltage versus time under constant current stress in an ultra-thin ONO (O1/N1/O2=15/20/18) dielectric capacitor, demonstrating small charge trapping under negative gate current stress and indicating excellent stress tolerance. The small trapping efficiency may be due to that the capture mean free path is much longer than the nitride thickness of about 20 Angstroms. This suggests that the N1 layer less than 20 Angstroms is desirable. In addition, no interfacial traps between O1/N1 and N1/O2 are introduced during processing in preferred embodiments.

Figure 35:
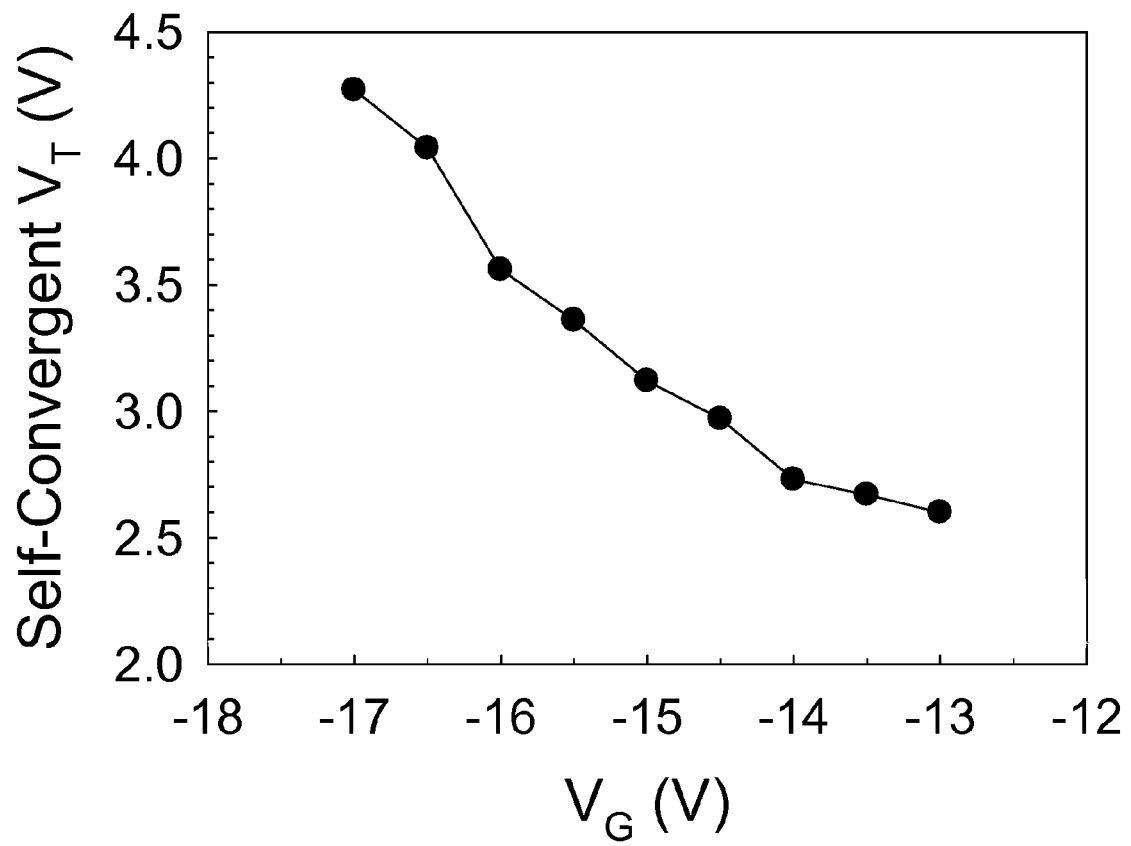
FIG. 35 is a graph of the self-convergent threshold voltage versus of erase gate voltage.

FIG. 35 is a graph of the self-convergent threshold voltage $V_T$ as a function of erase gate voltage $V_G$ during the erase process of a device having an ultra-thin multi layer tunnel dielectric (O1/N1/O2=15/20/18 Angstroms) and having an N+-poly gate. A larger magnitude gate voltage $V_G$ results in a higher saturation value of $V_T$ because gate injection is stronger. A high self-convergent erase is desirable in NOR architectures, because it avoids over-erase problems.

Figure 36:
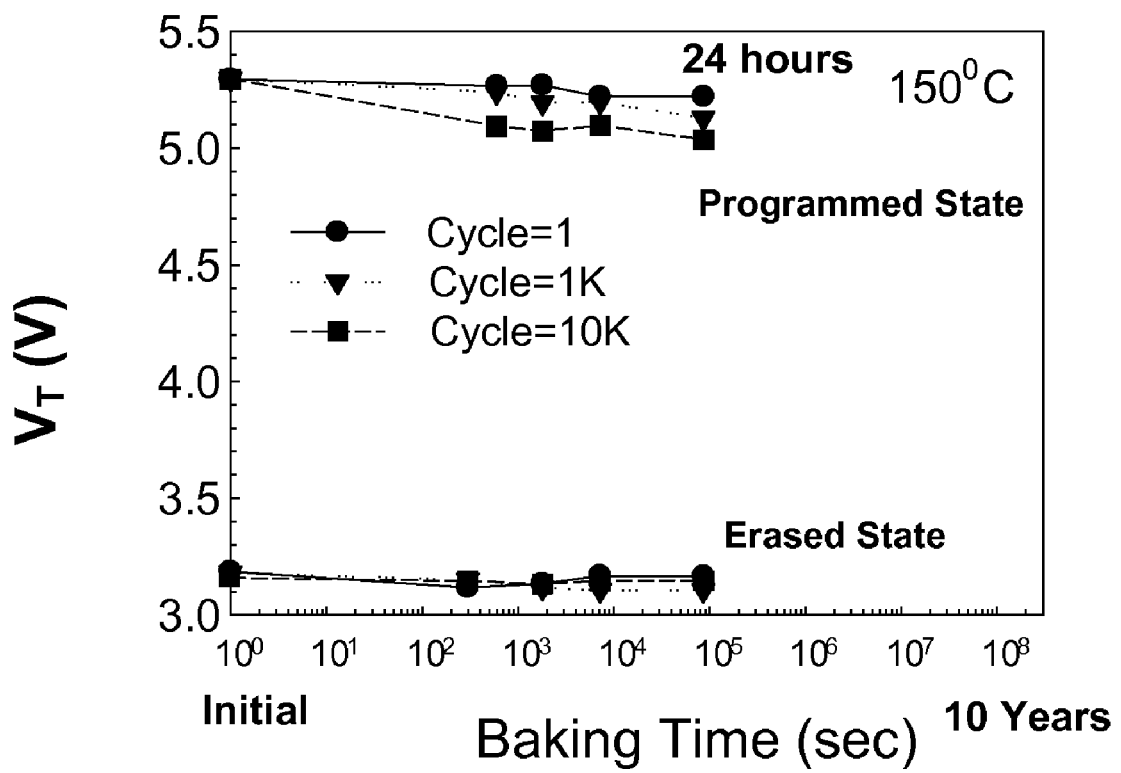
FIG. 36 illustrates endurance of a memory cell as described herein, with high-temperature baking of a device in accordance with an embodiment.

FIG. 36 is a graph of threshold voltage versus baking time, for the exemplary device having an N+-poly gate at various P/E cycle counts, for both erase state and programmed state cells, showing excellent electron retention for the multi-layer BE-SONOS device.

Figure 37:
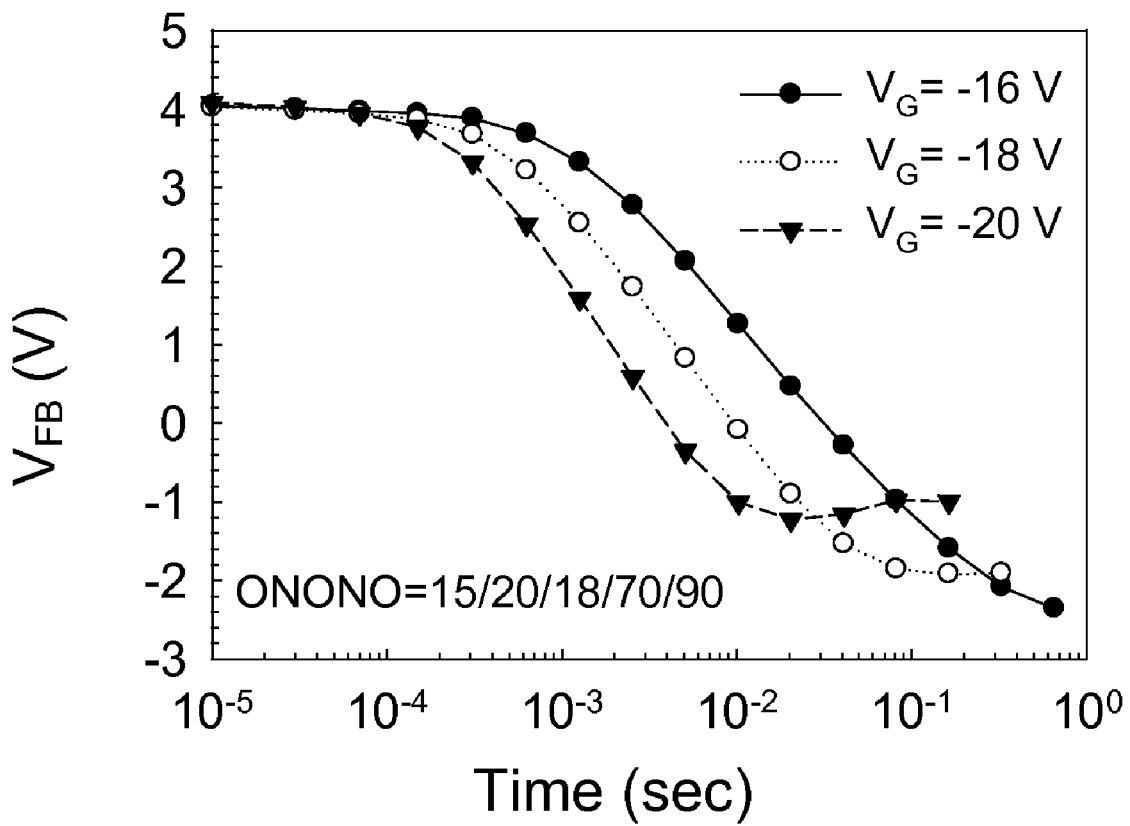
FIG. 37 illustrates change in flat band voltage versus erase time for −FN programming bias levels in a device in accordance with an embodiment.

For NAND applications, a depletion mode device ($V_T$<0) for the erased state is desired. By using a P+-poly gate, the gate injection is reduced and the device can be erased into depletion mode as shown in FIG. 37. FIG. 37 is a graph of flat band voltage versus time for a multi-layer cell (ONONO=15/20/18/70/90 Angstroms) showing that the erase time decreases with a higher magnitude negative gate voltage.

FIG. 37 also illustrates that at larger $V_G$ (e.g. about −20 volts), gate injection becomes significant, resulting in erase saturation at around −1 Volts.

Figure 38:
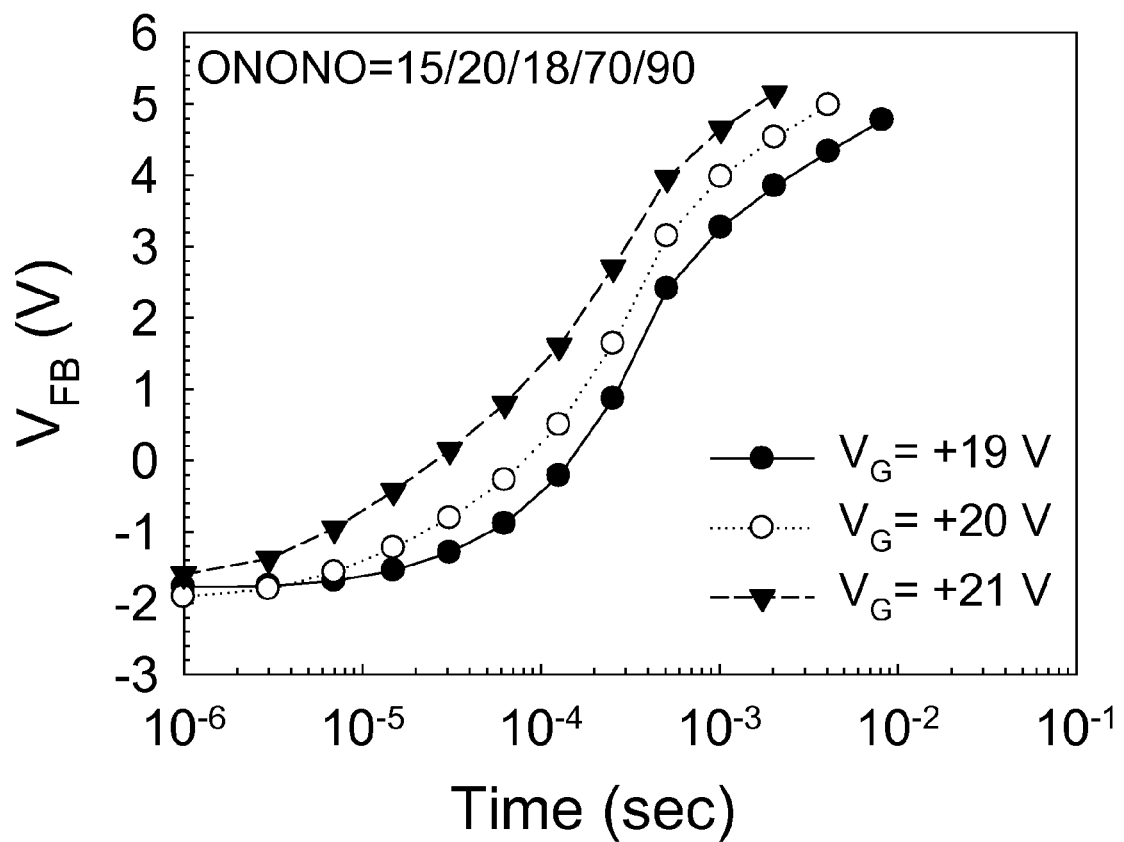
FIG. 38 illustrates change in flat band voltage versus program time for +FN programming bias levels in a device in accordance with an embodiment.

FIG. 38 is a graph of flat band voltage versus time for +FN programming characteristics at $V_G$ equal to +19, +20 and +21 volts, for an exemplary device having a P+-poly gate and an ONONO=15/20/18/70/90 Angstroms. As illustrated in FIG. 38, a large memory window (as much as about 7 V in this graph) can be obtained within 10 msec and a 3 V memory window can be achieved in less than 200 μm.

Figure 39:
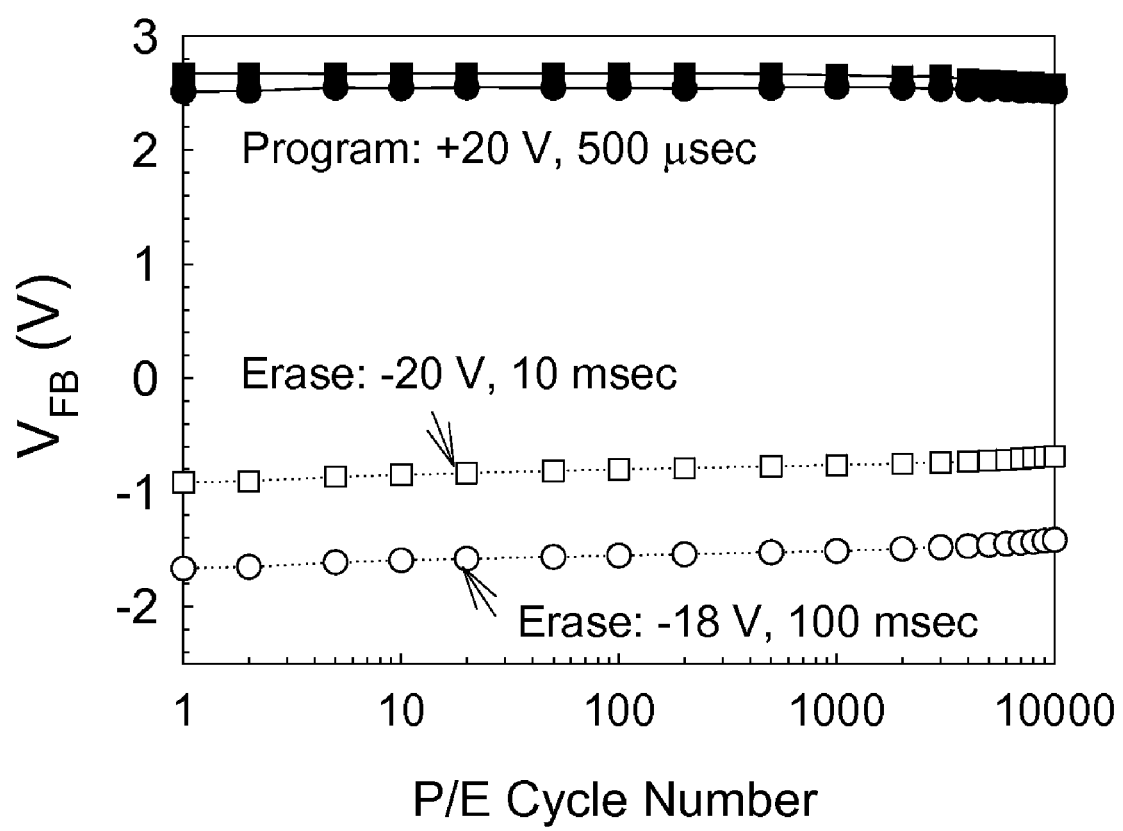
FIG. 39 illustrates the P/E cycle endurance of a device in accordance with an embodiment.

FIG. 39 is a graph of flat band voltage versus program/erase cycle number, for a program pulse of +20 volts for 500 micro seconds per cycle, and erase pulse of −20 volts for 10 msec per cycle or −18 volts for 100 msec per cycle, illustrating the P/E cycle endurance of an exemplary device having a P+-poly gate, showing excellent cycling endurance. In FIG. 39 a one-shot program and a one-shot erase was used during each P/E cycle.

Figure 40:
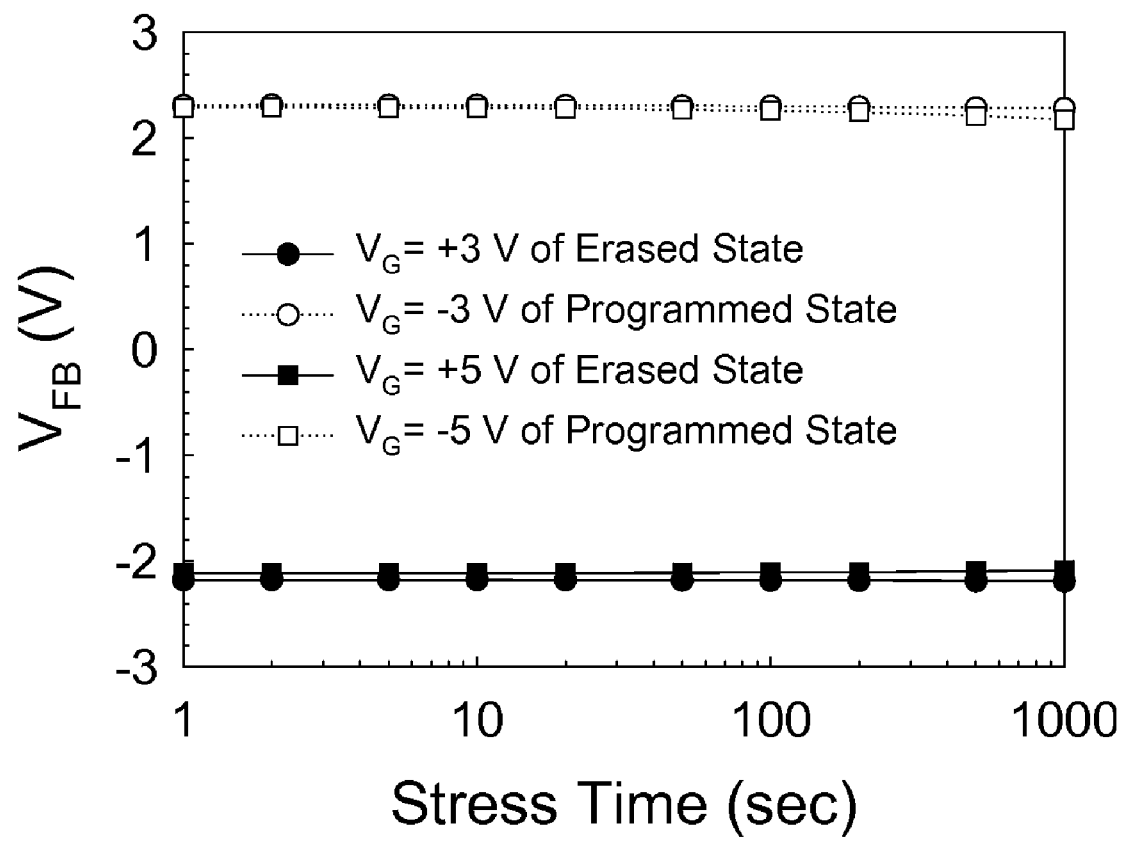
FIG. 40 illustrates an accelerated retention test of a device in accordance with an embodiment.

FIG. 40 is a graph of flat band voltage versus stress time, illustrating a $V_G$ accelerated retention test with −$V_G$ applied for programmed state and +$V_G$ for erased state of the exemplary device having a P+-poly gate. As illustrated in FIG. 40, the small charge loss and small charge gain indicate that the direct tunneling is suppressed at medium electric field (<4 MV/cm).

Figure 41:
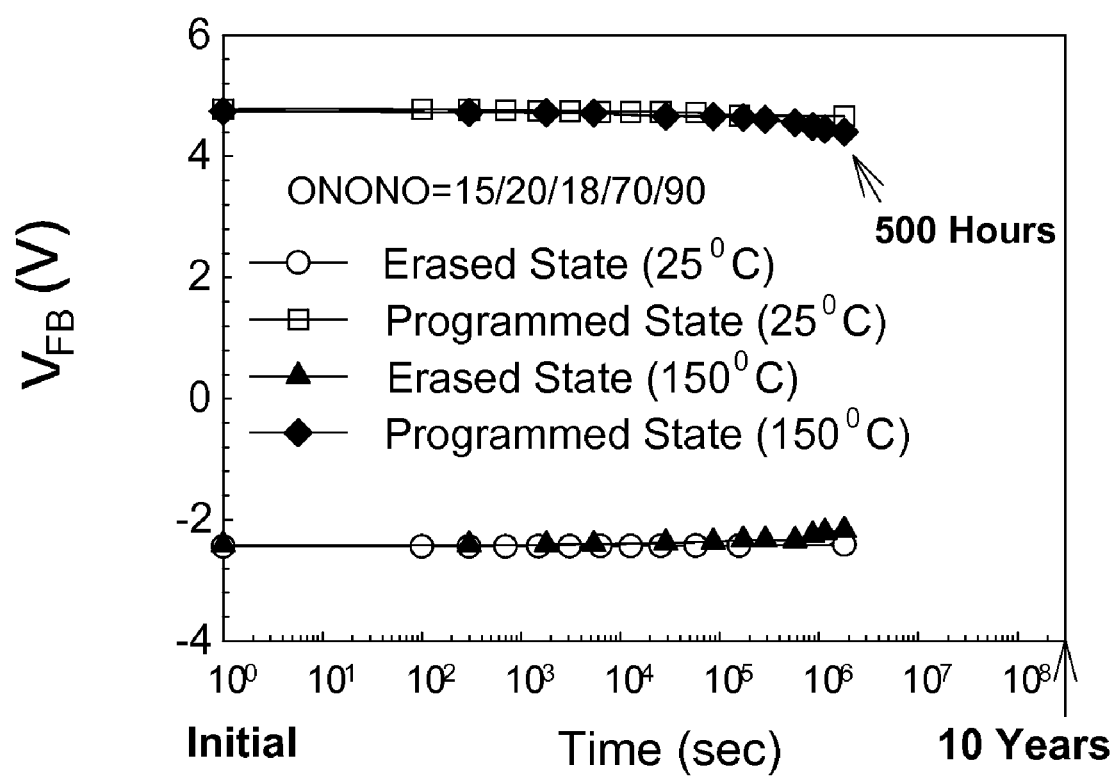
FIG. 41 illustrates the charge retention in the charge trapping nitride N2 at room temperature and high temperature of a device in accordance with an embodiment.

FIG. 41 is a graph of flat band voltage versus time, illustrating charge retention in the charge trapping nitride N2 at room temperature and at high temperature of an exemplary device having a P+-poly gate in accordance with an embodiment. As can be seen in FIG. 41, the charge loss and charge gain are negligible at room temperature. Additionally, more than a 6 V memory window can be preserved even after 500 hours of 150° C. baking. The large memory window greater than 6 volts, and the excellent retention are the best known results for SONOS type devices.

Figure 42:
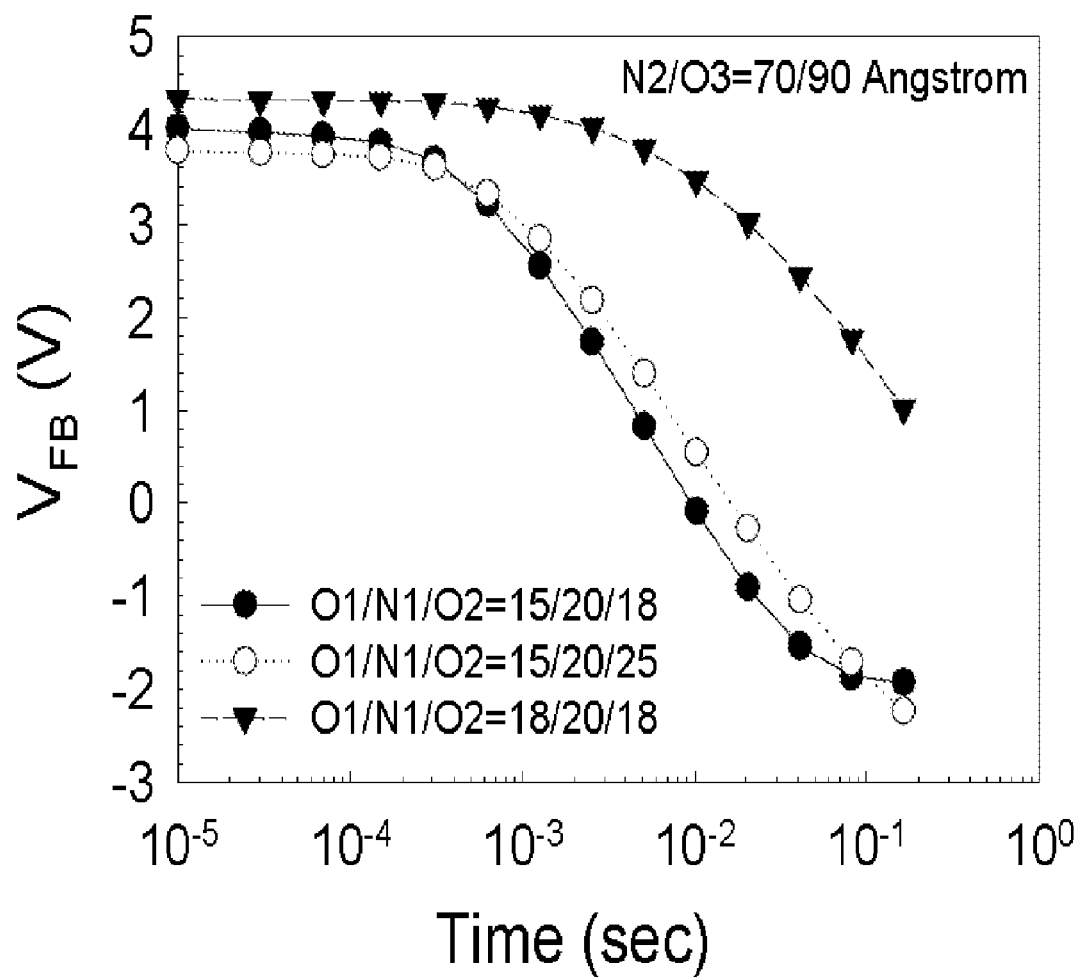
FIG. 42 illustrates the erase characteristics of devices of varying dimensions in accordance with embodiments.

FIG. 42 is a graph of flat band voltage versus time for an erase process in a ONONO device with N2 and O3 layers at 70 and 90 Angstroms respectively, and the O1, N1 and O2 layers at 15/20/18, 15/20/25 and 18/20/18, illustrating that the erase speed of BE-SONOS devices improves significantly with the O1 layer thicknesses less than 20 Angstroms, specifically in this example at 18 Angstroms or 15 Angstroms. In fact, with O1 at 15 Angstroms, the erase speed improves substantially, making erase speeds less than 100 milliseconds and less than 10 milliseconds achievable. For a 15 Angstrom O1 layer, more than 3 volts reduction in flat band voltage (which correlates closely with change in threshold voltage) is accomplished in less than 10 milliseconds. As can be seen in FIG. 42, the erase speed is very sensitive to changes in O1. As can be seen in FIG. 42, a decrease in O1 thickness from 18 Angstroms to 15 Angstroms results in a dramatic decrease in erase time. Changes in the thickness of O2 generally have a much smaller effect on erase speed. This is because the ONO tunneling is dominated by the O1 layer, while the O2 layer is either almost screened (as shown in FIG. 5c) or is completely screened (as shown in FIG. 5d) during an erase bias operation.

Figure 43:
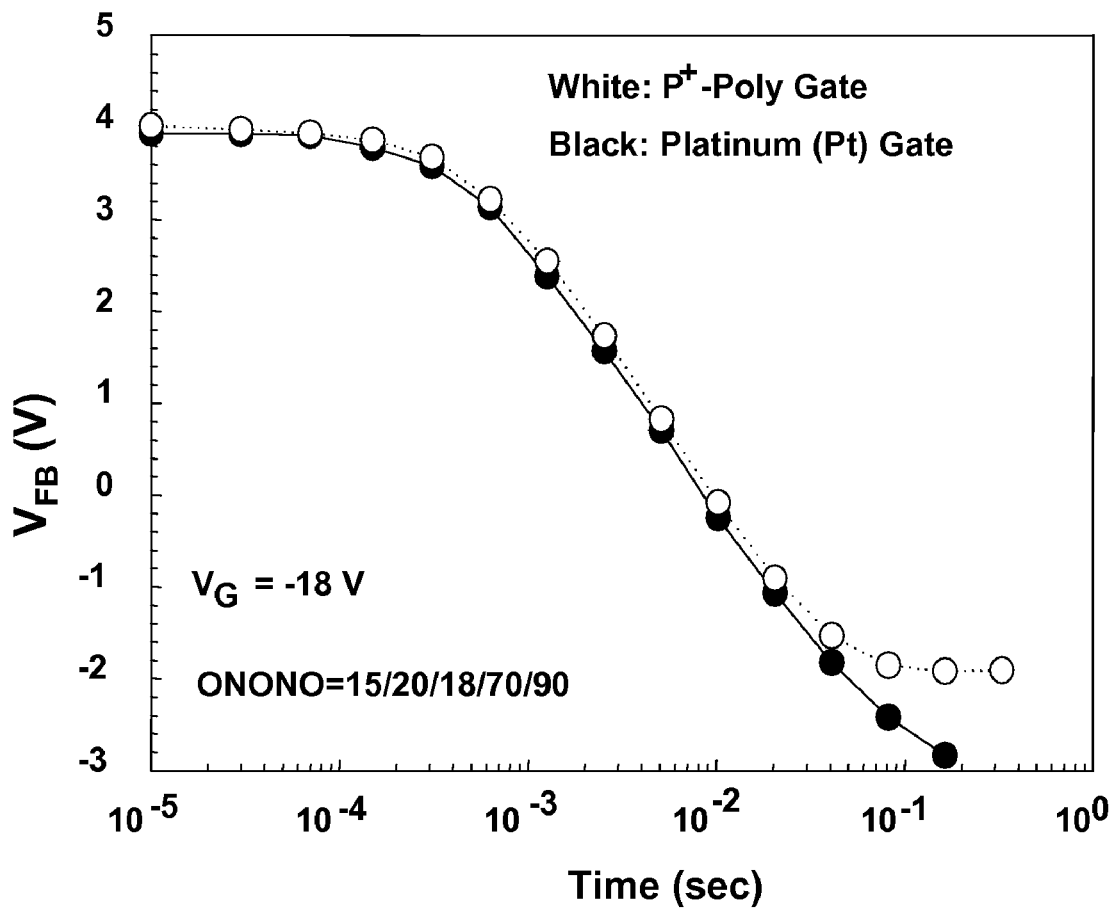
FIG. 43 illustrates the erase characteristics of devices of various gate material in accordance with embodiments.
Figure 44:
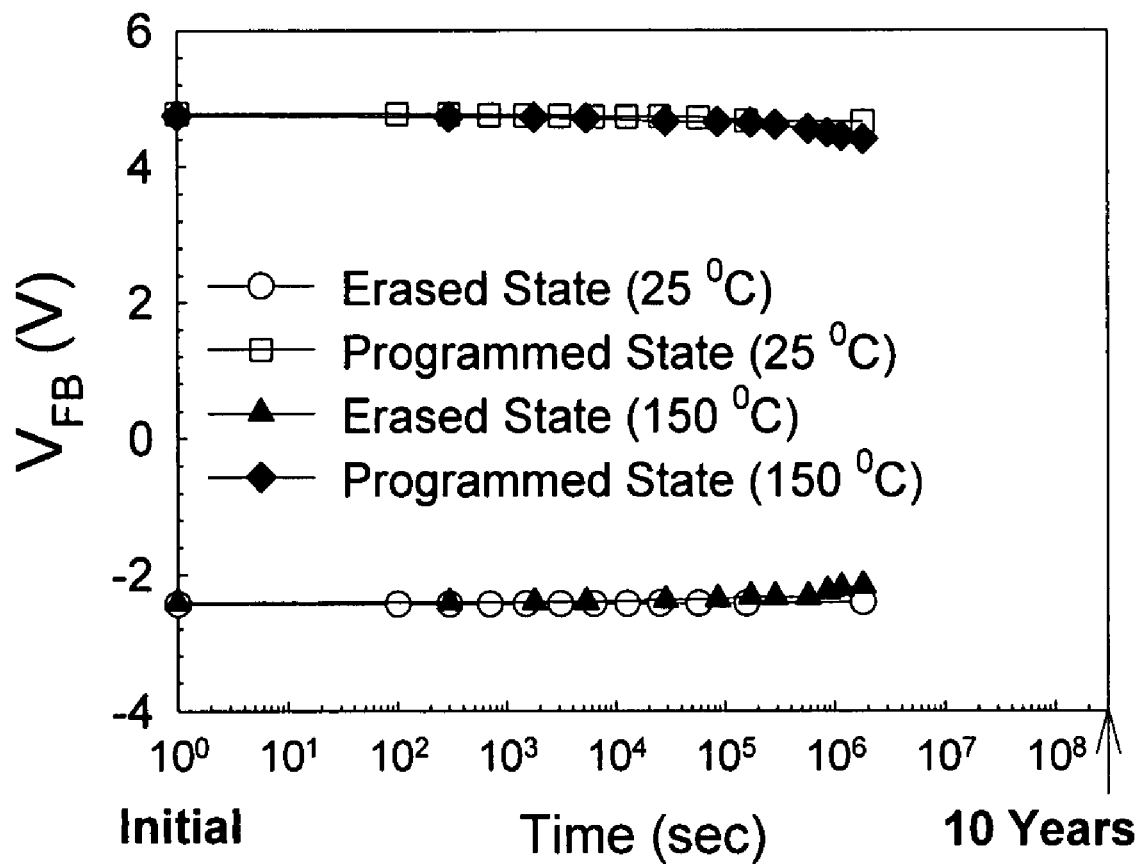
Figure 45:
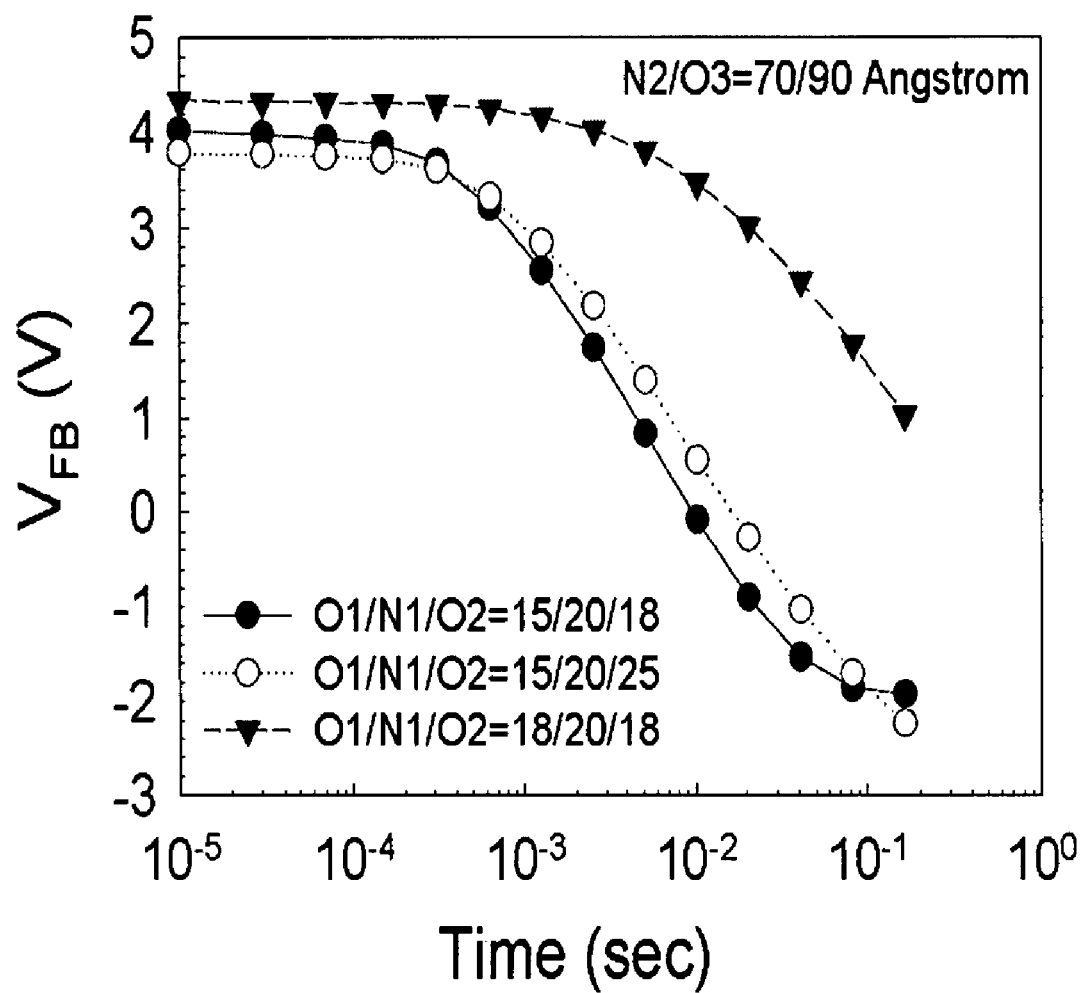
Figure 46:
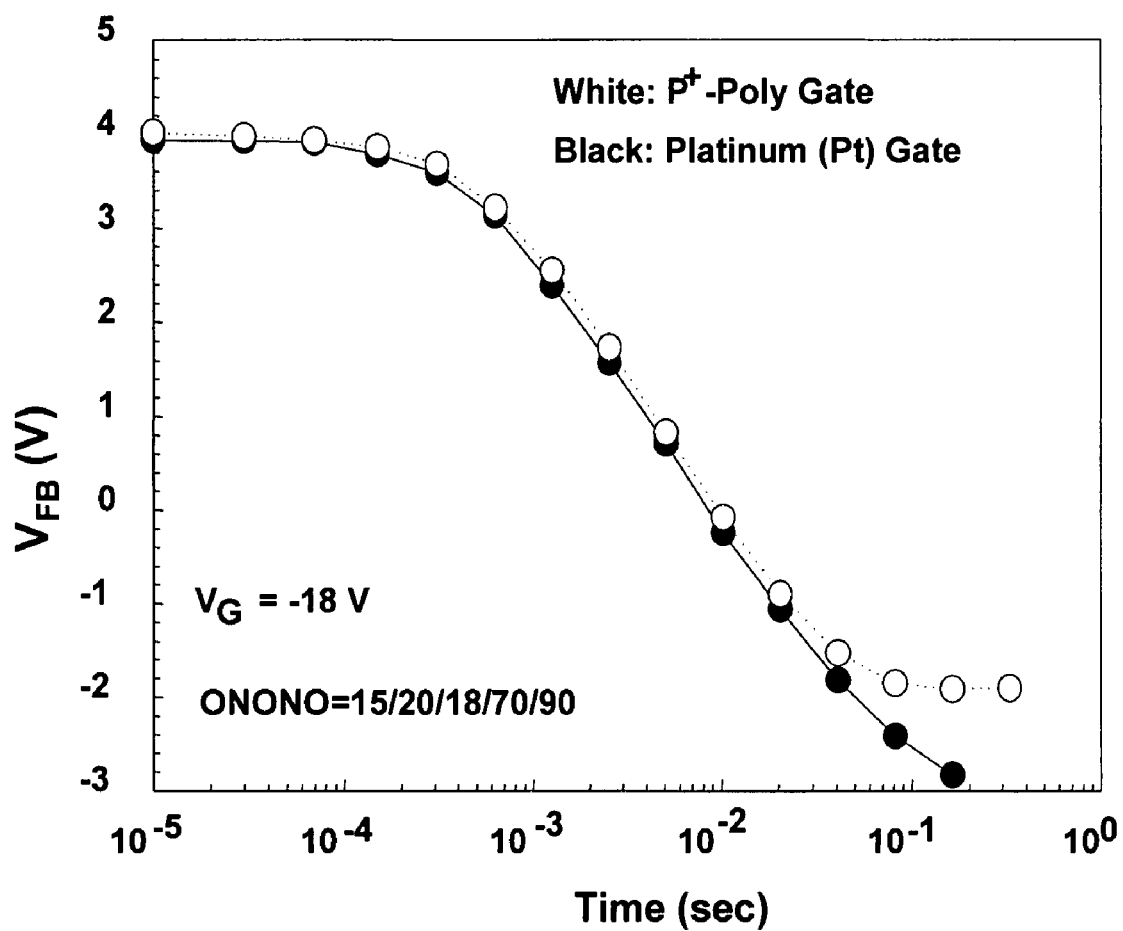
Figure 47:
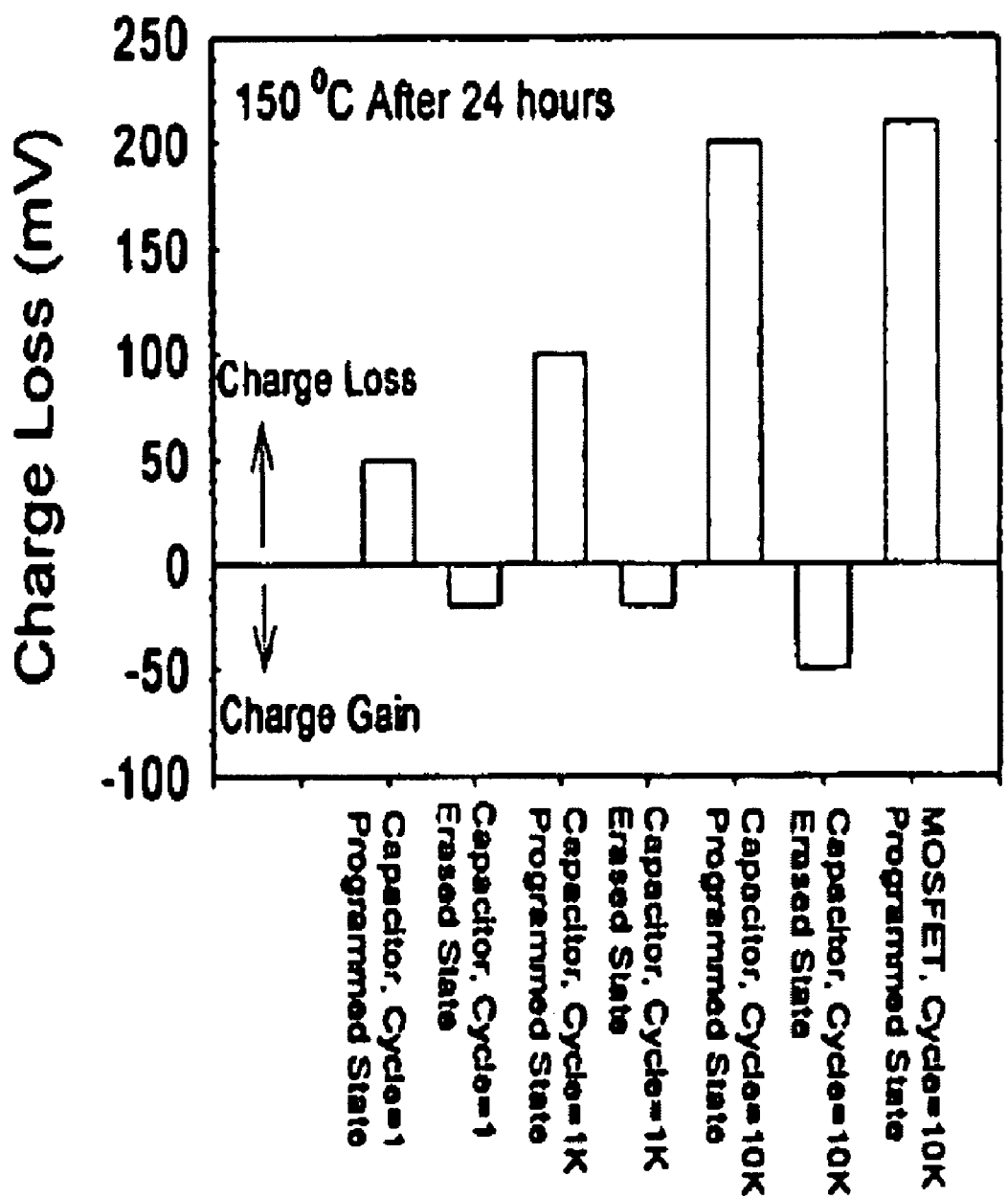

FIG. 43 is a graph of flat band voltage versus time for an erase bias of −18 volts, in a device having BE-SONOS structure with ONONO=15/20/18/70/90 Angstroms. FIG. 43 is a comparison of the erase characteristic of the exemplary device having a P+-poly gate and the exemplary device having a Platinum (Pt) gate. Pt has a higher work function than P+ polysilicon, that is sufficient to lead to a non-saturated erase as is shown in FIG. 43. The high work function gate material can be patterned, for example, by a lift-off process.

As illustrated, some examples noted above, including the structural design, array design, and operation of memory devices, may provide desirable array dimension, good reliability, good performance, or the combination of any of them. Some examples noted may be applicable for down-scaling the dimensions of non-volatile flash memories, such as NAND flash memories and flash memory for data applications. Some examples may provide SONONOS devices with uniform and self-converging channel hole-tunneling erase. Some examples also may provide good endurance of memory devices and reduce certain no hard-to-erase or over-erase issues. Also, good device characteristics, such as small degradations after P/E cycles and good charge retention, may be provided. Device uniformity within a memory array may be provided without having erratic bits or cells. Furthermore, some examples may provide good short-channel device characteristics via a split-gate NAND design, which may offer a better sense margin during the operations of the memory devices.

The foregoing disclosure of the preferred embodiments of the present invention has been presented for purposes of illustration and description. It is not intended to be exhaustive or to limit the invention to the precise forms disclosed. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A bandgap engineered, dielectric charge trapping non-volatile memory device, comprising:
    a semiconductor substrate including a channel region;
    a gate; and
    a data storage structure between the channel region and the gate, the data storage structure comprising a charge trapping layer which traps charge to establish a threshold voltage, and a multilayer tunneling dielectric structure between the channel region and the charge trapping layer, and an insulating layer between the charge trapping layer and the gate, the multilayer tunneling dielectric structure and the insulating layer being configured to enable hole tunneling from the channel region into the charge trapping layer and suppressing electron injection from the gate into the charge trapping layer in presence of an electric field across the data storage structure in an operating mode to lower the threshold voltage, and to enable electron tunneling from the channel region and blocking hole tunneling from the gate into the charge trapping layer in presence of an electric field across the data storage structure in an operating mode to raise the threshold voltage.

2. A bandgap engineered, dielectric charge trapping non-volatile memory device, comprising:
    a semiconductor substrate including a channel region;
    a tunnel dielectric structure on the channel region, the tunnel dielectric structure comprising (a) a bottom dielectric layer contacting the channel region having a thickness less than 2 nm and having a hole tunneling barrier height, (b) a middle dielectric layer contacting the bottom dielectric layer, the middle dielectric layer having a hole tunneling barrier height less than that of the bottom dielectric, the middle dielectric layer having a thickness of 2.5 nm or less, the thickness of the middle dielectric layer is greater than the thickness of the bottom dielectric layer, and (c) a top dielectric layer contacting the middle dielectric layer having a hole tunneling barrier height greater than that of the middle dielectric layer and having a thickness greater than the thickness of the middle dielectric layer;

a dielectric charge trapping layer contacting the top dielectric layer of the tunnel dielectric structure having a hole tunneling height less than that of the top dielectric layer, and having a thickness greater than about 5 nm;

a blocking dielectric layer on the charge trapping layer having a hole tunneling height greater than that of the dielectric charge trapping layer, and having a thickness greater than about 5 nm;

a gate on the blocking dielectric layer; and a circuit operable in an mode to decrease a threshold voltage that applies a negative voltage with a magnitude of about 20 volts or less, across the gate and channel region which induces FN hole tunneling sufficient to decrease a threshold voltage by at least 2 Volts in less than 100 msec.

3. The memory device of claim 2, wherein the thickness of the bottom dielectric layer is less than or equal to about 18 Angstroms.

4. The memory device of claim 2, wherein the thickness of the bottom dielectric layer is less than or equal to about 15 Angstroms.

5. The memory device of claim 2, wherein the dielectric charge trapping layer thickness is between about 50 Angstroms and about 100 Angstroms.

6. The memory device of claim 2, wherein the blocking dielectric layer has a thickness between about 50 Angstroms and about 120 Angstroms.

7. The memory device of claim 2, wherein the bottom dielectric layer comprises silicon oxide, the middle dielectric layer comprises silicon nitride, and the top dielectric layer comprises silicon oxide.

8. The memory device of claim 2, wherein the charge trapping layer comprises silicon nitride and the blocking dielectric layer comprises silicon oxide.

* * * * *